US012756322B2

(12) United States Patent
Mallik et al.

(10) Patent No.: US 12,756,322 B2
(45) Date of Patent: Oct. 6, 2026

(54) FABRICATION TRADE-OFF BASED OPTIMAL SYNTHESIS OF WINDING CONFIGURATIONS FOR PLANAR TRANSFORMER IN CAPACITOR-INDUCTOR-INDUCTOR-CAPACITOR (CLLC) DIRECT CURRENT (DC)-DC CONVERTER

(71) Applicant: ARIZONA BOARD OF REGENTS ON BEHALF OF ARIZONA STATE UNIVERSITY, Scottsdale, AZ (US)

(72) Inventors: Ayan Mallik, Chandler, AZ (US); Ashwin Chandwani, Tempe, AZ (US)

(73) Assignee: ARIZONA BOARD OF REGENTS ON BEHALF OF ARIZONA STATE UNIVERSITY, Scottsdale, AZ (US)

( * ) Notice: Subject to any disclaimer, the term of this patent is extended or adjusted under 35 U.S.C. 154(b) by 771 days.

(21) Appl. No.: 18/323,980

(22) Filed: May 25, 2023

(65) Prior Publication Data

US 2023/0387816 A1 Nov. 30, 2023

Related U.S. Application Data

(60) Provisional application No. 63/345,641, filed on May 25, 2022.

(51) Int. Cl.
*H02M 3/335* (2006.01)
*G06F 30/17* (2020.01)
(Continued)

(52) U.S. Cl.
CPC ........ *H02M 3/33584* (2013.01); *G06F 30/17* (2020.01); *G06F 30/20* (2020.01);
(Continued)

(58) Field of Classification Search
None
See application file for complete search history.

(56) References Cited

U.S. PATENT DOCUMENTS 12,021,456 B2 * 6/2024 Zhuang ............. H02M 3/33573

OTHER PUBLICATIONS

Roboam et al. "Hybrid power generation system for aircraft electrical emergency network," IET Electrical Systems in Transportation, vol. 1, 2011, 9 pages.

(Continued)

*Primary Examiner* — Leigh M Garbowski
(74) *Attorney, Agent, or Firm* — MH2 Technology Law Group LLP

(57) ABSTRACT

Adhering to the objective of modelling and selecting the most optimal winding configuration for a high frequency planar transformer (HFPT) for auxiliary charging systems for more electric aircrafts (MEA) this disclosure elucidates numerous fabrication and design-based constraints and correlations to enable parametric modelling of various magnetic components. This disclosure characterizes possible winding configurations for HFPT employed in a bidirectional CUE DC/DC converter. A detailed analytical study is presented for each component and verified using several instances of 3D Finite Element Analysis (FEA) based model to synthesize the effective field and current density distribution in the windings. Several design-based trade-offs are graphically explained with various criteria pertaining to optimal winding selection to study the interdependence of the resultant parameters on hardware specifications, such as the PCB thickness and its fabrication layout, air gaps and conductor thickness.

8 Claims, 39 Drawing Sheets

(51) Int. Cl.
*G06F 30/20* (2020.01)
*G06F 30/23* (2020.01)
*H01F 27/28* (2006.01)
*H02M 3/00* (2006.01)
(52) U.S. Cl.
CPC .............. *G06F 30/23* (2020.01); *H02M 3/01* (2021.05); *H01F 2027/2819* (2013.01)

(56) References Cited

OTHER PUBLICATIONS

Wu et al. "Fuel Cell Applications on More Electrical Aircraft," 2014 17th International Conference on Electrical Machines and Systems (ICEMS), Hangzhou, China, Oct. 22-25, 2014, 4 pages [retrieved on May 24, 2023]. Retrieved from IEEE Explore.
Guiliani et al. "GaN-based Triple Active Bridge for Avionic Application," IEEE, 2017, 5 pages [retrieved on May 24, 2023]. Retrieved from IEEE Explore.
Zhao et al. "Design and Analysis of a High-frequency CLLC Resonant Converter with Medium Voltage insulation for Solid-State-Transformer," 2021 IEEE Applied Power Electronics Conference and Exposition (APEC), 2021, 5 pages [retrieved on May 24, 2023]. Retrieved from IEEE Explore.
Sankar et al. "Extended Harmonics Based Phase Tracking for Synchronous Rectification in CLLC Converters," IEEE Transactions on Industrial Electronics, vol. 66, No. 8, Aug. 2019, 12 pages.
Min et al. "Bidirectional Resonant CLLC Charger for Wide Battery Voltage Range: Asymmetric Parameters Methodology," IEEE Transactions on Power Electronics, vol. 36, No. 6, Jun. 2021, 12 pages [retrieved or May 24, 2023]. Retrieved from IEEE Explore.
Stegen et al. "Structure Comparison of High-Frequency Planar Power Integrated Magnetic Circuits," School of Electrical Engineering, Griffith University, Brisbane, Queensland, Qld. 4111, Australia, IEEE Transactions on Magnetics, vol. 47, No. 10, Oct. 2011, 4 pages [retrieved on May 24, 2023]. Retrieved from IEEE Explore.
Chen et al. "Model and Design of PCB Parallel Winding for Planar Transformer," IEEE Transactions on Magnetics, vol. 39, No. 5, Sep. 2003, 3 pages [retrieved on May 24, 2023]. Retrieved from IEEE Explore.
Saket et al. "LLC Converters With Planar Transformers: Issues and Mitigation," IEEE Transactions on Power Electronics, vol. 32, No. 6, Jun. 2017, 19 pages [retrieved on May 24, 2023]. Retrieved from IEEE Explore.
Djuric et al. "Design, Modeling, and Analysis of a Compact Planar Transformer," University of Novi Sad, Faculty of Technical Sciences, 21000 Novi Sad, Serbia, LGEP/SPEE Labs-SUPELEC, 91192 Gif sur Yvette Cedex, France, IEEE Transactions on Magnetics, vol. 48, No. 11, Nov. 2012, 4 pages [retrieved on May 24, 2023]. Retrieved from IEEE Explore.
Saket et al. "Improving Planar Transformers for LLC Resonant Converters: Paired Layers Interleaving," IEEE Transactions on Power Electronics, vol. 34, No. 12, Dec. 2019, 20 pages [retrieved on May 24, 2023]. Retrieved from IEEE Explore.
Ouyang et al. "Optimal Design and Tradeoff Analysis of Planar Transformer in High-Power DC-DC Converters," IEEE Transactions on Industrial Electronics, vol. 59, No. 7, Jul. 2012, 11 pages [retrieved on May 24, 2023]. Retrieved from IEEE Explore.
IPC-2221 Task Group (D-31b) of the Rigid Printed Board Committee (D-30) of IPC, "IPC-2221A, Generic Standard on Printed Board Design," IPC Association Connecting Electronics Industries, May 2003, 8 pages.
"Rigid PCB Capacity," Gold Phoenix Printed Circuit Board Co., Ltd. Retrieved from the Internet: unspecified domain.
He et al. "Design of a 1-MHz High-Efficiency High-Power-Density Bidirectional GaN-Based CLLC Converter for Electric Vehicles," IEEE Transactions on Vehicular Technology, vol. 68, No. 1, Jan. 2019, 11 pages [retrieved on May 24, 2023]. Retrieved from IEEE Explore.
Wojda et al. "Winding Resistance and Power Loss of Inductors With Litz and Solid-Round Wires," IEEE Transactions on Industry Applications, vol. 54, No. 4, Jul./Aug. 2018, 10 pages [retrieved on May 24, 2023]. Retrieved from IEEE Explore.
Luo et al. "Optimal Design of a High Efficiency LLC Resonant Converter with a Narrow Frequency Range for Voltage Regulation," Energies, vol. 11, 2018, 17 pages.
"Ferrite Shapes," Magnetics, 2018, 1 page [retrieved on May 24, 2023]. Retrieved from the Internet: <https://www.mag-inc.com/Products/Ferrite-Cores/Ferrite-Shapes#:~:text=Magnetics%C2%AE%20offers%20ferrite%20cores,is%20available%20for%20most%20sizes.>.
"R Material," Magnetics, 2018, 1 page [retrieved on May 24, 2023]. Retrieved from the Internet: <https://www.mag-inc.com/Products/Ferrite-Cores/R-Material>.
Guan et al. "A High-Frequency CLCL Converter Based on Leakage Inductance and Variable Width Winding Planar Magnetics," IEEE Transactions on Industrial Electronics, vol. 65, No. 1, Jan. 2018, 11 pages [retrieved on May 24, 2023]. Retrieved from IEEE Explore.
Li et al. "Analysis and Design of High-Frequency Isolated Dual-Bridge Series Resonant DC/DC Converter," IEEE Transactions on Power Electronics, vol. 25, No. 4, Apr. 2010, 13 pages [retrieved on May 24, 2023]. Retrieved from IEEE Explore.
Wu et al. "1-MHz LLC Resonant DC Transformer (DCX) With Regulating Capability," IEEE Transactions on Industrial Electronics, vol. 63, No. 5, May 2016, 9 pages [retrieved on May 24, 2023]. Retrieved from IEEE Explore.
Fei et al. "High-Efficiency High-Power-Density LLC Converter With an Integrated Planar Matrix Transformer for High- Output Current Applications," IEEE Transactions on Industrial Electronics, vol. 64, No. 11, Nov. 2017, 11 pages [retrieved on May 24, 2023]. Retrieved from IEEE Explore.
Fei et al. "High-Frequency Three-Phase Interleaved LLC Resonant Converter With GaN Devices and Integrated Planar Magnetics," IEEE Journal of Emerging and Selected Topics in Power Electronics, vol. 7, No. 2, Jun. 2019, 11 pages [retrieved on May 24, 2023]. Retrieved from IEEE Explore.
Wang et al. "Analysis and Design of a 1-MHz Bidirectional Multi-CLLC Resonant DC-DC Converter With GaN Devices," IEEE Transactions on Industrial Electronics, vol. 67, No. 2, Feb. 2020, 10 pages [retrieved on May 24, 2023]. Retrieved from IEEE Explore.
Park et al. "Analysis and Design of an Integrated Magnetics Planar Transformer for High Power Density LLC Resonant Converter," IEEEAccess, vol. 9, 2021, 13 pages.
Guan et al. "A 1 MHz Half-Bridge Resonant DC/DC Converter Based on GaN FETs and Planar Magnetics," IEEE Transactions on Power Electronics, vol. 32, No. 4, Apr. 2017, 16 pages [retrieved on May 24, 2023]. Retrieved from IEEE Explore.
Li et al. "High-Frequency PCB Winding Transformer With Integrated Inductors for a Bi-Directional Resonant Converter," IEEE Transactions on Power Electronics, vol. 34, No. 7, Jul. 2019, 13 pages [retrieved on May 24, 2023]. Retrieved from IEEE Explore.
Chandwani et al., Parametric Modeling and Characterization of Leakage-Integrated Planar Transformer for CLLC DC-DC Converter, IEEE Transactions on Magnetics, vol. 58, No. 6, Jun. 2022, 8 pages.
Chandwani et al., Fabrication Tradeoff Based Optimal Synthesis of Winding Configurations for Planar Transformer in CLLC DC-DC Converter, IEEE Transactions on Power Electronics, vol. 38, No. 5, May 2023, pp. 6243-6258.

* cited by examiner

Arrangement of transformer windings in EE ferrite core assembly

Equivalent Circuit for ZVS Investigation

Equivalent circuit with reconfigured stray capacitors

FABRICATION TRADE-OFF BASED OPTIMAL SYNTHESIS OF WINDING CONFIGURATIONS FOR PLANAR TRANSFORMER IN CAPACITOR-INDUCTOR-INDUCTOR-CAPACITOR (CLLC) DIRECT CURRENT (DC)-DC CONVERTER

CROSS REFERENCE TO RELATED APPLICATIONS

This application claims the benefit of priority to U.S. Provisional Patent Application No. 63/345,641 filed on May 25, 2022, the entirety of which is hereby incorporated by reference.

FIELD

Implementations of the disclosure relate generally to an all-inclusive model-based turnoff current minimization of asymmetric capacitor-inductor-inductor-capacitor (CLLC) converter for an electric vehicle charging application.

BACKGROUND

High frequency isolated resonant converters have found widespread application in the field of EV charging and aircraft power supplies, due to their higher power density and superior conversion efficiency [1]. Specific applications include auxiliary power units (APU) used in more electric aircrafts (MEA) that use fuel cell-based system at 400 DC [2] to serve battery loads at 24-28V DC voltage levels at low load conditions, that in turn support the main supply during heavy loading conditions, thus demanding bidirectional power flow [3]. In that context, bidirectional CLLC resonant converter topology has proved to provide various advantages, such as reduced losses due to soft switching in the primary bridge [4] and synchronous rectification (SR) in the secondary bridge [5], no-load voltage regulation and wider gain range over narrow frequency modulation zone [6]. Further, in such applications, high frequency planar transformers (HFPT) have found wide acceptance due to their advantages pertaining to lower profile, increased reliability, and modularity [6]. However, these advantages can only be redeemed by precise design and analysis of the equivalent parameters based on the physical design of the transformer winding arrangement [7], to obtain the desired gain characteristics, yet achieving the targeted efficiency and power density.

Several studies have been published in the literature that provide detailed analysis on modelling the HFPT focusing on the aspects of reduced winding losses with interleaved arrangement [8], issues pertaining to electromagnetic interference (EMI) occurring due to stray capacitances and ways to reduce them [9, 10]. The work presented in focusses on the concept of paired interleaved windings that explains its implications related to reduced stray capacitance, at an expense of higher winding resistance. A detailed design based tradeoff analysis is presented in [12] with elaborate justification and verification of the HFPT components. However, all the above-mentioned works portray a very generalized model to characterize the HFPT with assumptions pertaining to uniform winding arrangements and correspondingly are unable to correlate the obtained equivalent, parameters with the physical constraints of a PCB such as its thickness and corresponding insulation layer distribution, air gaps, and the conductor trace thickness.

Thus, a heretofore unaddressed need exists in the industry to address the aforementioned deficiencies and inadequacies.

SUMMARY

According to examples of the present disclosure, a bidirectional resonant asymmetric capacitor-inductor-inductor-capacitor (CLLC) converter for charging applications is disclosed. The CLLC converter comprises a primary full or half-bridge comprising a primary port; a secondary full or half-bridge comprising a second port; and a high frequency planar transformer (HFPT) that electrically couples the primary full or half-bridge and the secondary full or half-bridge, wherein asymmetry in values of inductance-capacitance (L-C) tank parameters produce voltage conversions from 400V-600V at the primary port to 24V-28V at the secondary port while maintaining efficient bidirectional power flow operation ranging from 96% to 98.5%.

According to examples of the present disclosure, the CLLC converter can include one or more of the following features. The HFPT is formed on a multi-layer printed circuit board comprising a primary winding having a {7P-4P-4P-7P} configuration and a secondary winding having a {1S*-1S*-1S*-1S*} configuration. The CLLC converter can further comprise a magnetic planar core which is selected based on a fabrication-based tradeoff optimization to minimize the total magnetic losses to less than 20 W for a 2 kW design and to achieve a form factor ranging from about 90 W/inch$^3$ to 110 W/inch$^3$, facilitating greater than 100 W/inch$^3$ power density integration of passive components. The HFPT provides controllable leakage inductances to eliminate a need of an external power transfer magnetic component and reduces AC resistance through interleaving of primary and secondary windings in successive layers. A tuns ratio between a primary winding configuration and a secondary winding configuration is selected to be 22:1 to facilitate and extend a range of soft-switching in both source and load-side full-bridges and also to limit frequency sweep between 200 kHz and 650 kHz to enable a wide-gain power conversion from about 400-600V to about 24-28V. Windings of the multi-layer printed circuit board of the HFPT comprises four layers with copper conductor thicknesses between 35 μm and 140 μm in different geometric orientations that are customizable to achieve a particular amount of leakage flux. The windings of the multi-layer printed circuit board-based windings comprise four layers with insulation layer thicknesses that are customizable to regulate stray capacitances to produce gain-frequency characteristics with error margin less than 6% and to minimize stray capacitances below 712 pF to enable greater than 500 kHz noise-immune power conversion. System apparatus for verifying optimal winding structure is developed using a set of 650V/30A-rated Gallium Nitride MOSFETs on the primary side and a set of four parallelly connected 60V/90A-rated Gallium Nitride devices for realizing each switching on the secondary side, and parasitic loop inductances are modeled as part of a resistance-inductance-capacitance (R-L-C) lumped equivalence of the HFPT.

According to examples of the present disclosure, a method to obtain a winding configuration of a high frequency planar transformer (HFPT) is disclosed. The method comprises performing an iterative design process that considers a gain versus operational frequency trend, an input impedance analysis, a soft-switching criteria for primary and secondary bridges, and voltage regulation constraints; and outputting the winding configuration based on the iterative design process.

According to examples of the present disclosure, the method can include one or more of the following features. The overall system losses including conduction, switching and core losses are minimized. The overall system volume including magnetic cores, PCB dimensions, adhering to volumetric constraints of the HFPT are minimized. The selection of the winding configuration is performed using three-dimensional finite element analysis (FEA) modeling, analytical modeling of resistance-inductance-capacitance (R-L-C) lumped equivalence of a transformer network followed by verification through hardware prototyping. The analytical modeling is applicable to isolated multiport pulse width modulated (PWM) or pulse frequency modulated (PFM) or phase-controlled power converters. The isolated direct current (dc)-dc provides for wireless charging, multidirectional source-storage power flow, electric aircrafts, electric vehicle onboard charging, or naval power supply applications. The phase and operational frequency are optimally selected based on the R-L-C lumped equivalence to enable sensorless operation of an actively controlled load-side full-bridge that provides an efficiency increment up to 5%.

According to examples of the present disclosure, a computer-implemented method for modeling a bidirectional resonant asymmetric capacitor-inductor-inductor-capacitor (CLLC) converter for a charging application is disclosed. The computer-implemented method comprises creating, by a hardware processor, a frequency dependent generalized harmonic approximation (GHA) model of a CLLC converter; and optimizing the frequency dependent GHA model to produce an accurately formulated gain modeling and loss estimation of a modeled power converter.

According to examples of the present disclosure, the computer-implemented method for modeling a bidirectional resonant asymmetric capacitor-inductor-inductor-capacitor (CLLC) converter for a charging application can include one or more of the following features. The frequency dependent GHA model is based on modeling of a CLLC converter with asymmetric L-C tanks that account for stray parameters including inter-winding and intra-winding capacitances and their effects on gain versus frequency characteristics. The frequency dependent GHA model is applied to secondary side turnoff current minimization. The modeling methodologies account for quantitative effects of varying fabrication parameters comprising winding arrangement, core layer thickness, pre-preignition layer thickness, airgap, conductor overlapping area, voltage gradient between conductors in successive layers on inter- and intra-winding capacitances appearing in primary and secondary windings, or combinations thereof. The modeling methodologies account for quantitative effects of varying fabrication parameters comprising winding arrangement, core layer thickness, pre-preignition layer thickness, airgap, core dimensions, magnetic flux linkage between conductors on primary and secondary winding leakage inductances, or combinations thereof.

According to examples of the present disclosure, a bidirectional resonant asymmetric capacitor-inductor-inductor-capacitor (CLLC) converter for charging applications is disclosed. The asymmetric CLLC converter comprises a primary bridge; a secondary bridge; a high frequency planar transformer (HFPT) that electrically couples the primary bridge and the second bridge, the HFPT comprising a primary core having a {7P-4P-4P-7P} primary winding configuration and a secondary core having a {1S*-1S*-1S*-1S*} secondary winding configuration.

According to examples of the present disclosure the bidirectional resonant asymmetric CLLC converter can include one or more of the following features. The HFPT is formed on a multi-layer printed circuit board. The bidirectional resonant asymmetric CLLC converter further comprises a magnetic planar core. A tuns ratio between the primary winding configuration and the secondary winding configuration is 22:1. The multi-layer printed circuit board comprises four layers with a copper conductor thickness of about 70 μm. The primary bridge comprises an enhancement mode GaN-on-silicon power transistor. The enhancement mode GaN-on-silicon power transistor operates with a voltage of about 650 V, a current of about 30 A, and a resistance of about 50 mΩ. The secondary bridge comprises four enhancement mode power transistor switches connected in parallel. Each of the four enhancement mode power transistor switches operates with a voltage of about 60 V, a current of about 90 A, and a resistance of about 2.2 mΩ. The bidirectional resonant asymmetric CLLC converter operates with a power density of about 106 W/inch$^3$. The charging applications comprise wireless charging. The charging applications comprise EV onboard and wireless charging, more-electric-aircrafts (MEA), and naval power supply applications.

According to examples of the present disclosure, a computer-implemented method for modeling a bidirectional resonant asymmetric capacitor-inductor-inductor-capacitor (CLLC) converter for a charging application is disclosed. The computer-implemented method comprises creating, by a hardware processor, a frequency dependent general harmonic approximation (GHA) model of a CLLC converter; optimizing the frequency dependent GHA model to produce an optimized frequency dependent GHA model; and generating a CLLC converter based on the optimized frequency dependent GHA model.

According to examples of the present disclosure, the computer-implemented method for modeling a bidirectional resonant asymmetric capacitor-inductor-inductor-capacitor (CLLC) converter for a charging application can include one or more of the following features. The frequency dependent GHA model is based on secondary side turnoff current minimization technique. The frequency dependent GHA model is based on modeling of CLLC converter with asymmetric tank that accounts for stray parameters and their effect on a resultant gain trend.

According to examples of the present disclosure, a bidirectional resonant asymmetric capacitor-inductor-inductor-capacitor (CLLC) converter for charging applications is disclosed. The asymmetric CLLC converter comprises a primary bridge; a secondary bridge; a high frequency planar transformer (HFPT) that electrically couples the primary bridge and the secondary bridge, the HFPT comprising an optimal set of primary and secondary winding configuration.

The bidirectional resonant asymmetric CLLC converter can include one or more of the following features. The HFPT is formed on a multi-layer printed circuit board. The bidirectional resonant asymmetric CLLC converter further comprises a magnetic planar core with a specific turns ratio as per the design requirements. The primary and secondary side actively controlled networks can be realized by full-bridges or capacitor-connected half-bridges.

According to examples of the present disclosure, a computer-implemented method for modeling a bidirectional resonant asymmetric capacitor-inductor-inductor-capacitor (CLLC) converter for a charging application is disclosed.

The computer-implemented method comprising: creating, by a hardware processor, a frequency dependent general harmonic approximation (GHA) model of a CLLC converter; optimizing the frequency dependent GHA model to produce an optimized frequency dependent GHA model; and generating a CLLC converter based on the optimized frequency dependent GHA model. The frequency dependent GHA model is based on secondary side turnoff current minimization technique. The frequency dependent GHA model is based on modeling of CLLC converter with asymmetric tank that accounts for stray parameters and their effect on a resultant gain trend.

According to examples of the present disclosure, a system, a computer-implemented method, and a bidirectional resonant asymmetric CLLC converter is disclosed herein.

BRIEF DESCRIPTION OF THE DRAWINGS

The accompanying drawings, which are incorporated in and constitute a part of this specification, illustrate embodiments of the present teachings and together with the description, serve to explain the principles of the disclosure.

FIG. 5A shows Primary: 8P-3P-3P-8P (series) Secondary: 1S*-1S*-1S*-1S*(parallel), FIG. 5B shows Primary: 7P-4P-4P-7P (series); Secondary: 1S*-1S*-1S*-1S* (parallel), FIG. 5C shows Primary: 6P-5P-5P-6P (series); Secondary: 1S*-1S*-1S*-1S* (parallel) configurations with 4-layer PCB, and FIG. 5D shows interleaved winding configuration: 7P-1S*-1S*-4P-4P-1S*-1S*-7P with 8-layer PCB according to examples of the present disclosure.

FIG. 8B shows a plot corelating leakage inductances for different $h_1$ for interleaved ({7P-1S*-1S*-4P-4P-1S*-1S*-7P} configuration according to examples of the present teachings.

FIG. 10A-1, FIG. 10A-2, FIG. 10A-3, FIG. 10B-1 FIG. 10B-2, and FIG. 10B-3 show MMF distributions obtained from 3D FEA sim for (FIG. 10A-1, FIG. 10A-2, FIG. 10A-3) {[8P-3P-3P-8P], [1S*-1S*-1S*-1S*]} winding configuration and (FIG. 10B-1 FIG. 10B-2, FIG. 10B-3) interleaved ({7P-1S*-1S*-4P-4P-1S*-1S*-7P}) configuration according to examples of the present teachings.

$V_s$-10V/div; X-axis: time–1 μs/div] according to examples of the present teachings.

Figure 23A:
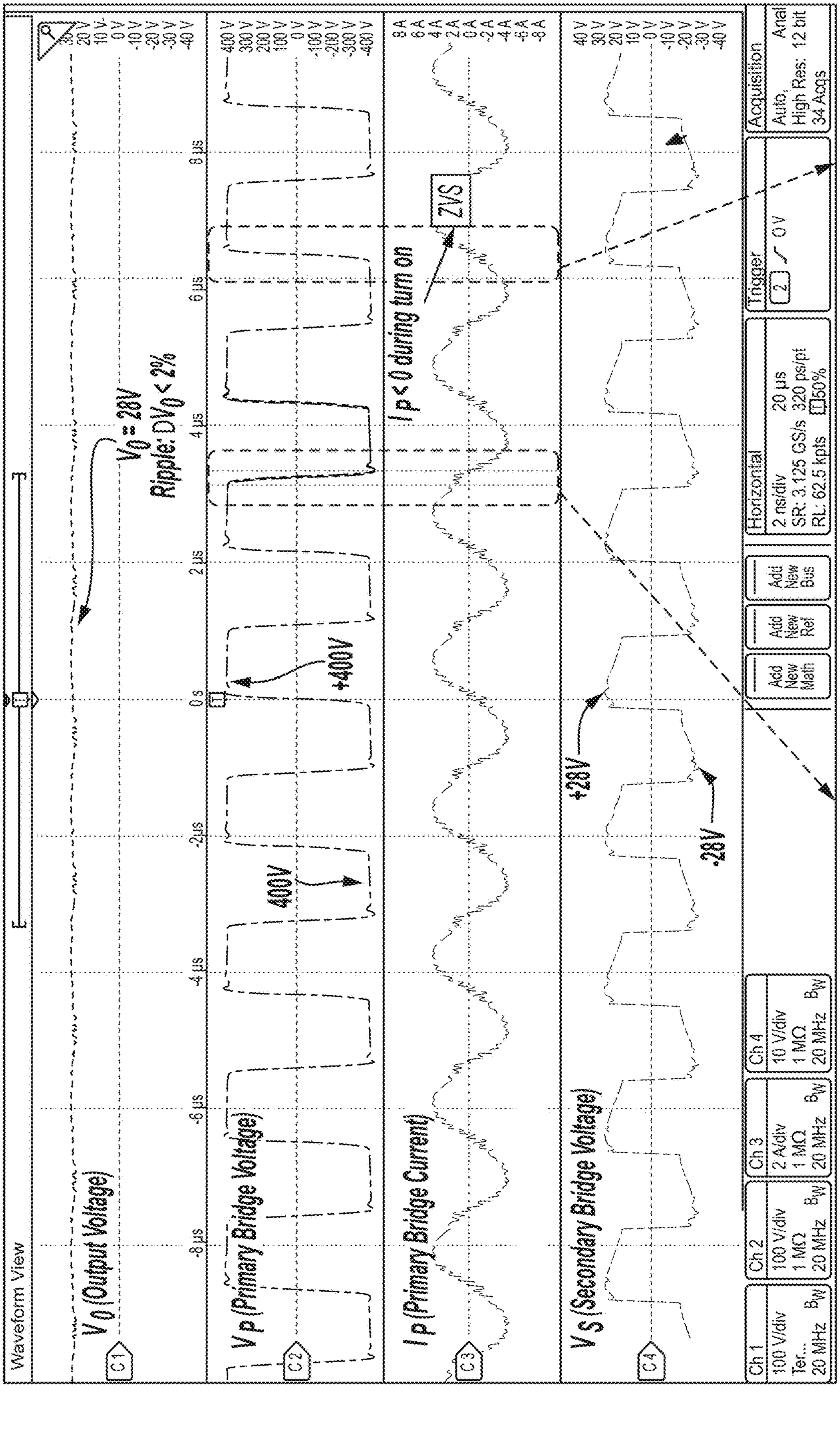
Figure 23B:
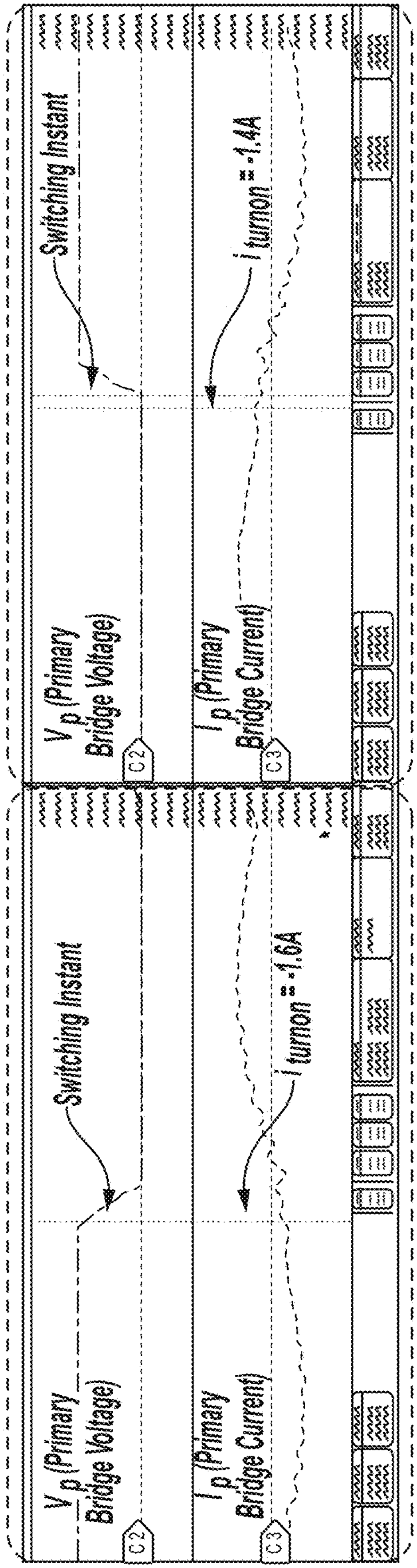

FIG. 23A and FIG. 23B show for $V_0$, $V_p$, $I_s$, and $V_s$ [Y-axis: $V_0$-10V/div $V_p$-100V/div, $I_p$-2A/div, $V_s$-10V/div; X-axis: time–2 μs/div] according to examples of the present teachings.

Figure 24:
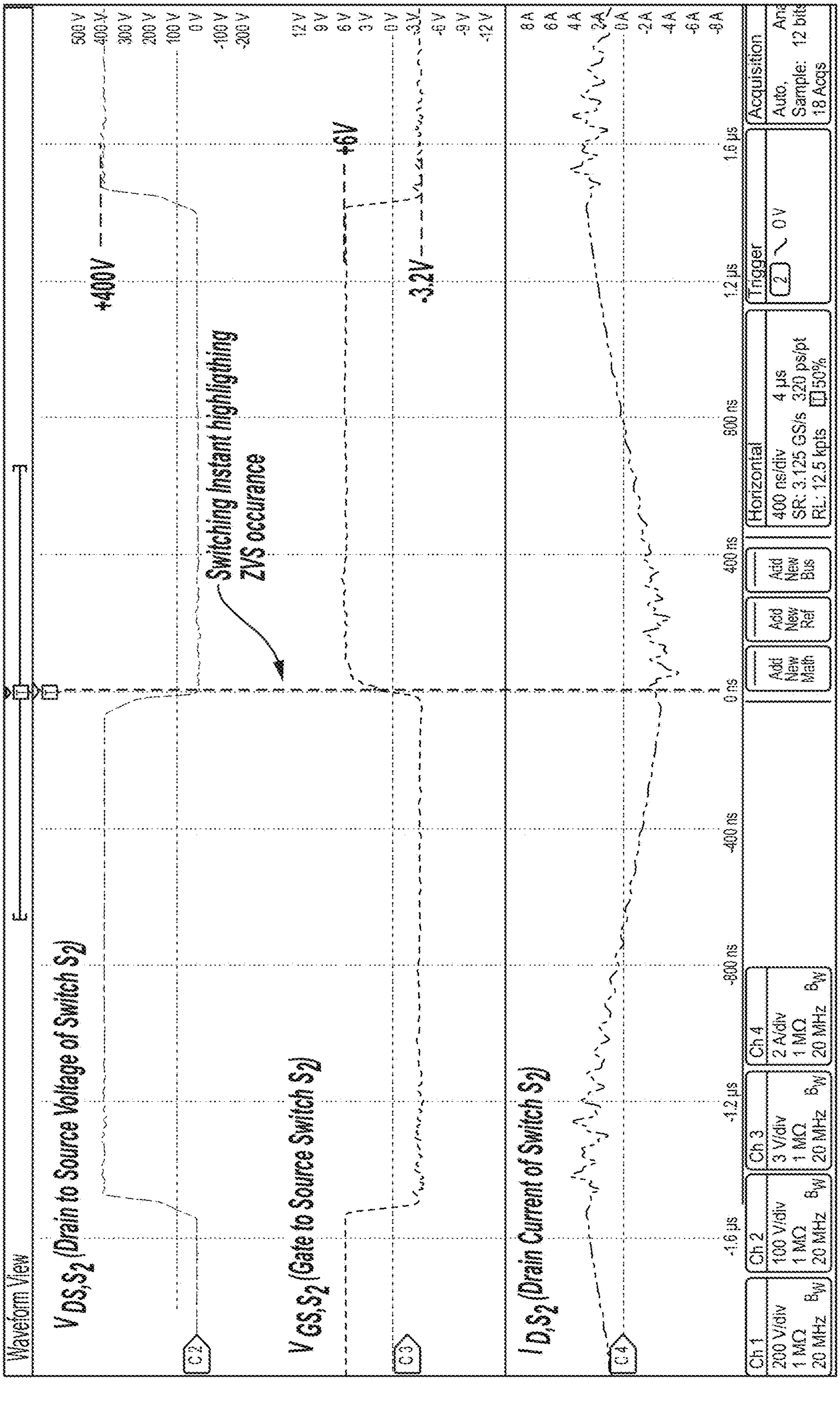

FIG. 24 shows waveforms elucidating the ZVS-based soft switching at switch $S_2$ according to examples of the present teachings.

Figure 25:
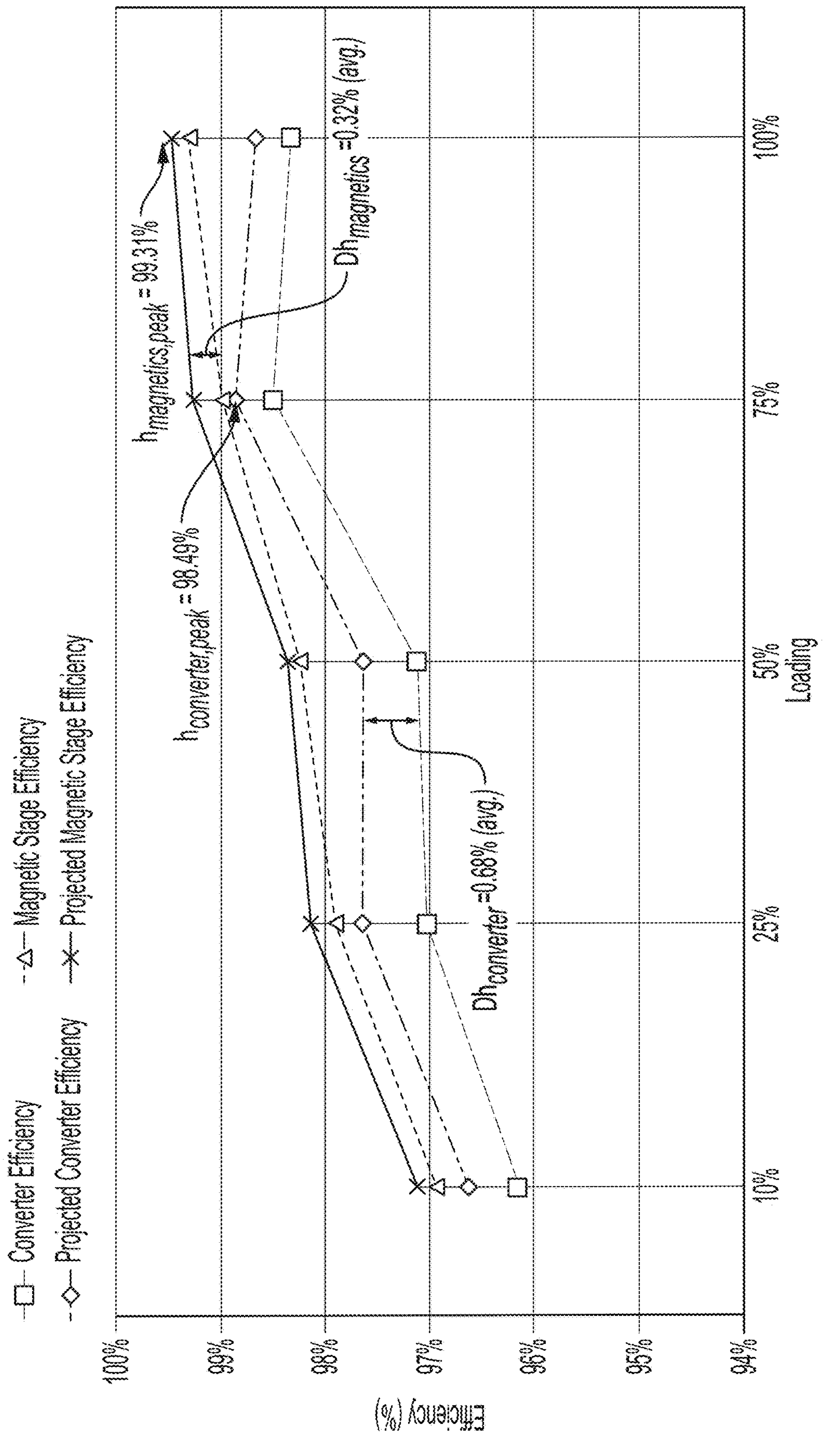

FIG. 25 shows converter and magnetic stage component efficiency at different loading conditions according to examples of the present teachings.

Figure 26:
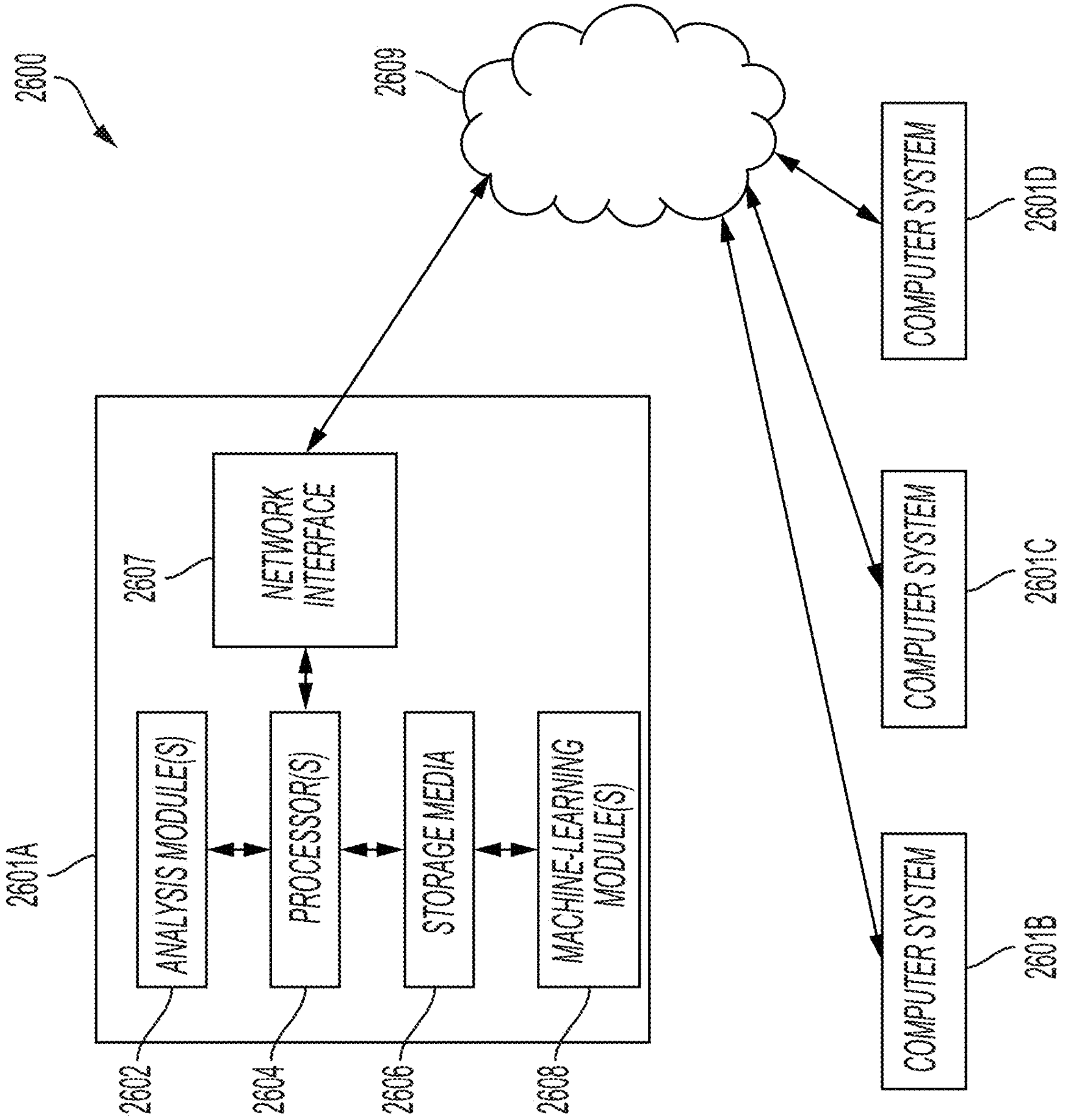

FIG. 26 illustrates an example of a computing system in accordance with some embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Considering the above limitations, the present disclosure provides for the following features: (a) practical and realistic characterization of the leakage inductance, winding resistance and stray capacitance of a HPFT accounting for various intricate fabrication-based considerations and their effect on the system performance, (b) graphically elucidated parametric trade-offs and guidelines related to conductor and insulator parameters employed for HPFT realization, (c) defining design and implementation based constraints pertaining to optimal winding structure selection criteria and (d) thorough comparison of the analytically derived model, with 3D FEA based simulations and experimental analysis.

This disclosure is arranged as follows: Section II introduces the lumped model for HPFT employed in a CLLC converter and explains the deviation in the resultant gain caused due to the stray elements. Further, a comprehensive analysis to provide parametric modelling of HPFT is presented in Section III with detailed characterization in context to the fabrication aspects of HPFT. Section IV elucidates the trade-offs between various winding configurations and provides analysis to optimally choose the winding configuration pertaining to design and operational constraints of the CLLC converter. Section V provides experimental justification with relevant results to benchmark the performance of the CLLC converter. Section VI points out the conclusive points with relevant discussions.

II. Comprehensive Lumped R-L-C Model of HFPT Structure

Figure 1:
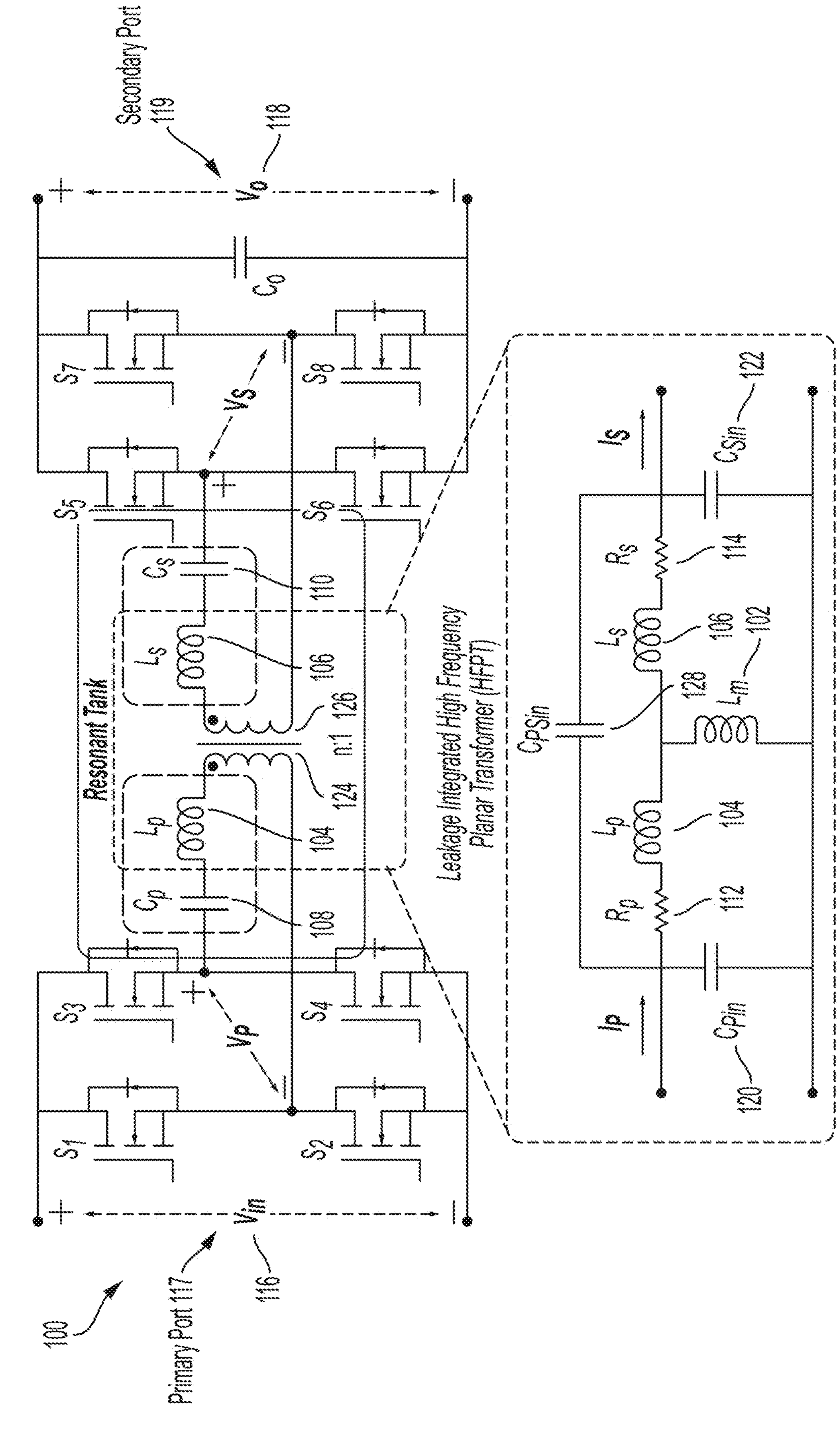
FIG. 1 shows a CLLC topology with zoomed in lumped magnetic model according to examples of the present teachings.

FIG. 1 shows a lumped model for a leakage integrated HFPT implemented in a bidirectional CLLC DC/DC converter topology 100 according to examples of the present teachings. As observed, $L_m$ 102 signifies the magnetizing inductance of the HFPT, while the leakage inductances obtained in the primary and secondary windings ($L_p$ 104 and $L_s$ 106, respectively) are coupled with resonant capacitors ($C_p$ 108 and $C_s$ 110) with a resonant frequency $f_r$. Additionally, as the topology is intended to run at high switching frequency ($f_s$), there exist significant components of winding resistances $R_p$ 112 and $R_s$ 114 corresponding to the primary side 116 comprising primary port 117 and the secondary side 118 comprising secondary port 119, respectively. Further, due to potential difference between the winding layers and various turns, stray inter- and intra-winding capacitances are formed, that appear as shunt elements. $C_{Pin}$ 120 and $C_{Sin}$ 122 represent the equivalent intra-winding capacitances appearing in the primary windings 124 and the secondary windings 126, respectively, while $C_{PSin}$ 128 corresponds to the equivalent inter-winding capacitance between the two sets of windings. Due to the stray components appearing in the equivalent HPFT model, the converter tends to shift from its normal operating gain curve obtained using the generalized harmonic approximation (GHA) based model [11]. Thus, to minimize the deviation from the predicted gain curve and effectively reduce the losses in the transformer, it is important to analyze and model each component and study its dependence on the fabrication aspects of the transformer.

III. Mathematical Modelling and Analysis of HFPT Parameters

Figure 2:
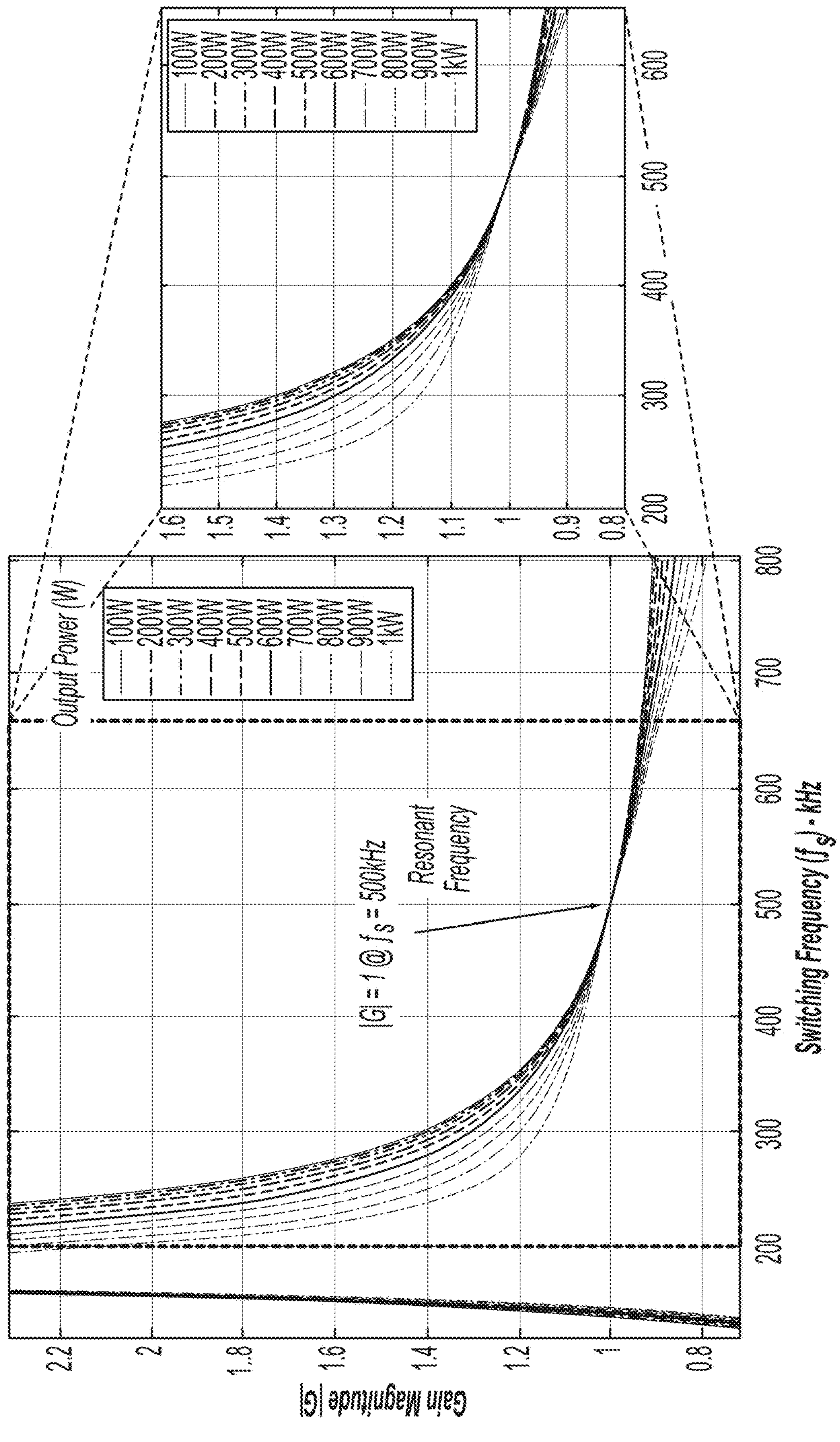
FIG. 2 shows a plot of voltage gain versus frequency trend of a CLLC converter according to examples of the present teachings.

As examples of the present teachings, this section presents the applicability of the proposed winding configuration to an isolated DC-DC power conversion of (400-600V) to (24-28V) with a turns ratio (n) of 22:1. FIG. 2 shows the voltage gain magnitude versus the switching frequency (fs) trend of the designed CLLC converter for the design specifications mentioned in Table VII. As examples of the present teachings, by referring to Table VII, a design gain range from G=0.88 (for 600-24V conversion) to G=1.54 (for 400-28V conversion) is selected corresponding to the corner operating conditions, with the selected turns ratio and resonant tank parameter selection, the gain modulation is seamlessly achieved by varying the operational frequency between 200-650 kHz.

TABLE VII

DESIGN SPECIFICATIONS FOR BIDIRECTIONAL CLLC
DESIGN SPECIFICATIONS
FOR BIDIRECTIONAL CLLC

| Parameters | Values |
|---|---|
| Primary input voltage range ($V_{in}$) | 400-600 V |
| Secondary output voltage range ($V_o$) | 24-28 V |
| Rated Power ($P_o$) | 1 kW |
| Transformer Turns Ratio (n) | 22:1 |
| Tank Leakage Inductances ($L_P$, $L_S$) | 11.8 μH, 0.022 μH |
| Magnetizing Inductance ($L_m$) | 72 μH |
| Tank Capacitors ($C_P$, $C_S$) | 8.58 nF, 5.06 μF |
| Resonant frequency ($f_r$) | 500 kHz |

Corresponding to the selected n, the number of turns selected in each multi-layer PCB are selected as per IPC 2221 standard that provides the minimum copper conductor width required to ensure the desired current flow for a defined copper conductor thickness adhering to a maximum temperature rise limit in the winding. The empirical formula to corelate the conductor width required with respect to temperature rise is shown as follows:

$$A_c = \frac{I_c}{(k * \Delta T^b)^{\frac{1}{c}}} \tag{1}$$

Using the area of the conductor calculated by (1), the width of the conductor is obtained as follows:

$$W_c = \frac{A_c}{h_t * 1.378} \tag{2}$$

where, $A_c$ is the area of the conductor in $mils^2$, $w_c$ is the conductor width in mils, $I_c$ is the current in the conductor in amperes, ΔT is the temperature rise in ° C., $h_t$ is the thickness of the conductor used in ounces (oz.) of copper. The empirical constants k, b and c are obtained from curve fitting to the IPC 2221 current carrying standard curves and the numerical values are shown as follows: For external layers: k=0.048, b=0.44, c=0.725, while for the internal layers: k=0.024, b=0.44, c=0.725. Further, the spacing between the windings are decided by the voltage gradient between the two windings to ensure desired creepage to prevent any potential turn-to-turn short circuit.

To elucidate further, an analytical formulation for primary winding configuration is shown that depicts the maximum and minimum number of windings in the external and internal layers adhering to the specifications shown below:

Magnetic core—FR45810EC planar ferrite core.

Window width ($b_t$)—21.4 mm→20 mm (clearance from the core edges 0.7 mm each side) $I_p$ (max)=10A Selected conductor thickness ($h_t$)—2 oz. copper.

Temperature rise (ΔT) limited to 40° C.

With $h_t$ defined as 2 oz., the minimum conductor width ($w_{c_e}$) for external layers is 1.76 mm (selected to be 2 mm for safety margin) and that for internal layers ($w_{c_i}$) is 3.49 mm (selected to be 3.75 mm for safety margin). Additionally, corresponding to per-turn voltage gradient $$\left(\frac{V_p}{N} = \frac{600}{22} = 27\ \mathrm{V}\right),$$

the safe creepage between the windings is selected to be 0.5 mm for external layers ($c_e$) and 0.25 mm for internal layers ($c_i$).

Using the specifications for the winding thicknesses, the maximum number of turns in external layers ($N_{e,max}$) can be derived as follows:

$$b_t = N_{e,max} \times w_{c_e} + (N_{e,max} - 1) \times c_e \quad (3)$$

$$20\ \mathrm{mm} = N_{e,max} \times 2\ \mathrm{mm} + (N_{e,max} - 1) \times 0.5\ \mathrm{mm} \quad (4)$$

$$N_{e,max} = 8.2 \sim 8 \quad (5)$$

As seen in (5), the maximum number of turns in external layer ($N_{e,max}$) is limited to 8.

Similarly, for internal layers, the maximum number of turns in internal layers ($N_{i,max}$) can be derived as follows:

$$b_t = N_{i,max} \times w_{c_i} + (N_{e,max} - 1) \times c_i \quad (6)$$

$$20\ \mathrm{mm} = N_{i,max} \times 3.75\ \mathrm{mm} + (N_{i,max} - 1) \times 0.25\ \mathrm{mm} \quad (7)$$

$$N_{i,max} = 5.06 \sim 5 \quad (8)$$

As seen in (8), the maximum number of turns in internal layer ($N_{i,max}$) is limited to Using the above-mentioned information, three non-interleaved winding configurations are studied in this paper (explained in Table I). In addition to that, to explain the R-L-C modeling of an interleaved structure, one example of 8-layers {7P-1S*-1S*-4P-4P-1S*-1S*-7P} configuration is also explained.

Figure 3:
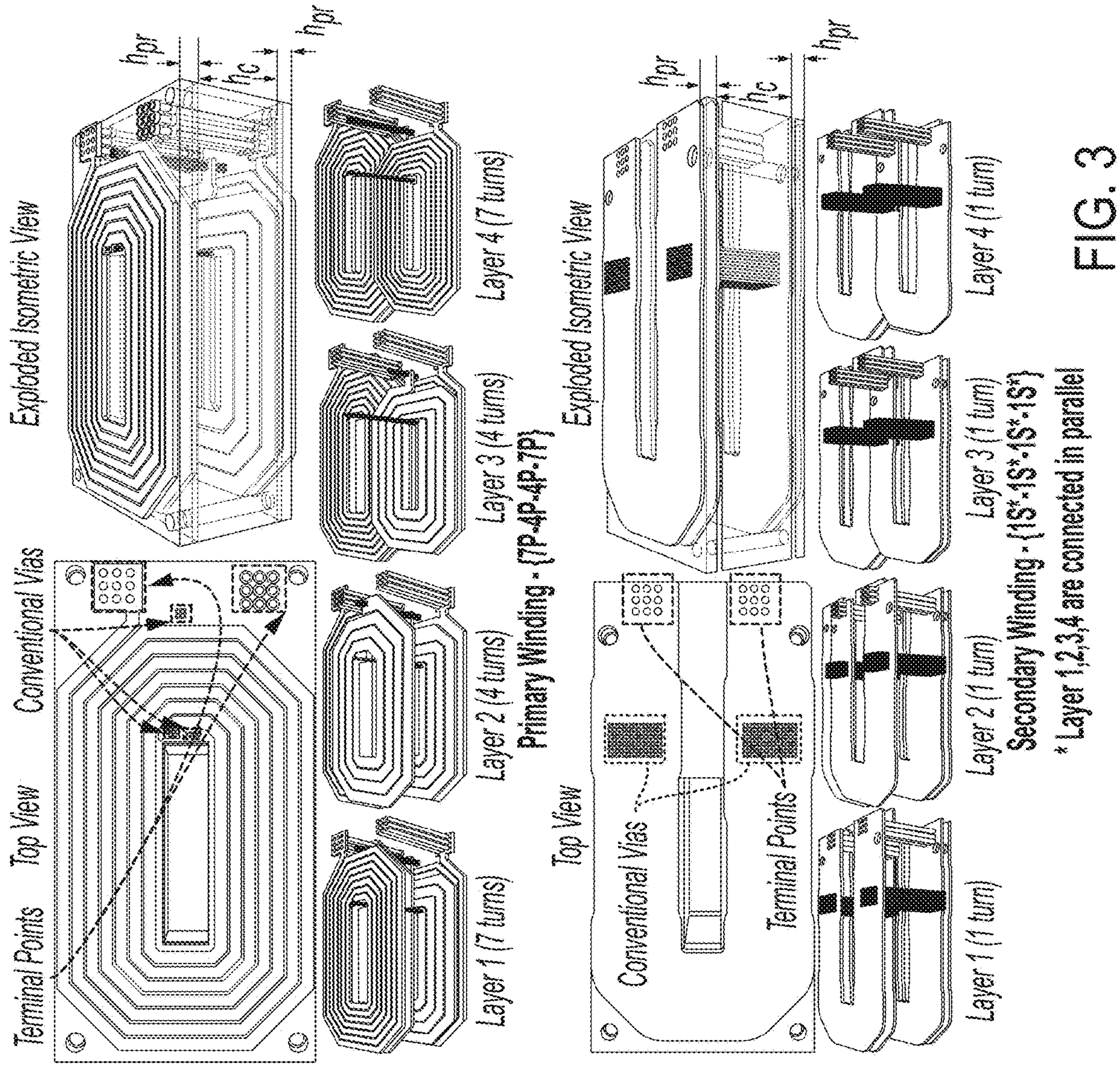
FIG. 3 shows a PCB winding arrangement for non-interleaved {[7P-4P-4P-7P], [1S*-1S*-1S*-1S*]} configurations according to examples of the present teachings.
Figure 4:
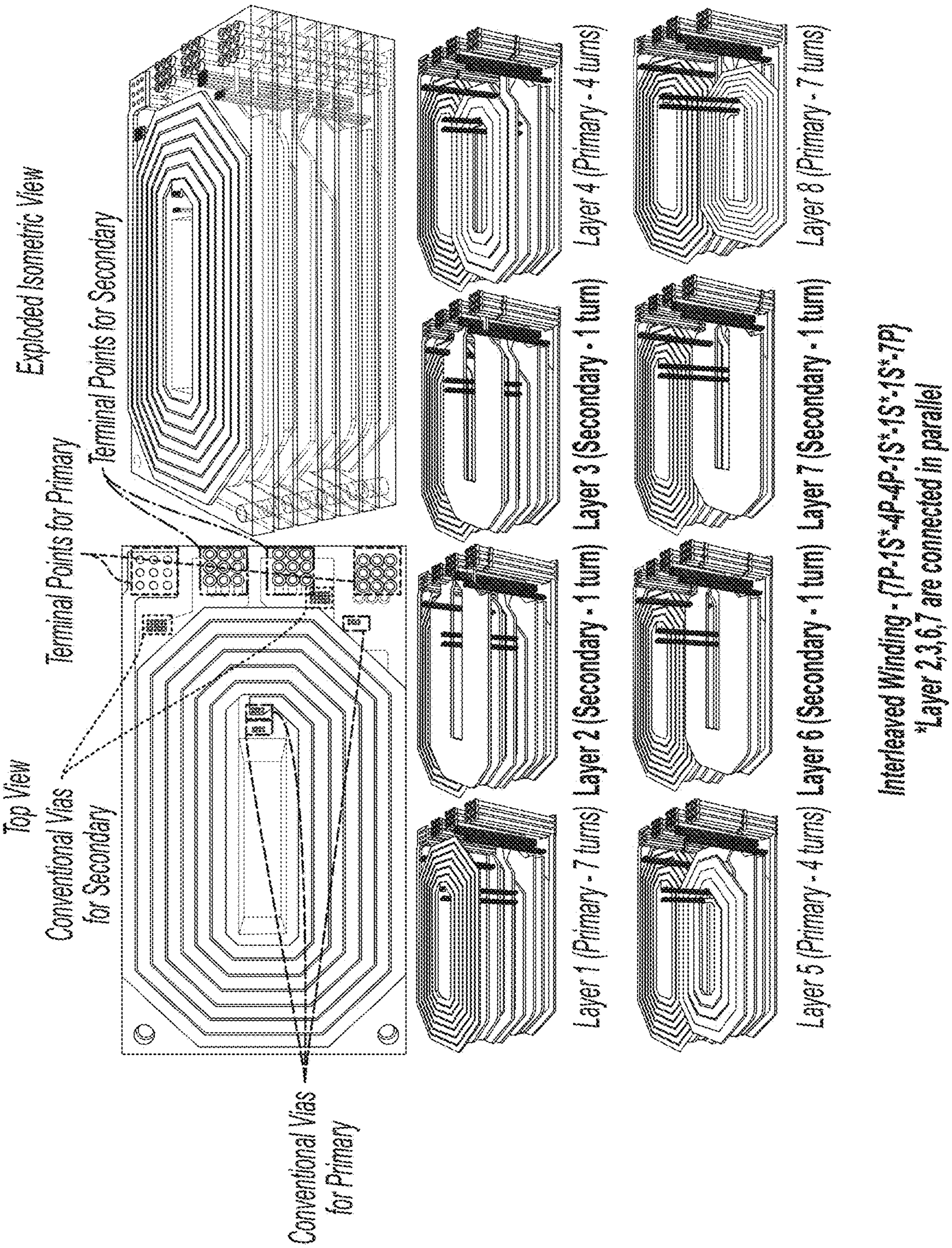
FIG. 4 shows a PCB winding arrangement for interleaved {[7P-1S-4P-4P-1S*-1S*-1S*-7P]} configuration according to examples of the present disclosure.

As observed in Table I, for the non-interleaved winding configurations, the 4-layer primary winding consisting of 22 turns is realized using different number of turns in each layer. The winding structure and its PCB layout design for one such non-interleaved configuration {[7P-4P-4P-7P], [1S*-1S*-1S*-1S*]} is shown in FIG. 3. As observed, the nomenclature of the primary winding: 7P-4P-4P-7P denotes that 7 turns of primary (P) winding are placed in the first layer, followed by 4 in the second layer, 4 in the third layer and the rest 7 turns in the fourth layer. The insulation between the copper layers is enabled by the prepreg and core layer of thicknesses $h_{pr}$ and $h_c$, respectively. Further, the transition from one layer to the next one is realized using conventional vias in the PCB, with their hole dimensions matching the current carrying requirements of the windings as per IPC 2221. Similar, arrangement is observed for the other two non-interleaved winding configurations with different number of turns in each of the PCB layer. The secondary winding in the non-interleaved configurations is designed to portray a single turn, which is realized using one turn in each of the four layers and using vias at the winding terminals to effectively connect them in parallel. The nomenclature 1S*-1S*-1S*-1S* (*Layers are connected in parallel) is used to highlight the parallel connection of the four layers, thus only extracting a single equivalent turn from a four-layer PCB. In addition to that, FIG. 4 shows the winding configuration of the interleaved winding structure. As observed, the notation for interleaved winding configuration (as seen in Table I) corresponds to an 8-layer PCB denoted as 7P-1S*-1S*-4P-4P-1S*-1S*-7P. In this case, the PCB winding assembly is realized using 7 turns of primary winding in the first layer, followed by 4 turns of primary winding in the fourth layer, 4 turns in the fifth layer and finally 7 turns in the eighth layer, all connected through conventional vias. The secondary winding is realized using single turn in second, third, sixth and seventh layer, all connected in parallel through vias at their terminal points to realize one turn in the secondary winding.

The respective 2D (front view) illustrations of the winding configurations mentioned in Table I are shown in FIG. 5A, FIG. 5B, FIG. 5C, and FIG. 5D. Corresponding to the winding configurations as shown in FIG. 5A, FIG. 5B, FIG. 5C, and FIG. 5D, this section characterizes the transformer components in detail and provides detailed tradeoffs pertaining to design and fabrication-based aspects by analyzing the model through 3D FEA simulations and analysis. As shown in FIG. 5A, FIG. 5B, FIG. 5C, and FIG. 5D, the arrangement of the layers of primary winding conductor ($h_t$) 502, FR4 Prepeg ($h_{pr}$) 504, FR4 core ($h_c$) 506, air gap ($h_\Delta$) 508, and secondary winding conductor ($h_t$) 510, are shown.

Referring to the APU based application of 400V-28V conversion, a turns ratio (n) of 22:1 is selected based on the trade-offs between the core loss and winding loss.

Corresponding to the selected n, adhering to the current carrying capabilities of copper conductors for multi-layer PCBs for a temperature rise limited to 40° C. according to IPC2221 [13], four transformer winding arrangements provided in this disclosure (explained in Table-I), with their respective illustrations shown in FIG. 5A, FIG. 5B, FIG. 5C, and FIG. 5D.

Figure 5A:
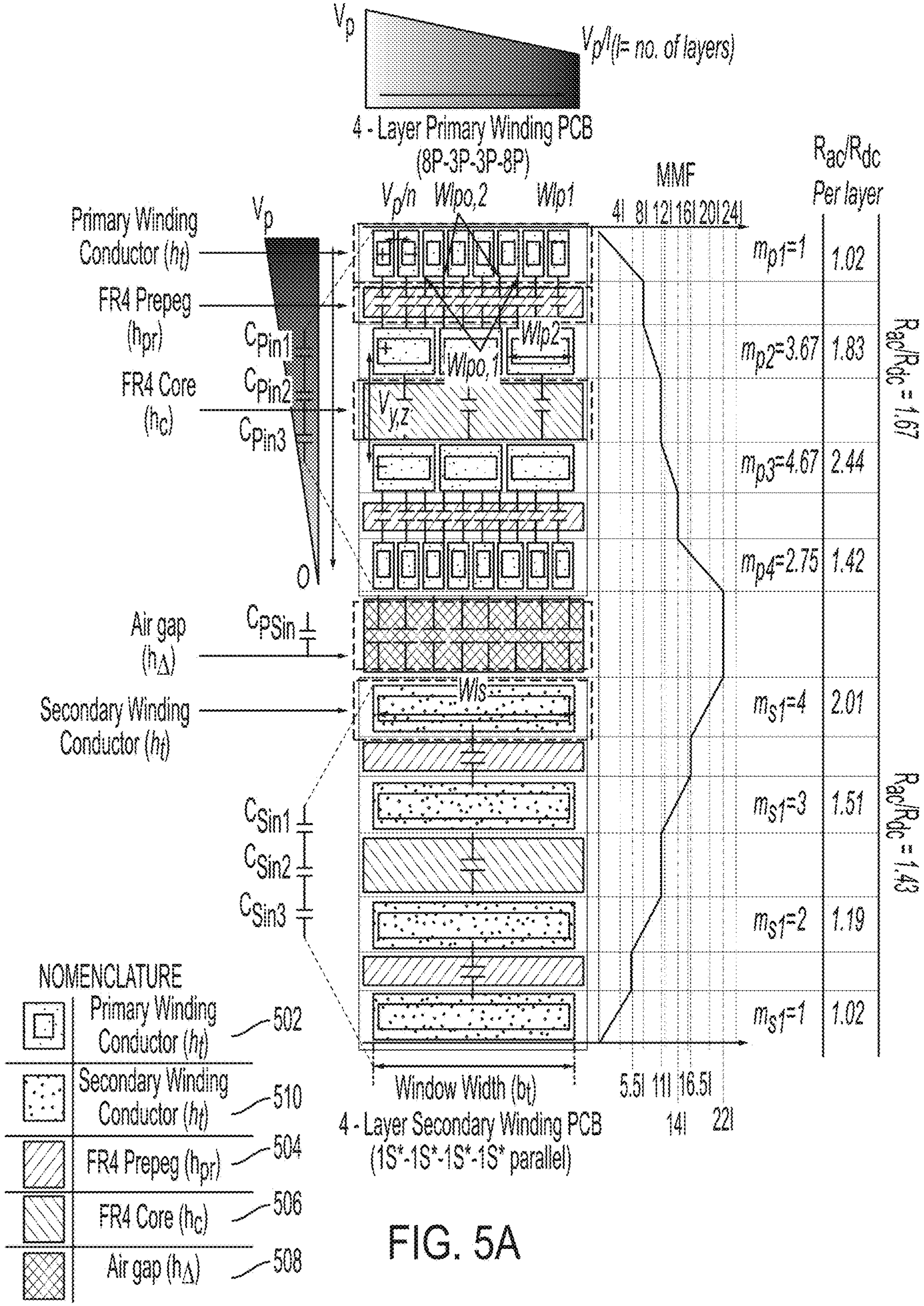
FIG. 5A, FIG. 5B, FIG. 5C, and FIG. 5D show structural winding configurations with respective MMF distributions according to examples of the present teachings.
Figure 5B:
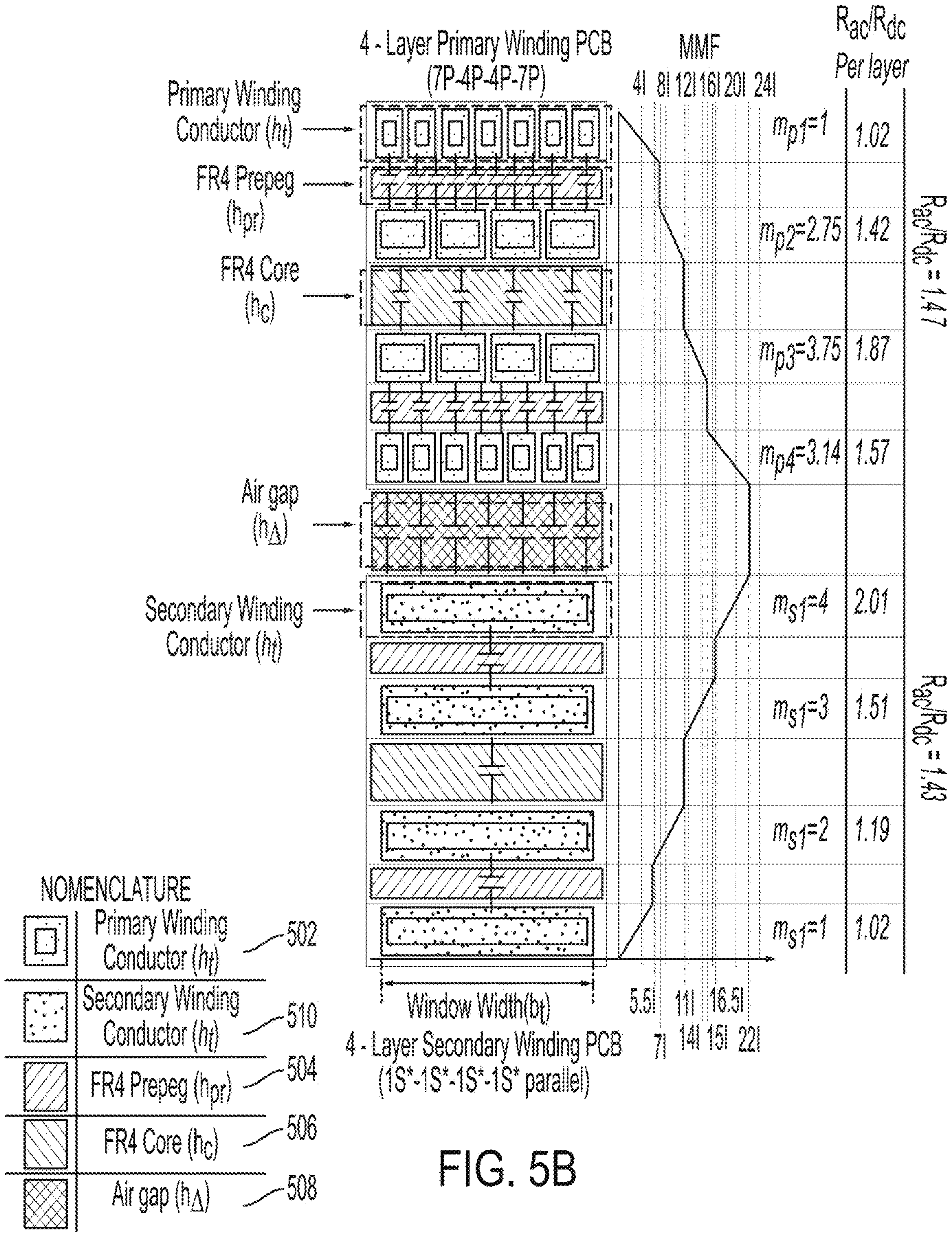
Figure 5C:
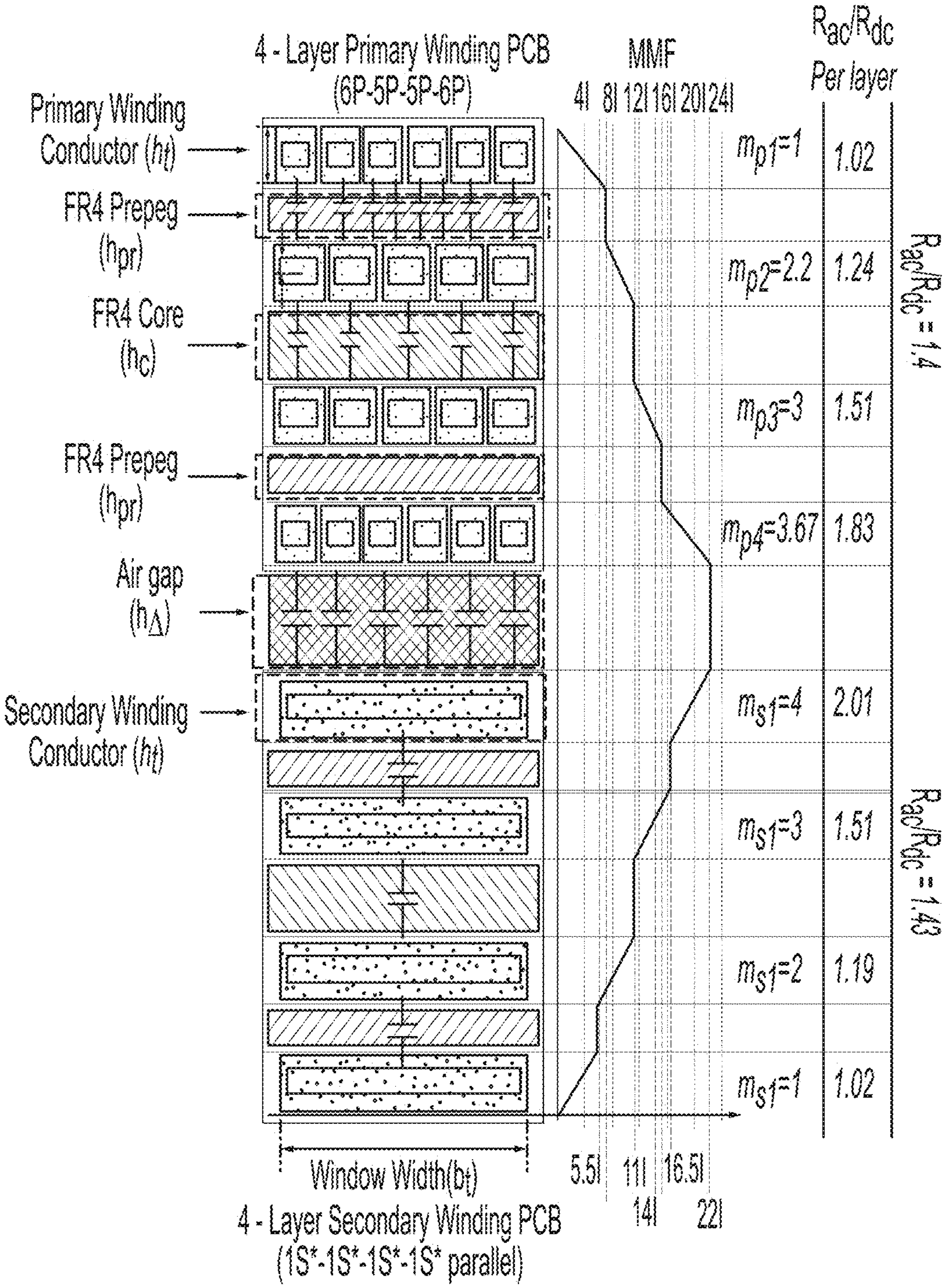
Figure 5D:
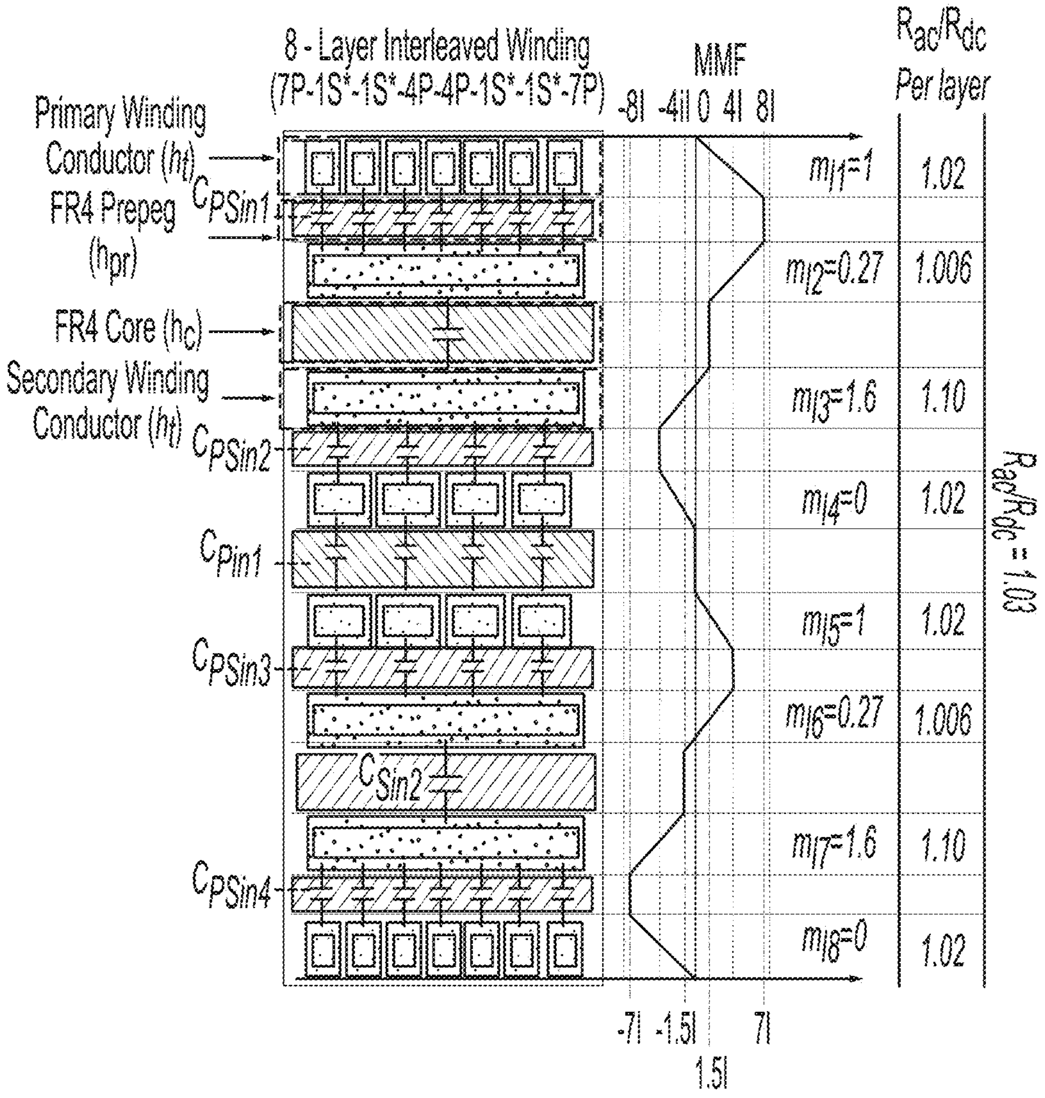

FIG. 5A, FIG. 5B, FIG. 5C, and FIG. 5D show structural winding configurations with respective MMF distributions according to examples of the present teachings. FIG. 5A shows Primary: 8P-3P-3P-8P (series) Secondary: 1S*-1S*-1S*-1S* (parallel), FIG. 5B shows Primary: 7P-4P-4P-7P (series); Secondary: 1S*-1S*-1S*-1S* (parallel), FIG. 5C shows Primary: 6P-5P-5P-6P-(series); Secondary: 1S*-1S*-1S*-1S* (parallel) configurations with 4-layer PCB, and FIG. 5D shows interleaved winding configuration: 7P-1S*-1S*-4P-4P-1S*-1S*-7P with 8-layer PCB.

TABLE I

WINDING CONFIGURATIONS UNDER STUDY
WINDING CONFIGURATIONS FOR N = 22:1

| No. | No. of Layers per winding | Primary Winding (series) | Secondary Winding (parallel) | Turns Ratio |
|---|---|---|---|---|
| 1 | 4 layers | 8P-3P-3P-8P | 1S*-1S*-1S*-1S* | 22:1 |
| 2 | 4 layers | 7P-4P-4P-7P | 1S*-1S*-1S*-1S* | |
| 3 | 4 layers | 6P-5P-5P-6P | 1S*-1S*-1S*-1S* | |
| 4 | 8 layers | 7P-1S*-1S*-4P-4P-1S*-1S*-7P (interleaved) | | |

Corresponding to the winding configurations as shown in FIG. 5A, FIG. 5B, 5C, and FIG. 5D, this section characterizes the transformer components in detail and provides detailed tradeoffs pertaining to design and fabrication-based aspects by analyzing the model through 3D FEA simulations and analysis.

A. Modeling and Controllable Synthesis of Leakage Inductance

Several studies have emphasized on the modeling and controllable reduction of leakage inductance focusing on the winding arrangement and interleaved structure. However, with an objective to attain minimized switching losses (through SVS) and yet achieve the required gain, this sub-section focusses on the fabrication-based trade-offs and elucidates the dependencies on various factors pertaining to the orientation of the winding structures.

Figure 6:
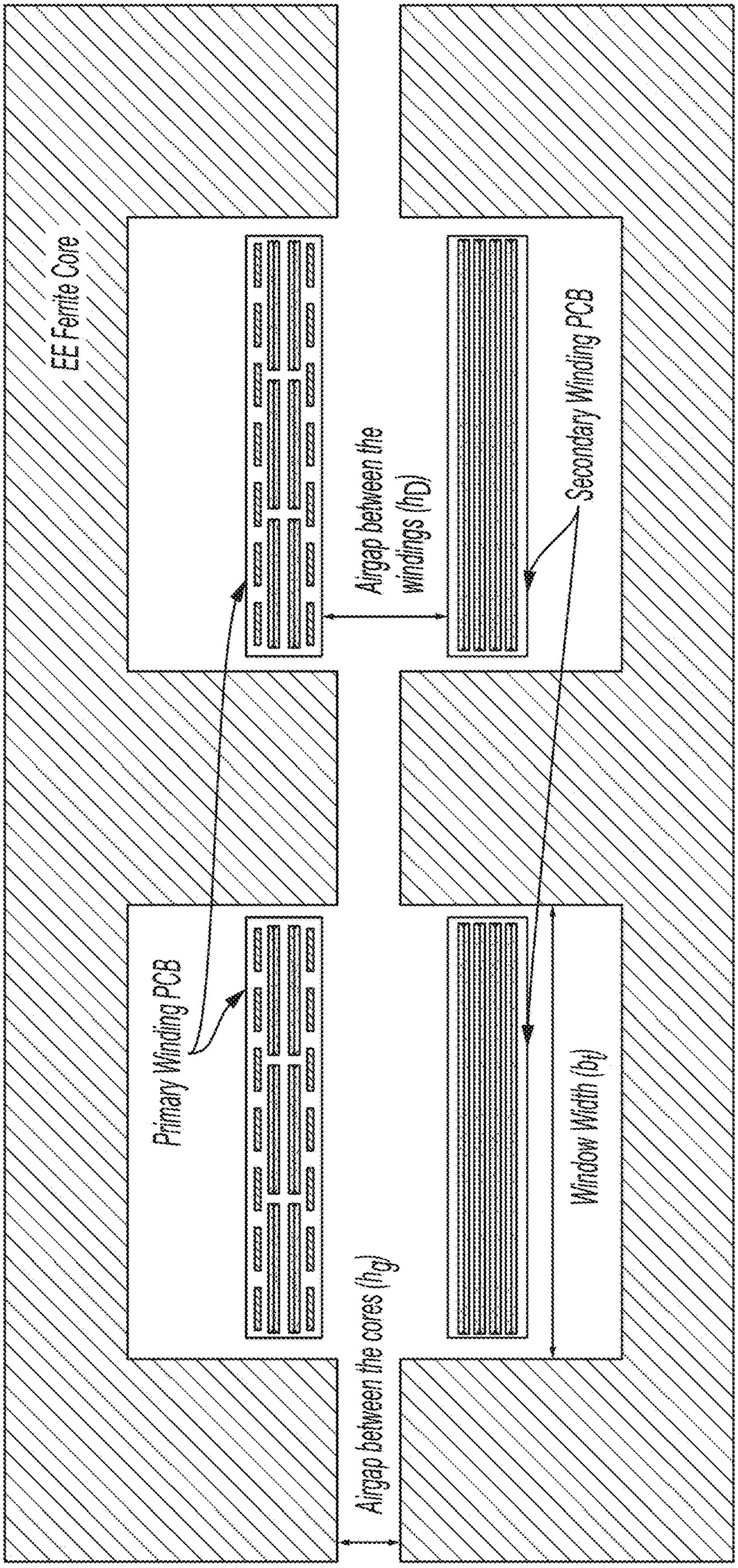
FIG. 6 shows an arrangement of transformer windings in EE ferrite core assembly according to examples of the present disclosure.

FIG. 6 shows the configurations of Table I assembled using EE-type of ferrite core according to examples of the present disclosure. To implement a leakage integrated HEFT design, an air gap ($l_g$) is introduced between the cores, intentionally leading to flux leakage from the core with the return path through the gap, winding layers and the insulation layers. The magnetic energy ($E_k$) associated with the leakage flux is used to analytically formulate the leakage inductance, highlighting its dependency on the conductor thickness and insulator between them, as shown in (9), $$E_k = \frac{\mu_o}{2}\sum\int_0^{h_t} H^2 l_t b_t dl = \frac{1}{2}L_k l_k^2; \tag{9}$$

$$k \in \{P, S\}$$

where, $\mu_0$ represents the permeability of the core, H denotes the field strength, which is formulated by the ampere turns linked, $l_t$ is the length of each winding, $b_t$ is the window width of the core and $h_t$ is the thickness of the conductor. Further, dl is the incremental thickness situated at a distance of l from the inner surface of the conductor, as observed in FIG. 5A, FIG. 5B, FIG. 5C, and FIG. 5D. Referring to (9), equations (10-12) elucidate the formulation of the magnetic energy corresponding to the primary winding, secondary winding, and the air gap respectively for a non-interleaved {[7P-4P-4P-7P], [1S*-1S*-1S*]} winding configuration.

$$E_P = \frac{\mu_o}{2} l_t b_t \left[ 22\int_0^{h_t} \left(\frac{I_P l}{b_t h_t}\right)^2 dl + \left(\frac{7I_P}{b_t}\right)^2 (h_t + h_{pr} + h_\Delta) + \left(\frac{11I_P}{b_t}\right)^2 (h_t + h_c + h_\Delta) + \left(\frac{15I_P}{b_t}\right)^2 (h_t + h_{pr} + h_\Delta) + \left(\frac{22I_P}{b_t}\right)^2 (h_t + h_\Delta) \right] \tag{10}$$

$$E_S = \frac{\mu_o}{2}\frac{l_t b_t}{n^2} \left[ 22\int_0^{h_t} \left(\frac{I_P l}{b_t h_t}\right)^2 dl + \left(\frac{22I_P}{b_t}\right)^2 (h_t + h_\Delta) + \left(\frac{\frac{33}{2}I_P}{b_t}\right)^2 (h_t + h_{pr} + h_\Delta) + \left(\frac{11I_P}{b_t}\right)^2 (h_t + h_c + h_\Delta) + \left(\frac{\frac{11}{2}I_P}{b_t}\right)^2 (h_t + h_{pr} + h_\Delta) \right] \tag{11}$$

$$E_{lk,air} = \frac{\mu_o}{2} l_t b_t \left[ \left(\frac{22I_P}{b_t}\right)^2 (h_\Delta) \right] \tag{12}$$

Further, analytical expressions corelating the leakage inductances for the four winding structures with the conductor and PCB insulator thickness ($h_{pr}$: prepreg layer and $h_c$: core layer) are shown in Table-II.

TABLE II

LEAKAGE INDUCTANCE ANALYTICAL MODEL FOR WINDING CONFIGURATIONS UNDER STUDY
LEAKAGE INDUCTANCE ANALYTICAL MODEL FOR WINDING CONFIGURATIONS FOR N = 22:1 HFPT

| Winding Configuration | Primary Leakage Inductance | Secondary Leakage Inductance | Leakage in the air gap between the windings |
|---|---|---|---|
| {8P-3P-3P-8P}, {1S*-1S*-1S*-1S*} | $\frac{\mu_o l_t}{b_t}\left[\frac{2617}{3}h_1 + 260h_{pr} + 121h_c + 865h_\Delta\right]$ | $\frac{\mu_o l_t}{n^2 b_t}\left[\frac{2745}{3}h_1 + \frac{605}{2}h_{pr} + 121h_c + \frac{1815}{2}h_\Delta\right]$ | $\frac{\mu_o l_t}{b_t}[484h_\Delta]$ |
| {7P-4P-4P-4P}, {1S*-1S*-1S*-1S*} | $\frac{\mu_o l_t}{b_t}\left[\frac{2659}{3}h_1 + 274h_{pr} + 121h_c + 879h_\Delta\right]$ | | |
| {6P-5P-5P-6P}, {1S*-1S*-1S*-1S*} | $\frac{\mu_o l_t}{b_t}\left[\frac{2713}{3}h_1 + 292h_{pr} + 121h_c + 897h_\Delta\right]$ | | |
| Interleaved | $\frac{\mu_o l_t}{b_t}\left[\frac{217}{3}h_1 + 65h_{pr}\right]$ | $\frac{\mu_o l_t}{b_t}\left[\frac{461}{6}h_1 + 65h_{pr} + \frac{18}{4}h_c\right]$ | N/A |

Figure 7B:
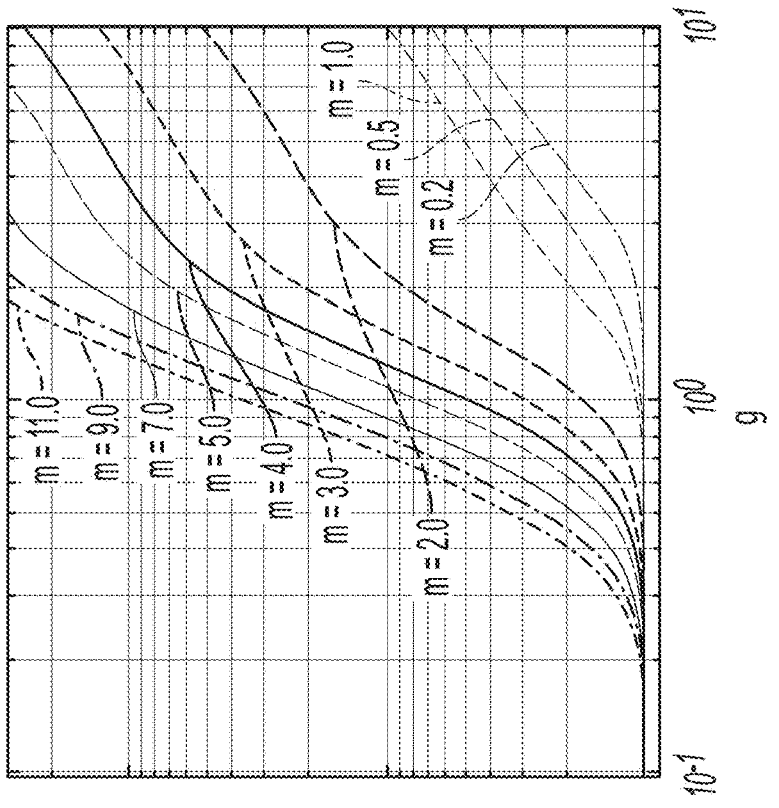
FIG. 7A shows a plot depicting the variation of $R_p$ and $R_s$ with respect to variation in frequency and FIG. 7B shows a plot depicting variation of the ratio $R_{ac}/R_{dc}$ with respect to k for different values of m depending on the winding configuration according to examples of the present teachings.
Figure 8A:
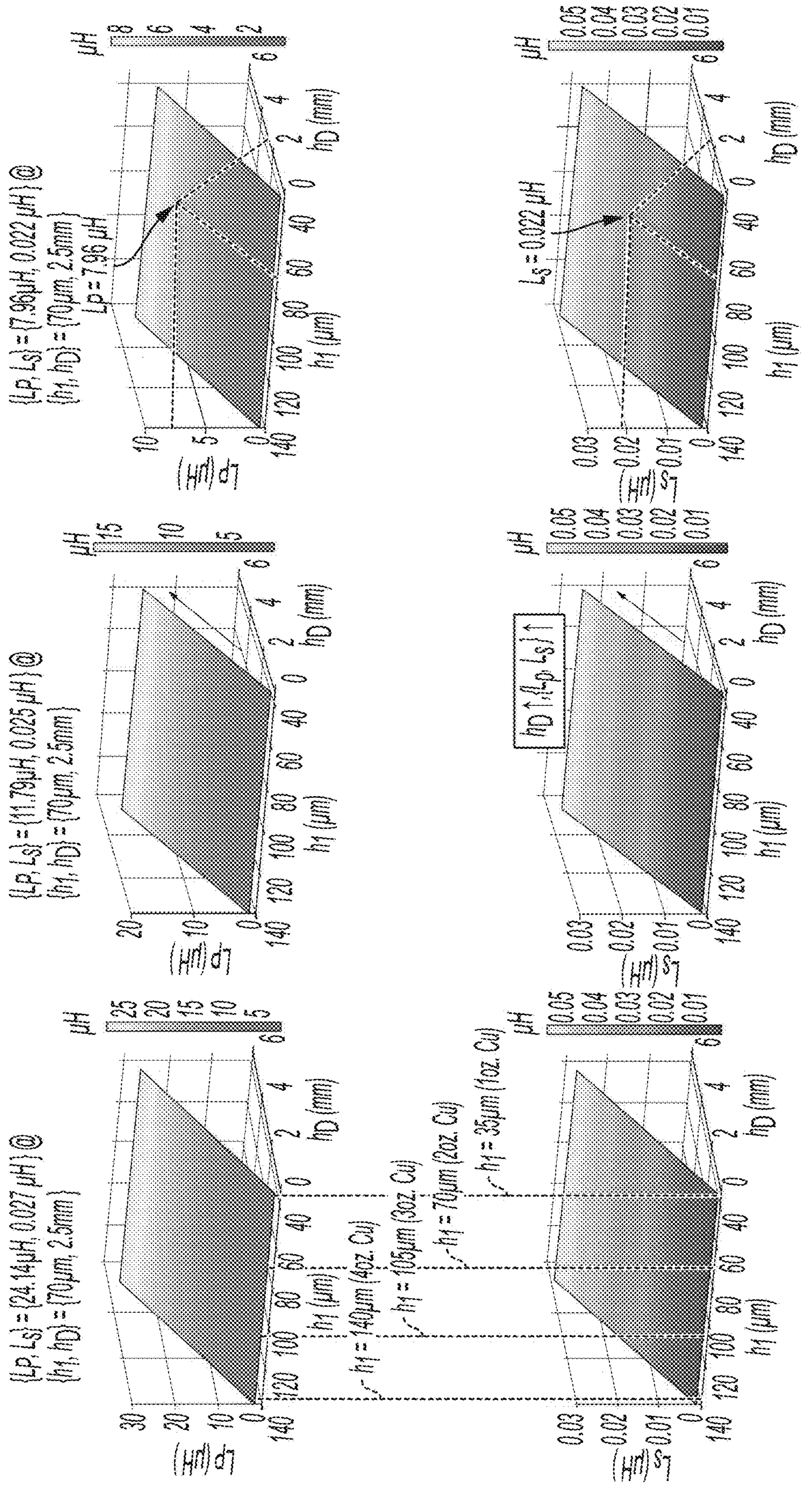
FIG. 8A and FIG. 8B show a 3D plot comparing resultant leakage inductances for different $h_1$ and $h_\Delta$ for non-interleaved winding configurations according to examples of the present teachings.

FIG. 8A shows a 3D plot comparing resultant leakage inductances for different $h_t$ and $h_\Delta$ for non-interleaved winding configurations according to examples of the present teachings. FIG. 7B shows a plot corelating leakage inductance for different $h_1$ for interleaved ({7P-1S*-1S*-4P-4P-1S*-1S*-7P} configuration according to examples of the present teachings.

Referring to the interdependency of the leakage inductances on the structural arrangement and related hardware specifications of the windings, the designer has the flexibility to obtain the required leakage varying the air gap ($h_\Delta$). Further, the leakage inductances also depend on the thickness of the conductor ($h_1$) used for the PCB fabrication that typically ranges between 35 to 140 μm corresponding to 1 to 4 oz. of copper. To elucidate this dependency, FIG. 8A and FIG. 8B portray a plot of different values of leakage inductances obtained from 3D FEA simulations for the above-mentioned four winding configurations. As observed, due to increased flux leakage with increasing values of air gap, the resultant leakage inductances also see a linear rise. In case of interleaved winding structure, due to absence of airgap between the two windings, the leakage inductance depends only the conductor thickness, which results in a linearly increasing trend—matching well with the derived analytical expressions (as shown in Table-II).

Figure 8B:
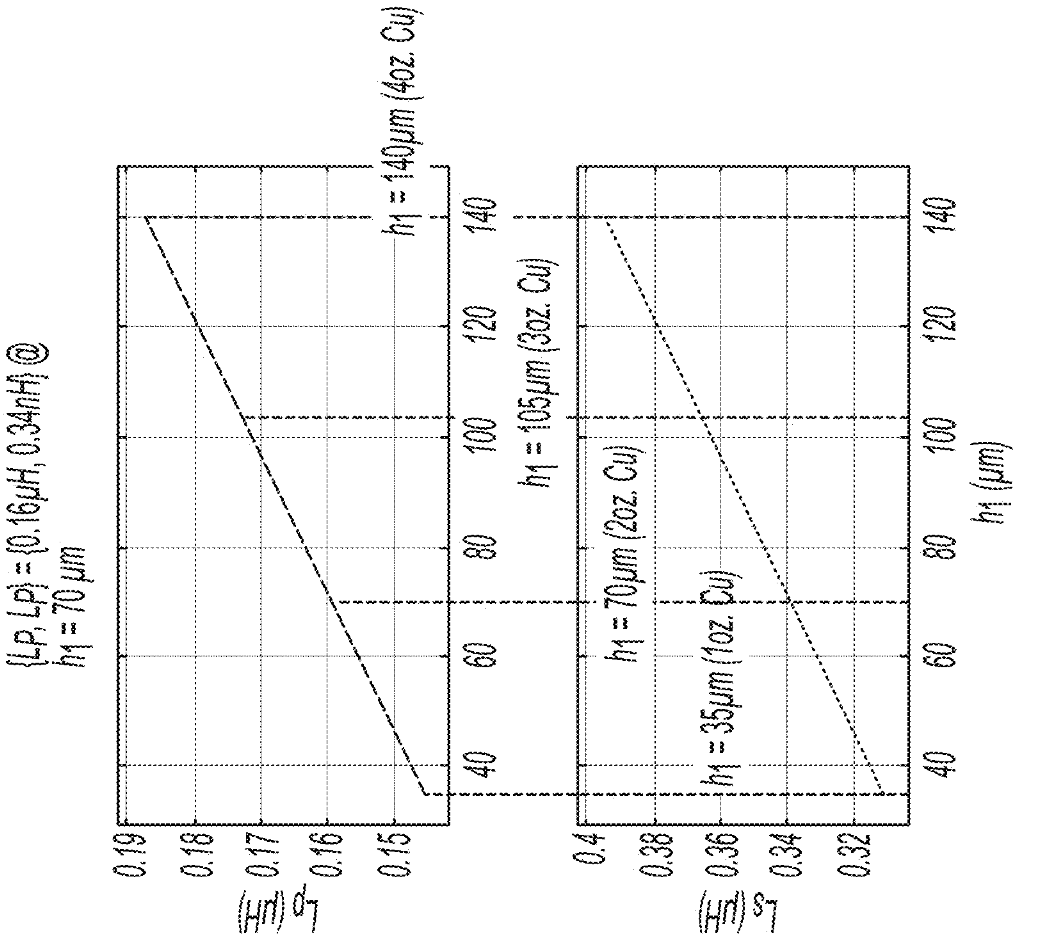
Figure 9B:
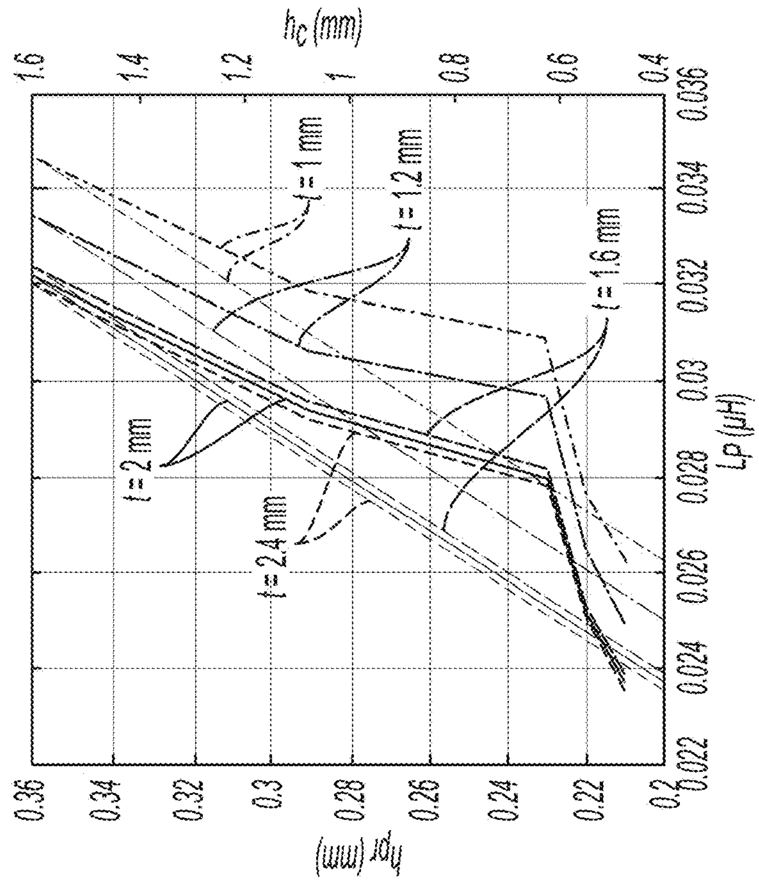
FIG. 9A and FIG. 9B show plots explaining the relation between (FIG. 9A) $L_p$ and (FIG. 9B) $L_s$ for different $h_{pr}$ and $h_c$ corresponding to different PCB thicknesses for {[8P-3P-3P-8P], [1S*-1S*-1S*-1S1]} winding configuration according to examples of present teachings.
Figure 9A:
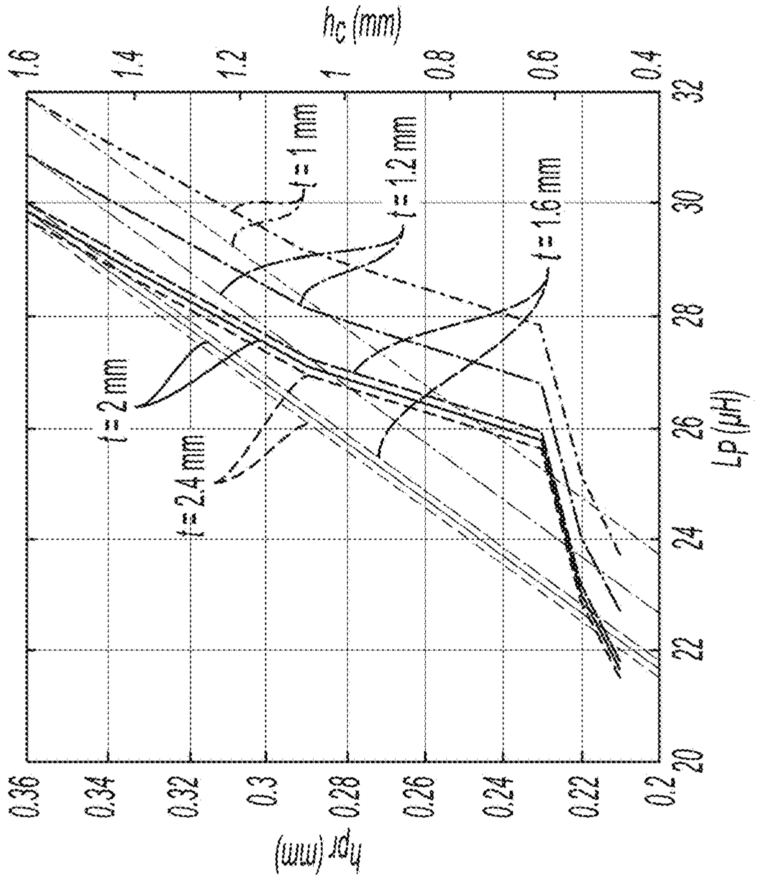
Figures 1, 10A:
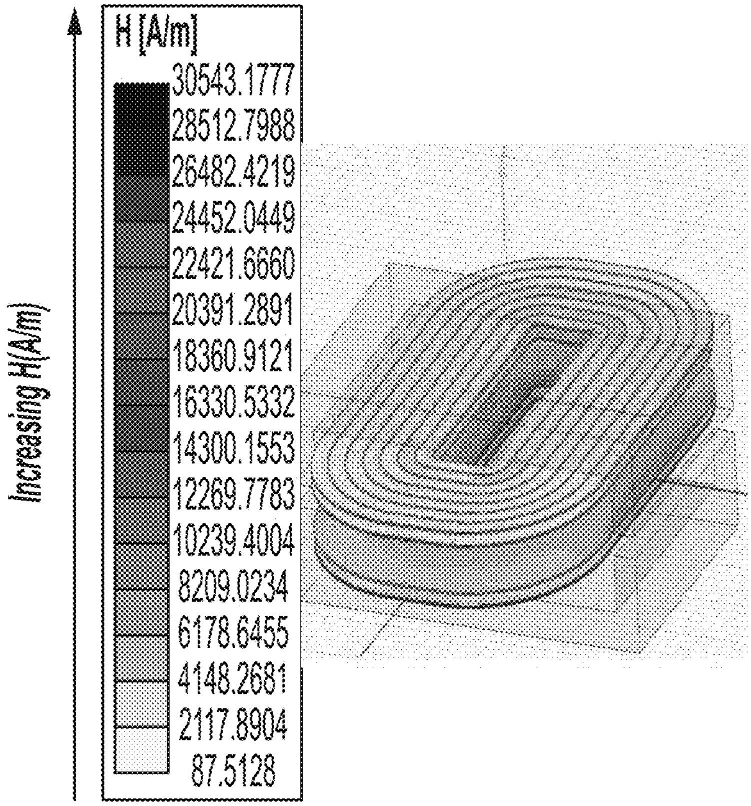
Figures 2, 10A:
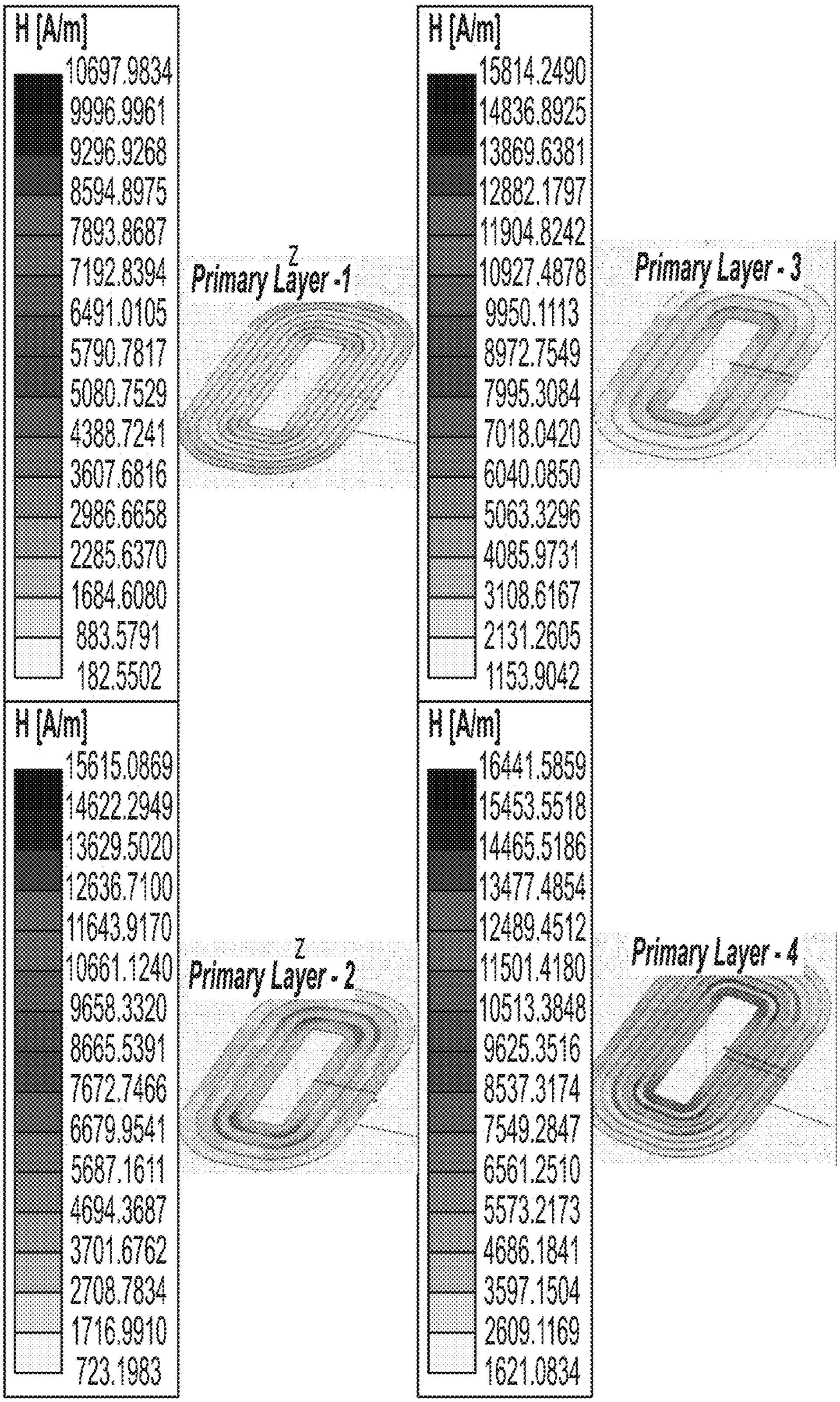
Figures 3, 10A:
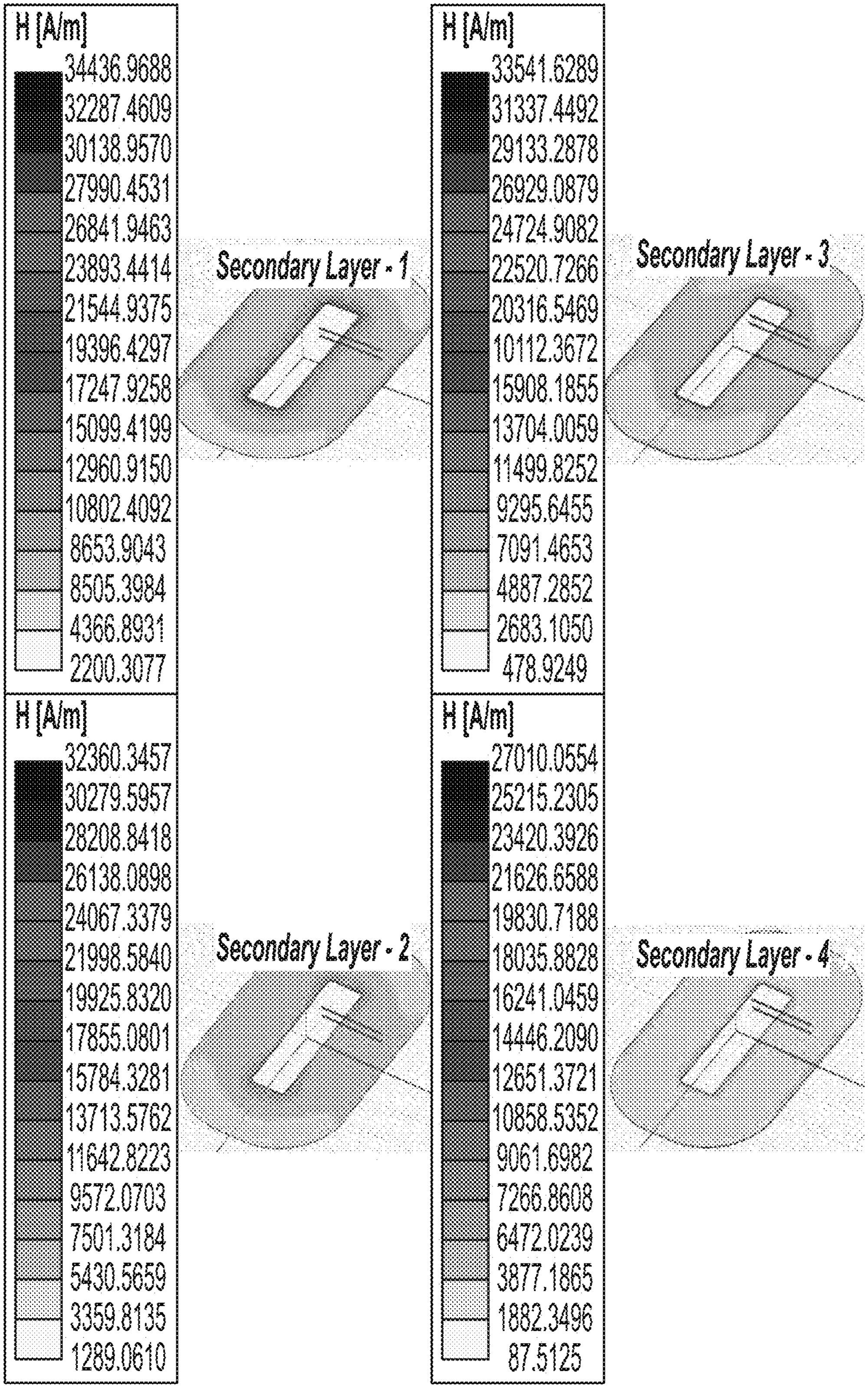
Figures 1, 10B:
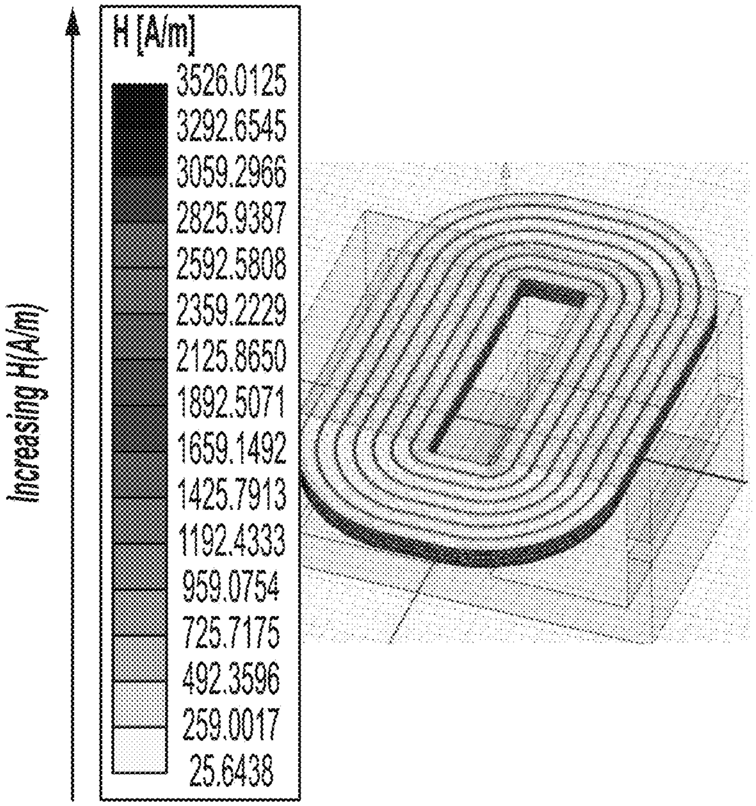
Figures 2, 10B:
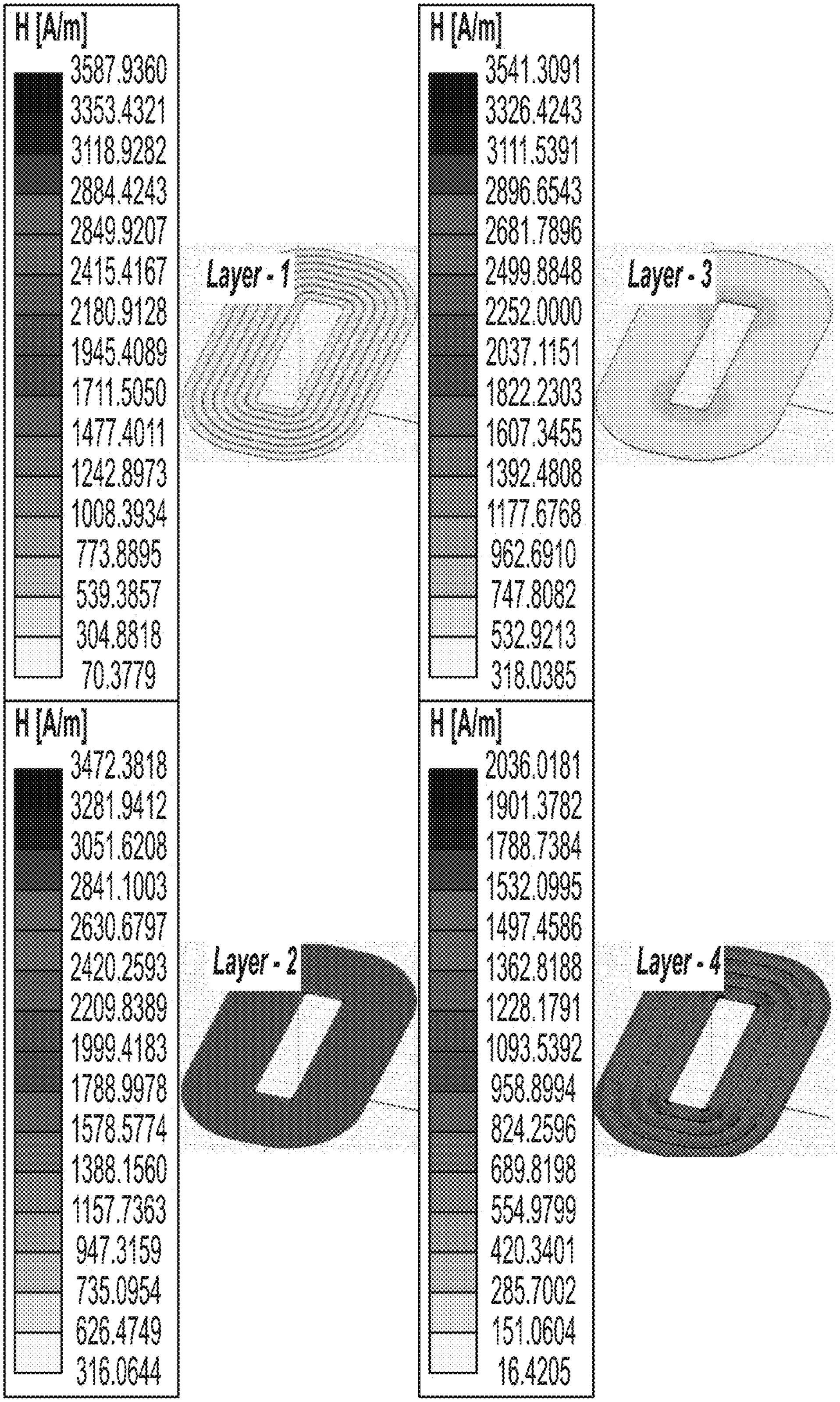
Figures 3, 10B:
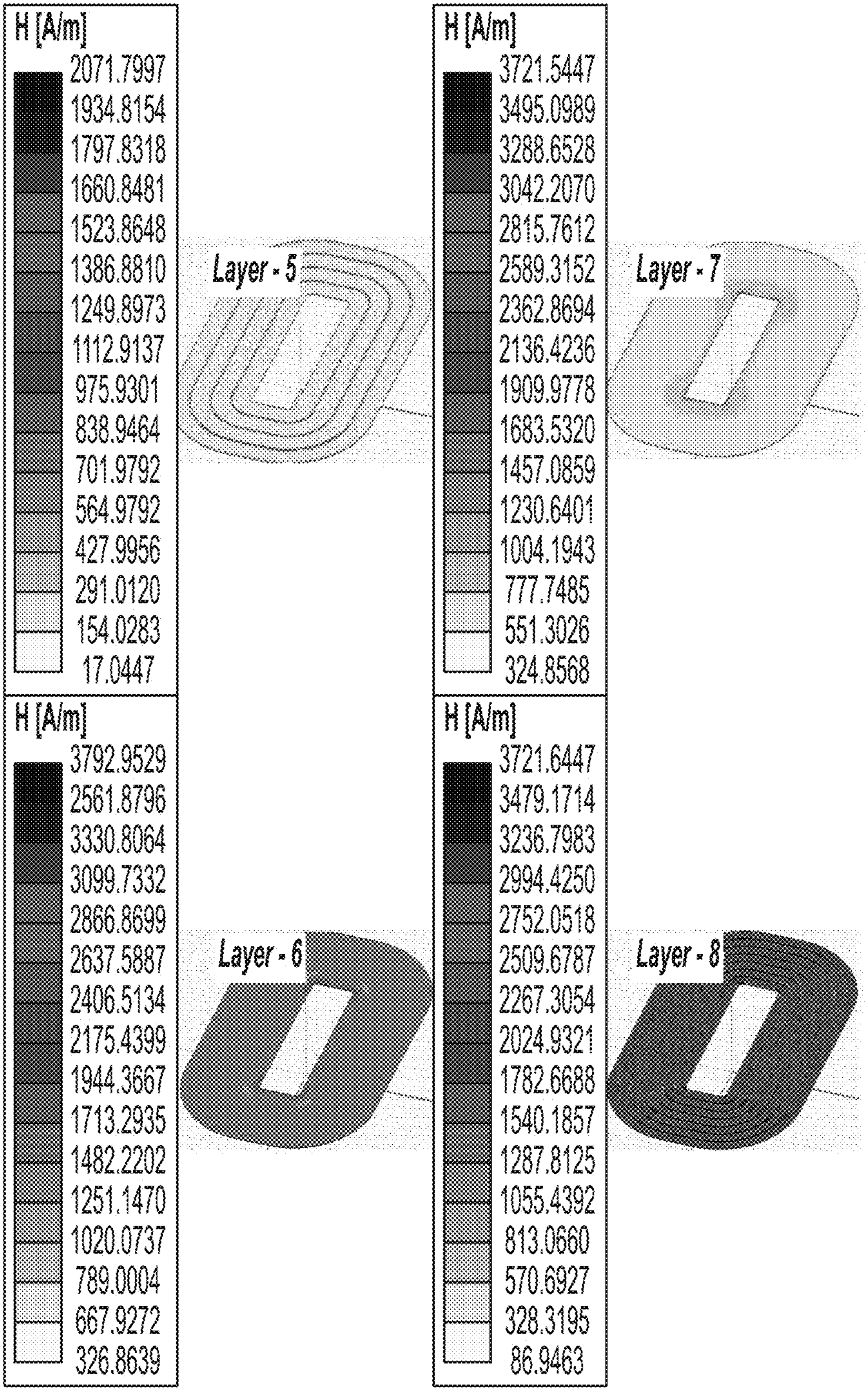

Furthermore, as observed in Table-II, the effective value of leakage inductance also depends on the arrangement, width and thickness of the insulators used for PCB fabrication. This aspect generally depends on the PCB manufacturing capabilities and is defined according to the thickness of the fabricated PCBs [14]. FIG. 9A and FIG. 9B show plots explaining the relation between (FIG. 9A) $L_p$ and (FIG. 9B) $L_s$ for different $h_{pr}$ and $h_c$ corresponding to different PCB thicknesses for {[8P-3P-3P-8P], [1S*-1S*-1S*-1S*]} winding configuration according to examples of present teachings. The variation of the obtained leakage inductances with {[8P-3P-3P-8P],[1S*-1S*-1S*-1S*]} configuration fabricated using various PCB thicknesses (t) and corresponding thickness of insulation layers ($h_{pr}$ and $h_c$) for a typical 4-layer PCB is illustrated in FIG. 8A and FIG. 8B. Please note that the solid lines show the trend of $L_P$ and $L_S$ with respect to variation in $h_{pr}$, while the dotted lines show the variation with respect to $h_c$.

FIG. 10A-1, FIG. 10A-2, FIG. 10A03, FIG. 10B-1, FIG. 10B-2, and FIG. 10B-3 shows MMF distributions obtained from 3D FEA sing for (FIG. 10A-1, FIG. 10A-2, FIG. 10A-3) {[8P-3P-3P-8P], [1S*-1S*-1S*-1S]} winding configuration and (FIG. 10B-1, FIG. 10B-2, FIG. 10B-3) interleaved ({7P-1S*-1S*-4P-4P-1S*-1S*-7P}) configuration according to examples of the present teachings. As seen in the above analysis, the leakage inductance obtained using interleaved winding is considerably smaller than that with non-interleaved winding. This is because the magnetic energy linked to leakage flux is significantly lesser due to absence of air gap, leading to better flux linkage between the windings and the core. In that context, FIG. 10A-1, FIG. 10A-2, FIG. 10A03, FIG. 10B-1, FIG. 10B-2, and FIG. 10B-3 compare the MMF distribution and field linkage of each layer of non-interleaved {[7P-4P-4P-7P], [1S*-1S*-1S*-1S*]} and interleaved ({(7P-1S*-1S*-4P-4P-1S*-1S*-7P}) winding structures, obtained through 3D FEA simulations. Relating these results to the MMF distribution shown in FIG. 10A-1, FIG. 10A-2, FIG. 10A03, FIG. 10B-1, FIG. 10B-2, and FIG. 10B-3, the resultant magnitude of H (A/m) is found to be increasing while moving from the primary layer-1 towards the air gap, reaching its peak for primary layer-4 and secondary layer-1, and consequently reducing at secondary layer-4. With all the above-mentioned considerations, the optimal selection of fabrication parameters depends on the ZVS criteria and the application specific voltage gain requirement, which are covered in Section IV.

B. Winding Resistance Modeling and Minimization

For applications targeting high switching frequency similar to the proposed CLLC DC/DC converter topology, winding losses pertaining to the effective AC winding resistance are found to be significantly high due to eddy current and skin effects [11].

Figure 16B:
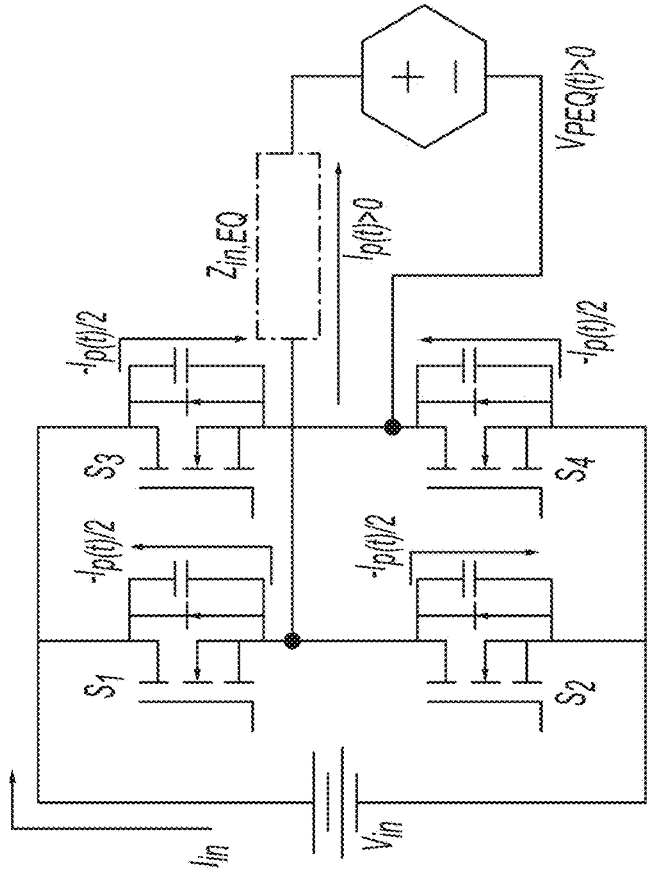
FIG. 16A and FIG. 16B show ZVS turn on cases (FIG. 16A) for switch $S_2$ and $S_3$ (FIG. 16B) for switch $S_1$ and $S_4$ according to examples of the present teachings.
Figure 16A:
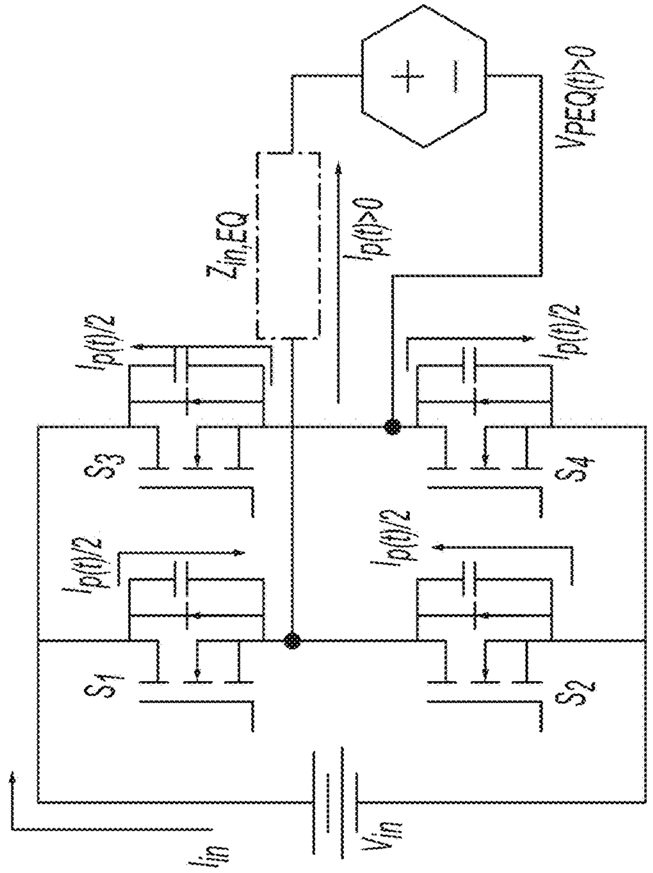

Further, the HFPTs used for resonant converters experience non-uniform current density due to variable switching frequencies leading to winding losses due to proximity effect. Thus, accurate modelling of winding resistance for a wide frequency range with different transformer winding structures is quintessential for conduction loss optimization. The effective winding resistance accounting for the skin effect of a foil conductor with sinusoidal excitation can be represented as the ratio of AC resistance ($R_{ac}$) to the winding DC resistance ($R_{dc}$), as expressed in (5), $$\frac{R_{ac}}{R_{dc}} = \frac{\gamma}{2}\left[\frac{\sinh\gamma + \sin\gamma}{\cosh\gamma - \cos\gamma}\right]; \qquad (5)$$

$$R_{dc} = \frac{\rho l_t}{h_t b_t}$$

where, ρ is the resistivity of the conductor and $$\gamma = \frac{h_t}{\delta},$$

where δ is the skin depth. Using (5), based on the fill factor of the conductor in the window width, porosity of the conductor and the switching frequency, the analytical expression for the effective winding AC resistance is obtained using the improved. Dowell's equation [15] by extrapolating (5) for the current density field distribution in kth layer, as shown in (6), $$\frac{R_{ac}}{R_{dc}} = \frac{\gamma}{2}\left[\frac{\sinh\gamma + \sin\gamma}{\cosh\gamma - \cos\gamma} + (2m-1)^2\frac{\sinh\gamma - \sin\gamma}{\cosh\gamma + \cos\gamma}\right] \qquad (6)$$

$$m = \frac{MMF(k)}{MMF(k) - MMF(k-1)} \qquad (7)$$

where, MMF(k) denotes the magnetomotive force of windings in layer k. The losses due to proximity effect (depicted by the second term in (6)) depends on the orientation of windings, which is dictated by the value of m for each layer. A comparative analysis elucidating the effective $$\frac{R_{ac}}{R_{dc}}$$

ratio for the four winding structures for 500 kHz operational frequency and $h_1$=70 μm is shown in FIG. 5A, FIG. 5B, FIG. 5C, and FIG. 5D. As observed, the effective ratio $$\left(\left[\frac{R_{ac}}{R_{dc}}\right]_{eff}\right)$$

is 38.3% lower than for the interleaved structure as compared to the other three winding arrangements resulting in minimum AC resistance, thus significantly reducing the winding induced losses in the system. This concept is also verified by visualizing and comparing the current density distribution of {[7P-4P-4P-7P], [1S*-1S*-1S*-1S*]} and interleaved ({7P-1S*-1S*-4P-4P-1S*-1S*-7P}) winding structures through 3D FEA analysis, as shown in FIG. 16A and FIG. 16B.

Figure 17A:
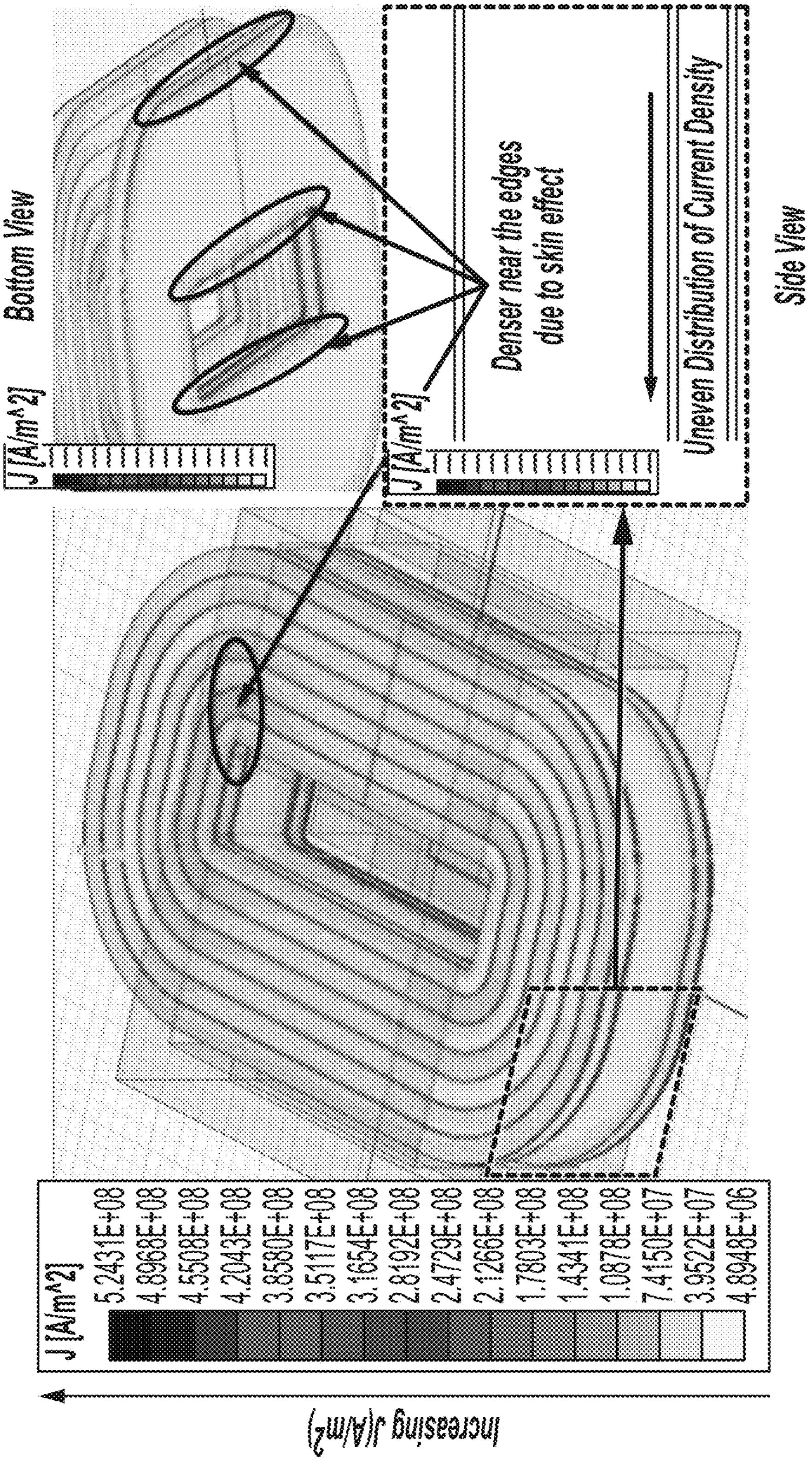
FIG. 17A and FIG. 17B show current density distribution obtained from 3D FEA simulations for (FIG. 17A) ({[7P-4P-4P-7P], [1S*-1S*-1S*-1S*]}) and (FIG. 17B) interleaved ({7P-1S*-1S*-4P-4P-1S*-1S*-7P}) winding distribution according to examples of the present teachings.
Figure 17B:
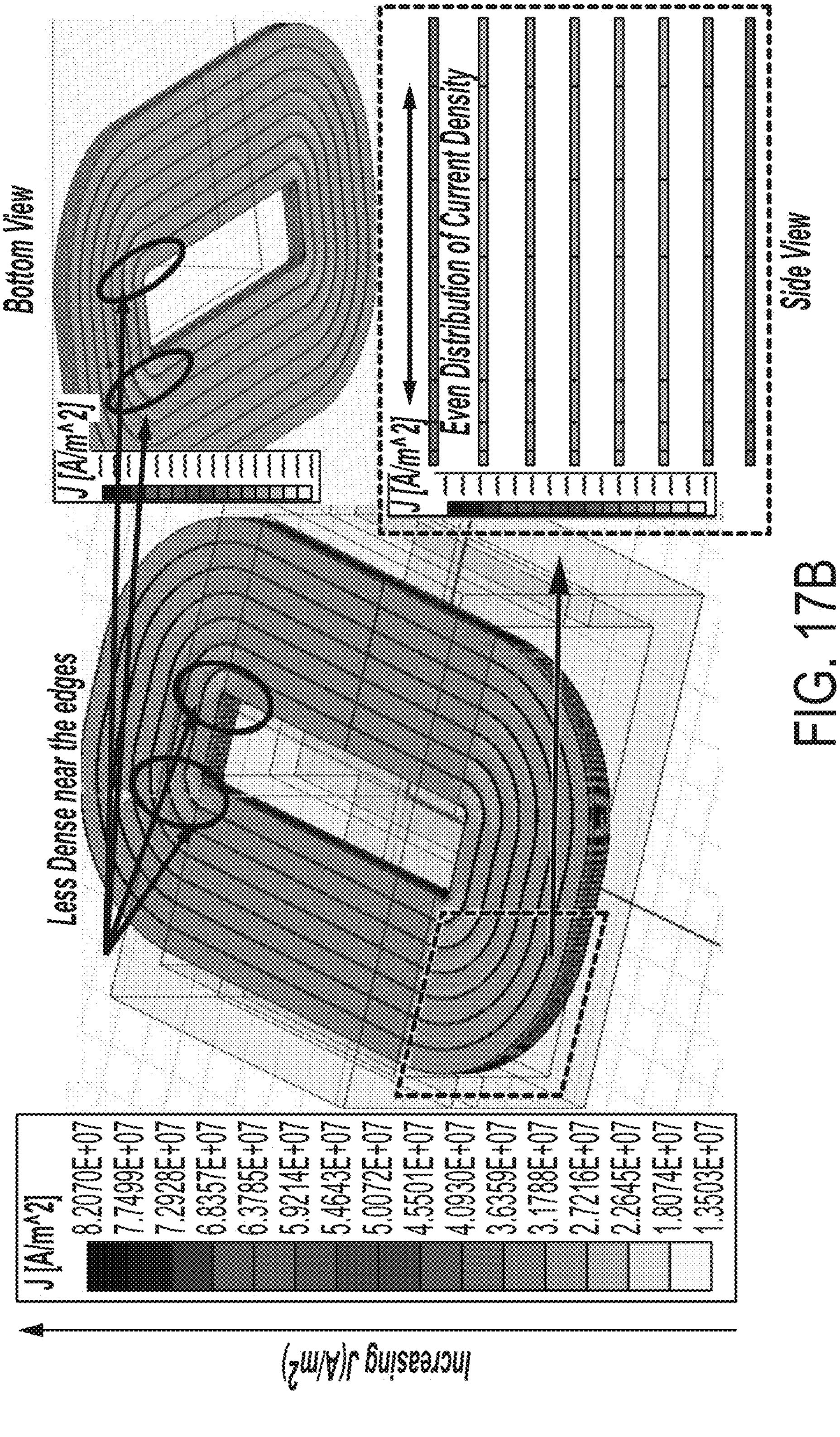

FIG. 17A and FIG. 17B show current density distribution obtained from 3D FEA simulations for (FIG. 17A) ({[7P-4P-4P-7P], [1S*-1S*-1S*-1S*]}) and (FIG. 17B) interleaved ({7P-1S*-1S*-4P-4P-1S*-1S*-7P}) winding distribution according to examples of the present teachings. As observed, the current density is higher near the edges for non-interleaved winding arrangements due to skin and proximity effects, which tend to distort the current distribution even further at higher frequencies, leading to higher winding losses.

Figure 7A:
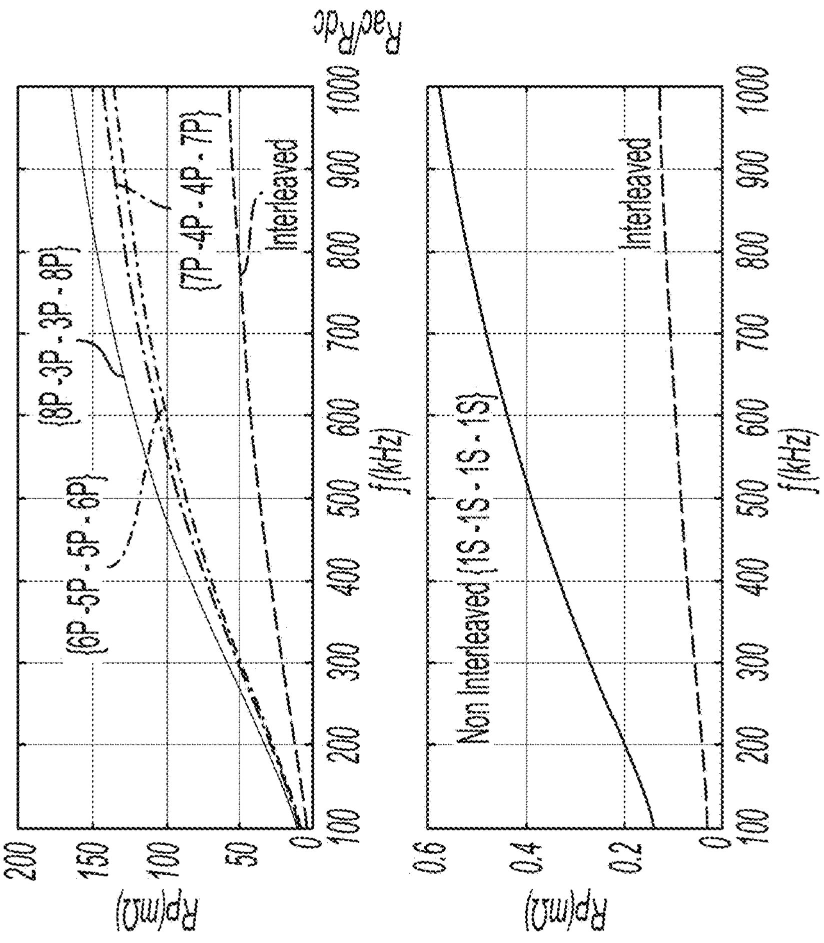

FIG. 7A shows a plot depicting the variation of $R_p$ and $R_s$ with respect to variation in frequency and FIG. 7B shows a plot depicting variation of the ratio $R_{ac}/R_{dc}$ with respect to k for different values of in depending on the winding configuration according to examples of the present teachings. In that context, FIG. 7A shows the variation of the effective winding resistance for both the primary and secondary winding obtained from FEA simulations with respect to the excitation frequencies for the four mentioned winding configurations.

The $$\frac{R_{ac}}{R_{dc}}$$

ratio is not only dependent on m, but also on the value of γ that depends on the conductor thickness and the frequency of operation. To depict this relationship, FIG. 7B elucidates the plot of $$\frac{R_{ac}}{R_{dc}}$$

ratio with respect to variation in γ for different values of m. As observed, as the thickness of the conductor exceeds its skin depth ($h_t$>>δ), the $$\frac{R_{ac}}{R_{dc}}$$

ratio observes a drastic increase, resulting in higher winding resistance. Further, at a fixed frequency operation, reducing the conductor thickness results in lower value of AC resistance, at an expense of increased DC winding resistance and hence a higher overall winding resistance, as observed in the trend shown in FIG. 7B.

The above analysis dissects the Dowell's equation to formulate the effective winding resistance for a HFPT. However, as suggested in [12], there are several assumptions pertaining to the porosity factor [16] (included when the conductor width is comparable to its thickness leading to proximity effect in horizontal direction), distance considerations between multiple conductors turns in a single layer, distance of conductor surface from the core, and sinusoidal excitation provided to the windings, that are ignored for reduced complexity [12]. Thus, to accurately characterize the winding resistance and to observe the losses due to skin and proximity effects, the 3D FEA simulation proves to be more reliable as presented in this work.

C. Stray Capacitance Modeling

As explained in Section-II, the switching performance of the CLLC resonant converter degrades due to presence of inter- and intra-winding capacitances in the HFPT. Several techniques have been discussed in the literature that focus on modelling these stray capacitances to enhance the EMI performance and voltage regulation of the converters under various loading conditions [11]. However, all the works have presented a generalized analysis to model these capacitors, with several assumptions pertaining to non-uniformity in the PCB insulation layers and winding configurations. For example, [11] considers the overlapping area for all the capacitors to be equal with equal spacing between the two layers. However, as observed in FIG. 5A, FIG. 5B, FIG. 5C, and FIG. 5D, generally the winding arrangement dictates the resultant stray capacitance with varying winding widths adhering to PCB fabrication standards. Thus, with an intent to provide intricate modelling while accounting for the winding arrangement, insulation thickness, overlapping area and voltage gradient between the conductors, this section provides a detailed model to formulate the stray capacitances appearing in the primary and secondary windings.

The potential across the winding is assumed to vary linearly with the turns. Thus, the potential at each turn of the winding ($V_y$) can be written as:

$$V_y = \frac{(n+1)-y}{n} V_p;\ y \in \{1,2,3 \ldots n\} \tag{13}$$

where n is the number of turns in the winding, and $V_p$ is the primary voltage excitation. Thus, a voltage gradient ($V_{y,x}$) exists between the two adjacent windings and the windings in two adjacent layers, which essentially leads to formation of virtual capacitors. This capacitance ($C_{y,z}$) can be formulated by analyzing the overlapping conductor area and the distance between the two subsequent conductors as shown in (9), $$C_{y,z} = \frac{\varepsilon_0 \varepsilon_r S_{y,z}}{d} \tag{14}$$

where, $\varepsilon_0$ and $\varepsilon_r$ denote the permittivity of air and relative permittivity of the dielectric material respectively, $S_{y,z}$ is the overlapping area between turns y and z as observed in (14) and d denotes the spacing between the two conductors.

$$S_{y,z} = \int_0^{l_t} w_o dl \tag{15}$$

where, $w_o$ is the overlapping conductor width and $dl_t$ represents an infinitesimally small sectional length of a turn, which is integrated over the entire circumference to form a complete turn of length $l_t$.

Figure 11:
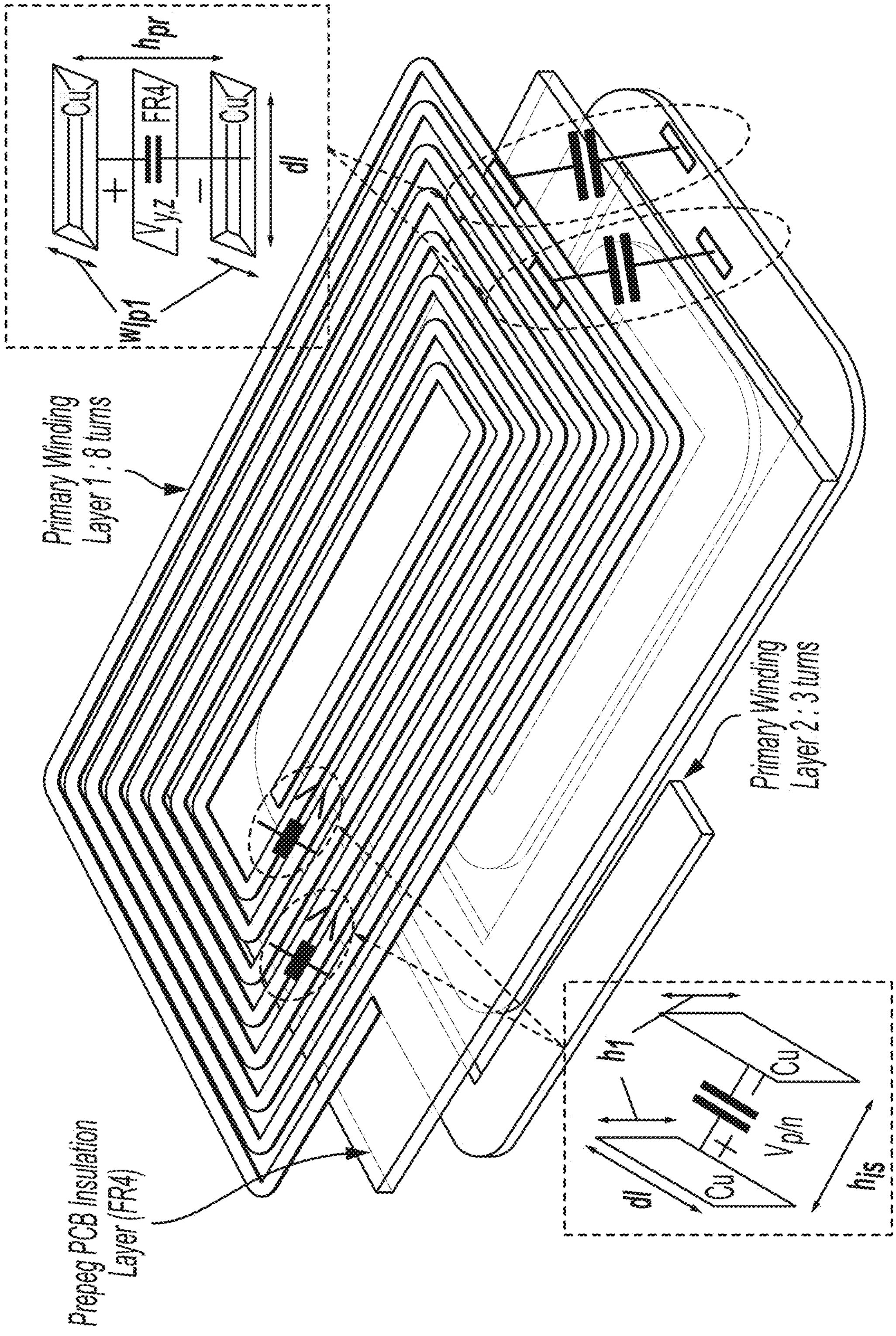
FIG. 11 shows an intra-windings capacitance model for {[8P-3P-3P-8P], [1S*-1S*-1S*-1S*]} winding configuration according to examples of the present teachings.

FIG. 11 shows intra-winding capacitance model for ({[8P-3P-3P-8P], [1S*-1S*-1S*-1S*]}) winding configuration according to examples of the present teachings. Referring to FIG. 10A-1, FIG. 10A-2, FIG. 10A-3, FIG. 10B-1, FIG. 10B-2, FIG. 10B-3, since the overlap area $$\left(\int_0^{l_t} h_1 dl\right)$$

between the two turns is very small with air (distance between the conductors: $h_{is}$) being the dielectric medium between them, the turn-to-turn capacitance is negligible and thus, its effect can be ignored. On the other hand, the capacitance between adjacent layers can be formulated by analyzing the total energy associated with the electric field between the two layers.

$$E_l = \sum_{l=1}^{l_n} \frac{1}{2}\left[C_{y,z} V_{y,z}^2\right]_{layer} \tag{16}$$

$$E_{l_t} = \sum_{l=1}^{l_n} E_l \tag{17}$$

where, $V_{y,z}$ is the potential difference between two conductor surfaces, and $E_l$ denotes the total energy in a layer l.

Thus, using (16-17), the effective inter or intra-winding capacitance can be formulated as:

$$C_{in} = \sum_{t=1}^{l_t(no.\ of\ layers)} \frac{2E_{l,t}}{V_{y,z}^2} \tag{18}$$

Referring to FIG. 5A, the intra-winding capacitance between first and second layer ($C_{Pin,1}$) is similar to that of between third and fourth layer ($C_{Pin,3}$) and can be formulated as:

$$C_{pin,1} = \frac{\varepsilon_o \varepsilon_r}{h_{pr}}\left[6w_{w_{l_p}1} + 2w_{l_{P^o},1} + 2w_{l_{P^o},2}\right]\int_0^{l} dl = C_{pin,3} \tag{19}$$

Similarly, the intra-winding capacitance between second and third layer of primary PCB is formulated as:

$$C_{pin,2} = \frac{\varepsilon_o \varepsilon_r}{h_c}\left[3w_{l_p2}\right]\int_0^{l} dl \tag{20}$$

All three capacitances are in parallel and thus can be added to formulate the overall primary intra-winding capacitance:

$$C_{Pin} = C_{p1} + C_{p2} + C_{p3} \tag{21}$$

Similarly, the intra-winding capacitance for the secondary winding can be
formulated as:

$$C_{sin,1} = C_{sin,3} = \frac{\varepsilon_o \varepsilon_r}{h_{pr}} w_{l_s} \int_0^{l} dl \tag{22}$$

$$C_{sin,2} = \frac{\varepsilon_o \varepsilon_r}{h_c} w_{l_s} \int_0^{l} dl \tag{23}$$

$$C_{sin} = C_{s1} + C_{s2} + C_{s3} \tag{24}$$

Following the same method, the inter winding capacitance between primary and
secondary board can be calculated as:

$$C_{PSin} = \frac{\varepsilon_o \varepsilon_r}{h_\Delta}\left[8w_{l_p1}\right]\int_0^{l} dl \tag{25}$$

A comprehensive comparison of the analytical formulation to determine the inter and intra winding capacitances for the four mentioned winding configurations referring to FIG. 5A, FIG. 5B, FIG. 5C, and FIG. 5D are presented in Table-III.

TABLE III

STRAY CAPACITANCE ANALYTICAL MODEL FOR WINDING CONFIGURATIONS UNDER STUDY

STRAY CAPACITANCE ANALYTICAL MODEL FOR N = 22:1 HFPT

| Winding Configuration | Primary Intra-winding Capacitance ($C_{P_{in}}$) | Secondary Intra-winding Capacitance ($C_{P_{in}}$) | Inter-winding Capacitance ($C_{PS_{in}}$) |
|---|---|---|---|
| {8P-3P-3P-8P}, {1S*-1S*-1S*-1S*} | $\left[\frac{2\varepsilon_o\varepsilon_r}{h_{pr}}\left[6w_{l_{P}1} + 2w_{l_{P^0,1}} + 2w_{l_{P^0,2}}\right] + \frac{\varepsilon_o\varepsilon_r}{h_c}\left[3w_{l_{P}2}\right]\right]\int_0^{l_t} dl$ | $\left[\frac{2\varepsilon_o\varepsilon_r}{h_{pr}} w_{l_s} + \frac{\varepsilon_o\varepsilon_r}{h_c} w_{l_s}\right]\int_0^{l_t} dl$ | $\frac{\varepsilon_o\varepsilon_r}{h_\Delta}\left[8w_{l_{P}1}\right]\int_0^{l_t} dl$ |
| {7P-4P-4P-4P}, {1S*-1S*-1S*-1S*} | $\left[\frac{2\varepsilon_o\varepsilon_r}{h_{pr}}\left[6w_{l_{P}1} + 2w_{l_{P^0,1}}\right] + \frac{\varepsilon_o\varepsilon_r}{h_c}\left[4w_{l_{P}2}\right]\right]\int_0^{l_t} dl$ | | $\frac{\varepsilon_o\varepsilon_r}{h_\Delta}\left[7w_{l_{P}1}\right]\int_0^{l_t} dl$ |
| {6P-5P-5P-6P}, {1S*-1S*-1S*-1S*} | $\left[\frac{2\varepsilon_o\varepsilon_r}{h_{pr}}\left[4w_{l_{P}1} + 2w_{l_{P^0,1}} + 2w_{l_{P^0,2}}\right] + \frac{\varepsilon_o\varepsilon_r}{h_c}\left[5w_{l_{P}2}\right]\right]\int_0^{l_t} dl$ | | $\frac{\varepsilon_o\varepsilon_r}{h_\Delta}\left[6w_{l_{P}1}\right]\int_0^{l_t} dl$ |
| Interleaved | $\frac{\varepsilon_o\varepsilon_r}{h_c}\left[4w_{l_{P}2}\right]\int_0^{l_t} dl$ | $\frac{2\varepsilon_o\varepsilon_r}{h_c}\left[w_{l_s}\right]\int_0^{l_t} dl$ | $\left[\frac{2\varepsilon_o\varepsilon_r}{h_{pr}}\left[4w_{l_{P}1}\right] + \frac{2\varepsilon_o\varepsilon_r}{h_{pr}}\left[4w_{l_{P}2}\right]\right]\int_0^{l_t} dl$ |

As observed in Table-III, the capacitances depend on the overlapping area of the windings, thickness of the insulation between the layers and the length of a conductor turn. Out of the above-mentioned factors, the overlapping area is dependent on the winding configuration and relevant works [10] have provided methods to reduce it by modifying the arrangement of turns. Further, the length of the conductor also depends on the core geometry, which solely depends on the application specifications.

Figure 12A:
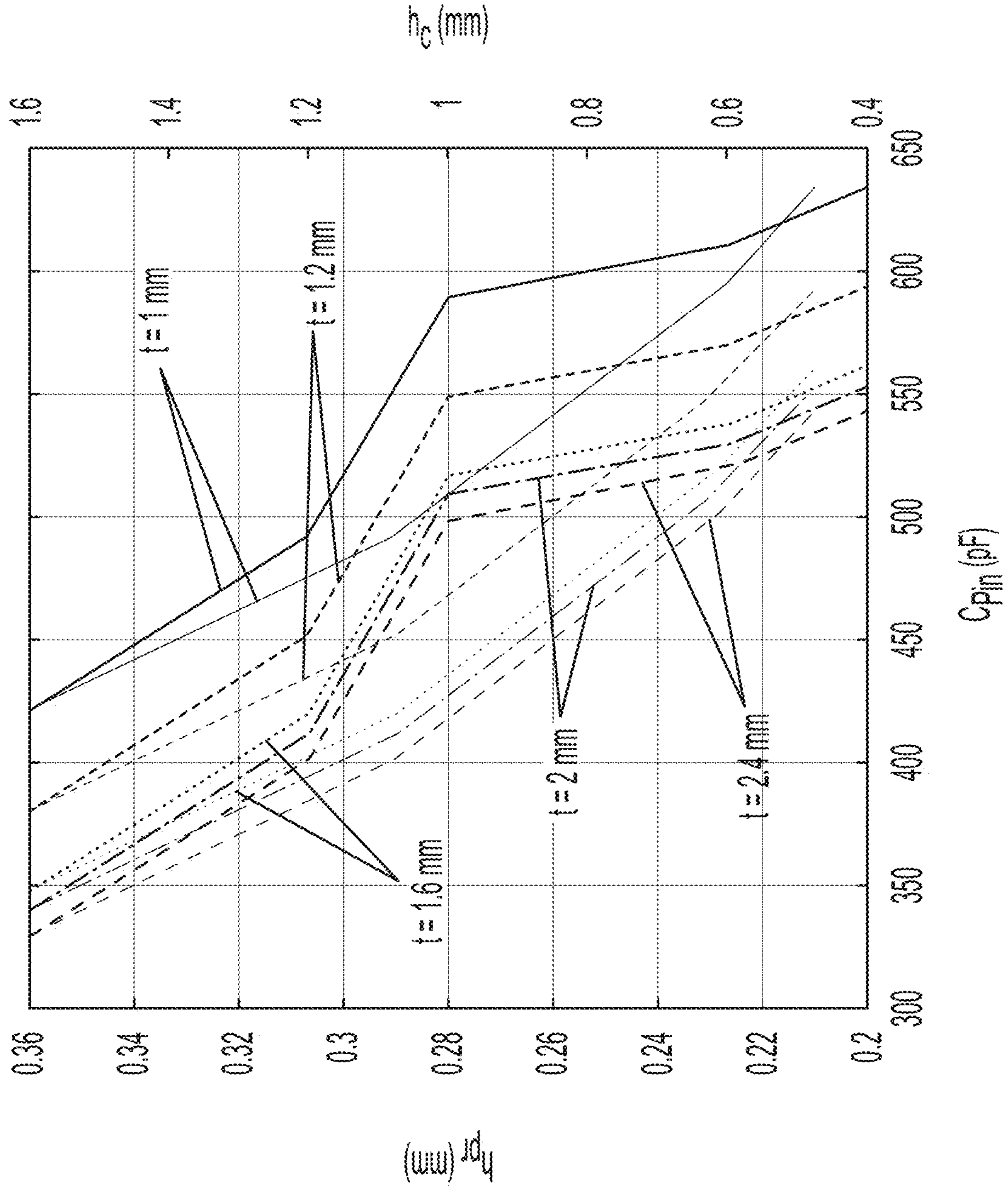
FIG. 12A and FIG. 12B show plots explaining the relation between (FIG. 12A) $C_{P_{in}}$ and (FIG. 12B) $C_{S_{in}}$ for different $h_{pr}$ and $h_c$ corresponding to different PCB thicknesses for {[8P-3P-3P-8P], [1S*-1S*-1S*-1S&]} winding configuration according to examples of the present teachings.
Figure 12B:
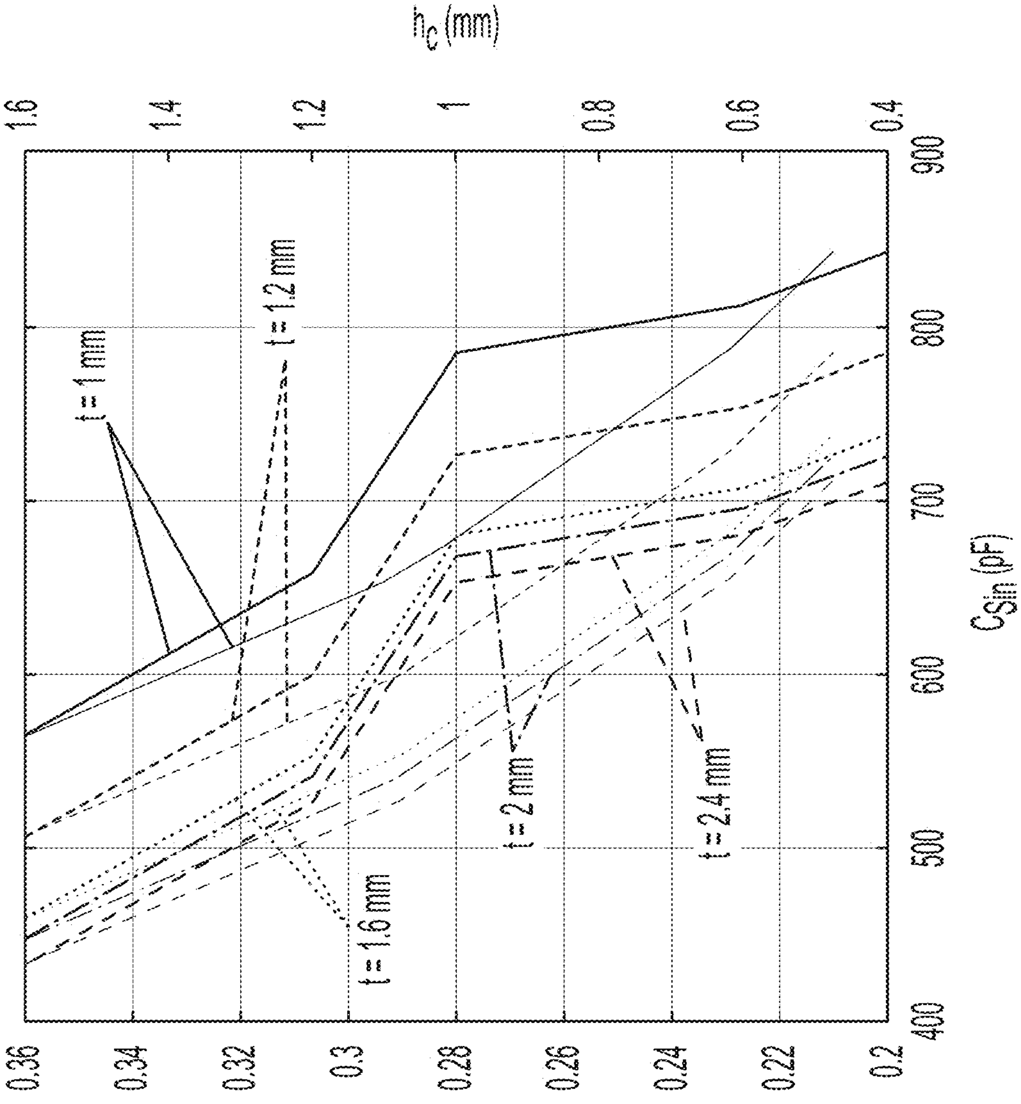
Figure 13:
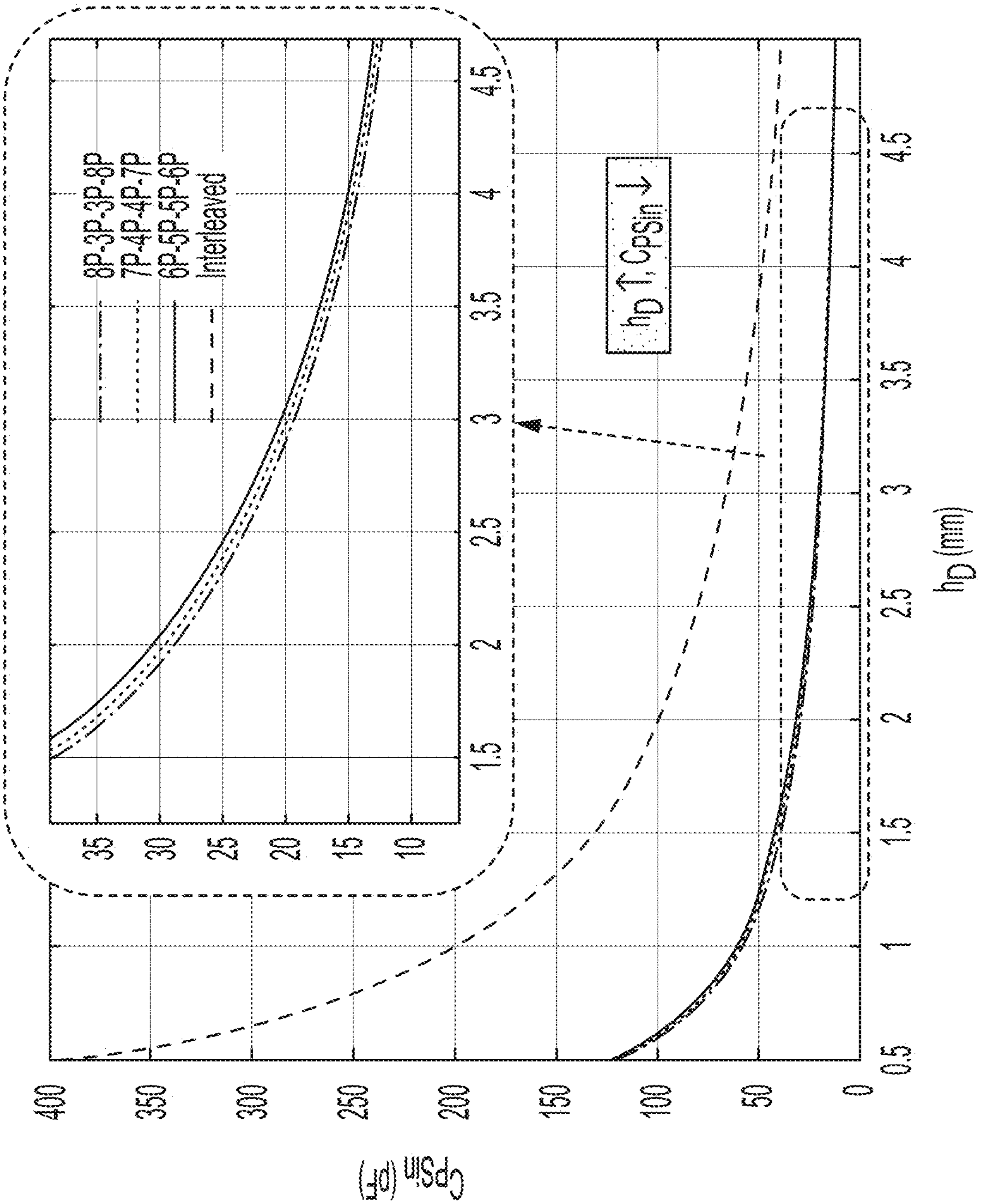
FIG. 13 shows plots explaining the relation between $C_{PS_{in}}$ and air gap $h_\Delta$ according to examples of the present teachings.

FIG. 12A and FIG. 12B show plots explaining the relation between (FIG. 12A) $C_{P_{in}}$ and (FIG. 12B) $C_{S_{in}}$ for different $h_{pr}$ and $h_c$ corresponding to different PCB thicknesses for {[8P-3P-3P-8P], [1S*-1S*-1S*-1S*]} winding configuration according to examples of the present teachings. To elucidate the dependency of the inter and intra-winding capacitances on the insulator layer thicknesses, FIG. 12A and FIG. 12B show the variation of intra-winding capacitances ($C_{Pin}$ and $C_{Sin}$) for {[8P-3P-3P-8P], [1S*-1S*-1S*-1S*]} configuration, fabricated using various PCB thicknesses (t) with respect to change in $h_{pr}$ and $h_C$, obtained through 3D FEA simulations. FIG. 13 shows plots explaining the relation between $C_{PS_{in}}$ and air gap $h_\Delta$ according to examples of the present teachings.

Further, FIG. 13 shows the variation of interwinding capacitance for with respect to change in $h_\Delta$ for all the winding configurations. As observed, as the airgap increases, the interwinding capacitance observes a steep descent, and the trend becomes more flatter for higher values of airgap, which matches the analytical formulations presented in this section.

IV. Selection of Optimal Winding Configuration

As presented in the previous sections, the resultant values of leakage inductance, and stray capacitances depend on the winding orientation and corresponding PCB fabrication-based specifications. However, it is important to understand the implication of each configuration on the performance of the CLLC converter and understand the specifics behind choosing the most optimal one for enhanced efficiency and gain modulation. In that context, factors like ZVS criteria, winding losses and its frequency dependency, resultant gain, and physical constraints play a major role, as described in this section.

With all the above-mentioned considerations, the optimal selection of fabrication parameters depends on the ZVS criteria and the application specific voltage gain requirement, Unlike a conventional CLLC converter model, where a lagging phase of primary current along with sufficient dead time intervals is sufficient to ensure ZVS, the inclusion of non-idealistic components in the CLLC converter model requires detailed investigation for understanding the conditions for achieving ZVS. Here, the drain-to-source capacitance of the MOSFET ($C_{oss}$) necessitates constraints in the form of minimum equivalent impedance required to facilitate ZVS commutation. In that context, an equivalent model is developed to comprehensively analyze the TVS constraints for different conditions for each switch of the primary bridge as shown in FIG. 14.

Figure 14:
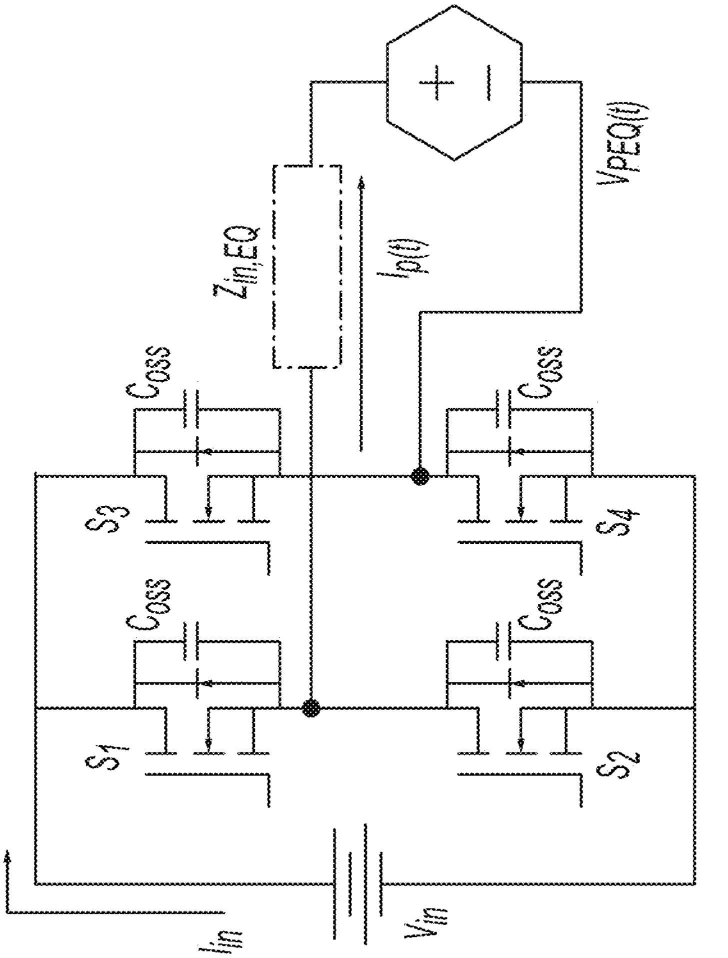
FIG. 14 shows an equivalent circuit for ZVS investigation according to examples of the present teachings.
Figure 15:
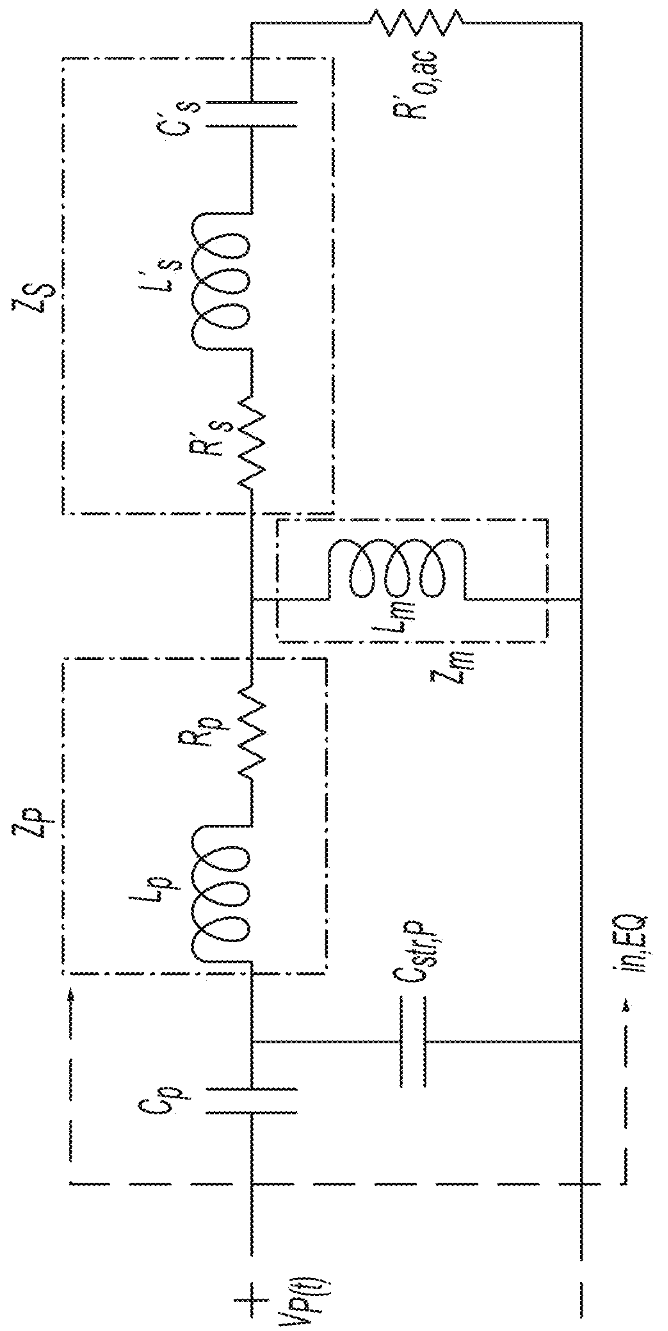
FIG. 15 shows an equivalent circuit with reconfigured stray capacitors according to examples of the present teachings.

As observed in FIG. 14, $Z_{in,EQ}$ represents the equivalent input impedance of the CLLC converter whereas $V_{PEQ}(t)$ represents the equivalent voltage source, both referred to the primary side. The equivalent topological structure of the CLLC converter with the inclusion of parasitics is shown in FIG. 15 obtained by reconfiguring the stray capacitance as a single lumped capacitance referred to the primary side [11,20]. The equivalent value of $C_{str,P}$ can be formulated as follows:

$$C_{str,P} = C_{pstr} + C_{sstr} = C_{p,in} + (1-n)C_{ps,in} + n^2 C_{s,in} - n(n-1)C_{ps,in} \tag{26}$$

Utilizing the equivalent circuit shown in FIG. 15, the analytical formulation of $Z_{in,EQ}$ (eq. (27)) is shown below.

$$dZ_{\text{in},EQ} = \frac{\left\{(1-f^2-f^2k_2)(1-f^2C-f^2) + f^2k_1(1+C)\left(\frac{f^2}{\omega}-1\right) - \frac{f^4}{m_2}(1+C)\left(\frac{1}{m_1}+\frac{1}{\omega}\right)\right\} + j\left\{f^2(1-f^2)\frac{(1+n_1)}{\omega m_1} - f^4k_2\frac{(1+n_1)}{\omega m_3} - \frac{f^2}{\omega m_2}\right\}}{\left\{\frac{f^6 n_1}{\omega^2 L_p}\left(\frac{1}{m_1}+\frac{k_2}{m_3}\right) - \frac{f^4}{\omega^2 L_p}\left(\frac{n_1}{m_1}+\frac{1}{m_2}\right)\right\} - j\left\{\frac{f^6 n_1}{\omega m_2 L_p}\left(\frac{1}{m_1}+\frac{1}{\omega}\right) - \frac{f^4}{L_p}\left(1-\frac{n_1k_1}{\omega}\right) - \frac{f^2}{\omega L_p}(1-f^2+f^2k_2)(1-f^2n_1)\right\}} \tag{27}$$

where, $$f = \frac{\omega}{\omega_r},$$

$$\omega_r = \frac{1}{\sqrt{L_pC_p}} = \frac{1}{\sqrt{L_sC_s}},$$

$$k_1 = \frac{L_m}{L_p},$$

$$k_2 = \frac{L_m}{L_s'},$$

$$m_1 = \frac{L_p}{R_p},$$

$$m_2 = \frac{L_s'}{R_{seq}},$$

$$m_3 = \frac{L_p}{R_T},$$

$$n_1 = \frac{C_{str,P}}{C_p},$$

$$R_{seq} = R_{o,ac}' + R_s',$$

$$R_T = R_p + R_{seq}.$$

Further, following the derived equivalent circuit, the equivalent voltage $V_{PEQ}(t)$ can be derived as follows:

$$V_{PEQ}(t) = V_s(t)\left[\frac{Z_m(Z_{C_{str,p}} + Z_{C_p})}{(Z_p + Z_{C_{str,p}})(Z_m + Z_s)}\right] \tag{28}$$

Referring to the equivalent circuit shown in FIG. 14, two commutation cases can be studied to examine the constraint for the value of $L_p$ required to achieve ZVS as follows:

(a) When switch $S_2$ and $S_3$ turn on ($I_P(t)>0$); as shown in FIG. 16A.

(b) When switch $S_1$ and $S_4$ turn on ($I_P(t)<0$); as shown in FIG. 16B.

As the equivalent port voltage follows half wave symmetry, the condition $V_{PEQ}(t)=-V_{PEQ}(\pi+t)$ is implied. Thus, the analysis for both the cases proves to be similar for formulating the necessary constraint for ZVS. Focusing on the formulation for case (a) (for $S_2$ and $S_3$), the energy sunk by the sources can be formulated as follows:

$$E_{sunk} = \int_0^{\tau d} (V_{PEQ} I_P(\zeta) - V_{in} i_{in}(\zeta))dt = \int_0^{\tau d} \left(V_{PEQ}\left(-2C_{OSS}\frac{dV_{in}}{dt}\right)\right)dt = 2C_{OSS}V_{in}V_{PEQ}(\zeta) \tag{29}$$

where, $\tau_d$ is the dead time provided to the switches. Further, the total energy in the switch remains constant during the commutation interval, which helps formulate the necessary constraint for ZVS for this case, as follows:

$$E_{sourced} \geq E_{sunk} = \frac{1}{2}|Z_{in,EQ}|I_p^2(\zeta) \geq 2C_{OSS}V_{in}V_{PEQ}(\zeta) \tag{30}$$

Thus, using (30), the minimum impedance for $V_{PEQ}(\zeta)>0$ can be analyzed as:

$$|Z_{in,EQ}| \geq \left|\frac{4C_{OSS}V_{in}V_{PEQ}(\zeta)}{I_p^2(\zeta)}\right| \tag{31}$$

where, $\zeta$ is the turn on instant of switch $S_2$ and $S_3$.

Solving the constraint in MATLAB for finding the constraints for $L_P$ with respect to the magnitude of $Z_{in,EQ}$ for known values of other resonant tank parameters yields the minimum requirement of $L_P$ for different winding configurations. To provide an instance of this evaluation, Table IV shows the formulated values of minimum $L_p$ required to ensure ZVS for all non-interleaved winding configurations at 1 kW rated load.

TABLE IV

MINIMUM VALUE OF PRIMARY LEAKAGE INDUCTANCE REQUIRED TO ENSURE ZVS
MINIMUM VALUE OF PRIMARY LEAKAGE INDUCTANCE REQUIRED TO ENSURE ZVS

| No. | Winding Configuration | Minimum $L_P$ required |
|---|---|---|
| 1 | (8P-3P-3P-8P}, {1S*-1S*-1S*-1S*} | 22.15 μH |
| 2 | {7P-4P-4P-7P}, {1S*-1S*-1S*-1S*} | 11.08 μH |
| 3 | {6P-5P-5P-6P}, {1S*-1S*-1S*-1S*} | 9.72 μH |

Further, to adhere to cost-effectiveness for fabrication and power density constraints, the conductor thickness is selected to be 2 oz, copper ($h_1$=70 μm), adhering to the current carrying capability according to IPC 2221 and correspondingly the air gap between the cores is selected to be 1.9 mm to obtain the required magnetizing inductance ($L_m$). Adhering to the supplementary ZVS criteria [17-19] of $L_m$ with respect to the dead band time duration, and maximum switching frequency for achieving the desired gain, the maximum value of $L_m$ is formulated to be 76.26 μH.

Figure 18B:
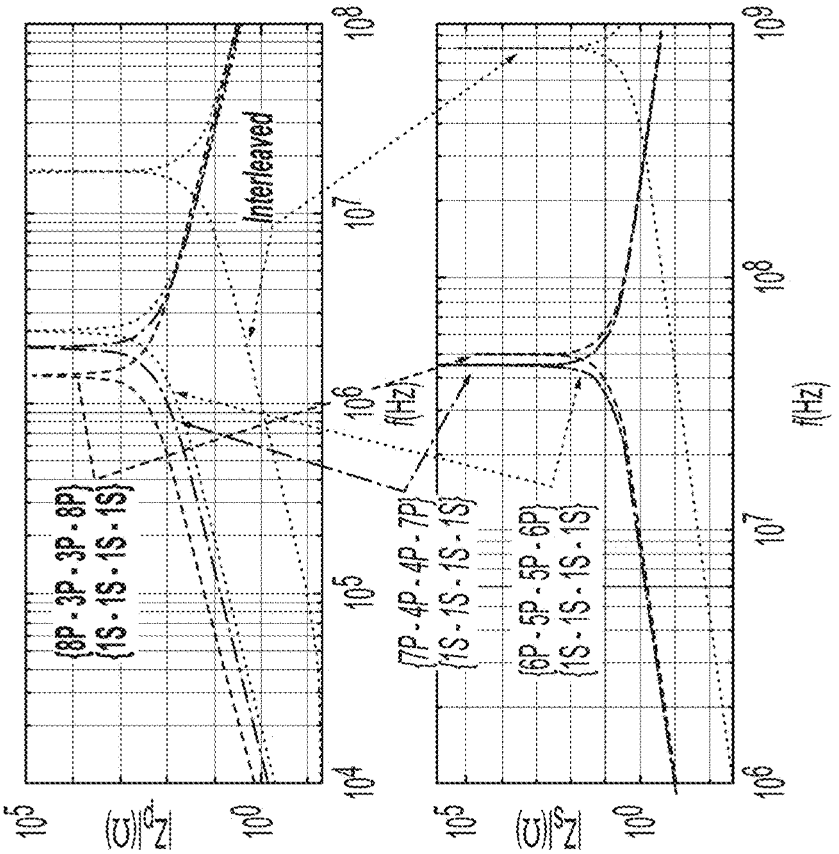
FIG. 18A and FIG. 18B show gain plots for all winding configuration in FIG. 18A and plot of equivalent primary and secondary impedance versus operational frequency in FIG. 18B according to examples of the present teachings.
Figure 18A:
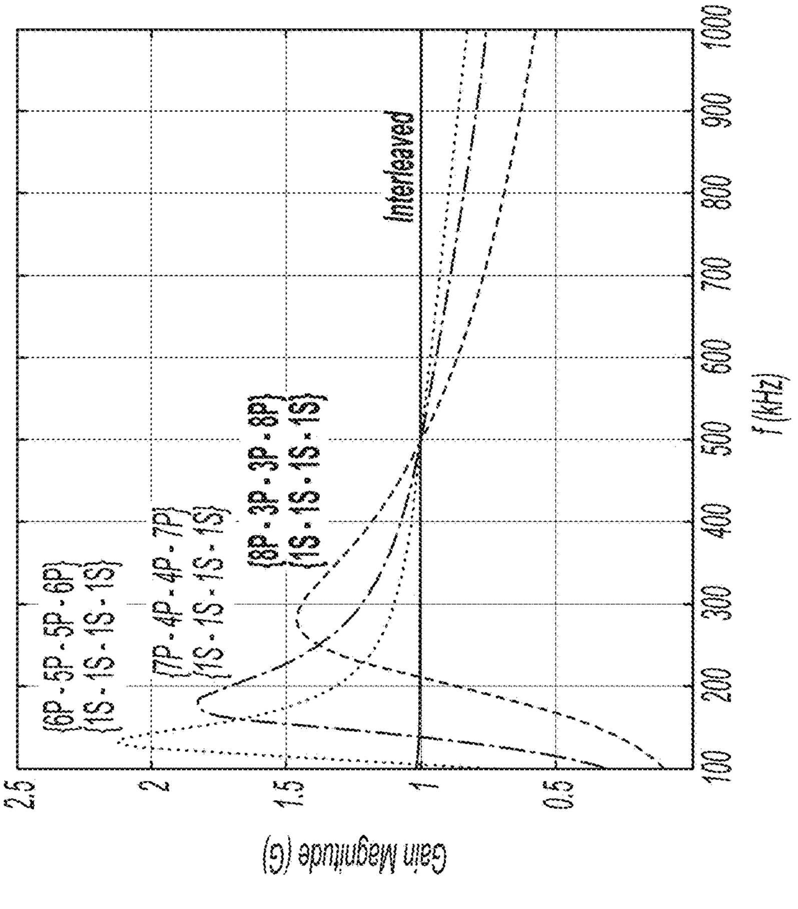

FIG. 18A shows gain plots for all winding configurations and FIG. 18B shows plots of equivalent primary and secondary impedance versus operational frequency according to examples of the present teachings. With the mentioned design criteria, the GHA [5] based gain curves achieved for all four winding configurations are shown in FIG. 18A. To adhere to the gain requirements, the relative variation of gain with frequency should follow:

$$\left[\frac{dG}{df}\right]_{min} \leq \frac{dG}{df} \leq \left[\frac{dG}{df}\right]_{max}.$$

The factor $$\left[\frac{dG}{df}\right]_{min}$$

is decided based on the gain range requirement, which depends on the Q factor selection for CLLC converter and its trade-offs. Lower $$\left[\frac{dG}{df}\right]_{min}$$

will lead to an operating range with higher switching frequencies, thus resulting in higher switching losses. On the other hand, higher $$\left[\frac{dG}{df}\right]_{max}$$

will lead to steeper gain curve, which might not be realizable by the frequency resolution (or least count) of the controller (TMS320F28379D) used for this application. To validate the accuracy and applicability of the analytical model, the resultant impedances for the primary ($Z_P$) and secondary ($Z_S$) side corresponding to all four fabricated windings structures are compared in FIG. 18B.

Further, a detailed comparison of the resultant parameters obtained by simulation models and developed windings measured experimentally are shown in Table V. For measuring the R-L-C parameters, GWINSTEK LCR8101G impedance analyzer is employed that has a frequency sweep range of 20 Hz to 1 MHz with a measurement accuracy of 0.1% and a resolution of 6 digital measurement units. The procedure follows several iterations of a standard open circuit/short circuit test implemented at the terminals of the HFPT, as shown below:

TABLE V

COMPARISON OF ANALYTICAL, SIMULATION AND EXPERIMENTAL RESULTS FOR DIFFERENT WINDING CONFIGURATIONS

| Winding | Primary Leakage Inductance (μH) $L_P$ | | | Secondary Leakage Inductance (nH) $L_S$ | | | Effective Primary Winding Resistance (mΩ) $R_P$ | | | Effective Secondary Winding Resistance (mΩ) $R_S$ | |
|---|---|---|---|---|---|---|---|---|---|---|---|
| Configuration | Anly. | Sim. | Exp. | Anly. | Sim. | Exp. | Anly. | Sim. | Exp. | Anly. | Sim. |
| {8P-3P-3P-8P}, {1S*-1S*-1S*-1S*} | 25.887 | 24.142 | 25.845 | 17.63 | 19.58 | 14.55 | 102.683 | 91.776 | 121.866 | 0.819 | 0.814 |
| {7P-4P-4P-7P}, {1S*-1S*-1S*-1S*} | 12.113 | 11.794 | 11.828 | 17.63 | 19.94 | 18.32 | 82.59 | 87.254 | 92.735 | 0.819 | 0.843 |
| {6P-5P-5P-6P}, {1S*-1S*-1S*-1S*) | 8.524 | 7.961 | 7.825 | 17.63 | 19.11 | 17.62 | 72.634 | 82.534 | 93.216 | 0.819 | 0.827 |
| Interleaved {7P-1S*-1S*-4P-4P-1S*-1S*-7P} | 0.109 | 0.157 | 0.211 | 0.239 | 0.218 | 0.324 | 46.438 | 49.583 | 44.356 | 0.312 | 0.227 |

| Winding | Effective Secondary Winding Resistance (mΩ) $R_S$ | Primary Intra-winding Capacitance (nF) $C_{Pin}$ | | | Secondary Intra-winding Capacitance (nF) $C_{Sin}$ | | | Inter-winding Capacitance (pF) $C_{PSin}$ | | |
|---|---|---|---|---|---|---|---|---|---|---|
| Configuration | Exp. | Anly. | Sim. | Exp. | Anly. | Sim. | Exp. | Anly. | Sim. | Exp. |
| {8P-3P-3P-8P}, {1S*-1S*-1S*-1S*} | 1.144 | 0.509 | 0.582 | 0.526 | 0.668 | 0.701 | 0.712 | 23.102 | 23.985 | 25.195 |
| {7P-4P-4P-7P}, {1S*-1S*-1S*-1S*} | 1.022 | 0.555 | 0.618 | 0.558 | 0.668 | 0.673 | 0.702 | 23.747 | 24.553 | 25.577 |
| {6P-5P-5P-6P}, {1S*-1S*-1S*-1S*) | 0.981 | 0.552 | 0.592 | 0.561 | 0.668 | 0.686 | 0.698 | 24.527 | 25.553 | 26.731 |
| Interleaved {7P-1S*-1S*-4P-4P-1S*-1S*-7P} | 0.236 | 0.544 | 0.591 | 0.561 | 0.117 | 0.121 | 0.121 | 790.081 | 791.252 | 812.252 |

Figure 19A:
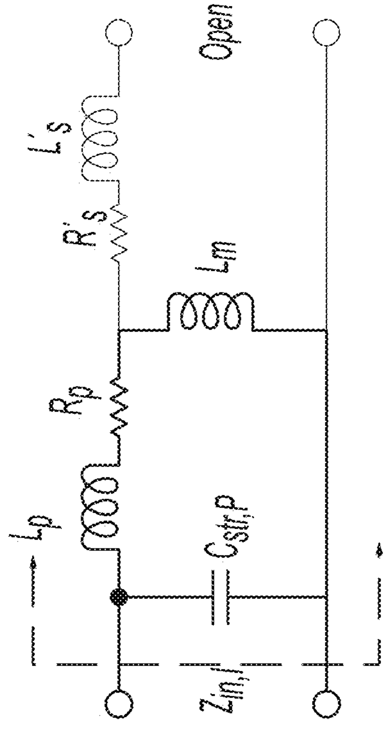
FIG. 19A, FIG. 19B, and FIG. 19C show open circuit/short circuit tests on HFPT to experimentally measure the R-L-C parameters in FIG. 19A, open circuit test with primary probing in FIG. 19B, and short circuit test with primary probing in FIG. 19C according to examples of the present teachings.

(a) Open circuit test with primary probing: The HFPT equivalent circuit for open circuit test by probing the primary winding, while keeping the secondary side open is shown in FIG. 19(A) Please note, $C_{str,P}$ represents the lumped intra- and inter-winding capacitance referred to the primary side (as seen in (26)). Selecting the resistance mode measurement, for an excitation frequency of 500 kHz (matching the resonant frequency), the value of $R_p$ is obtained. Next, changing the mode to inductance mode calculation, the lumped value, of inductance at the primary side is obtained as follows:

$$L_{eq,P} = L_P + L_m \tag{32}$$

Further, selecting the impedance measurement mode, the magnitude of $Z_{in,I}$ is measured, the analytical equivalent magnitude of which is formulated as follows:

$$|Z_{in,I}| = mag\left(\frac{R_p + j\omega\{L_{eq,P} - \omega^2 C_{str,P} L_{eq,P}^2 - C_{str,P} R_p^2\}}{1 - \omega^2(2C_{str,P} L_{eq,P} - C_{str,P}^2 R_p^2) + \omega^4 C_{str,P}^2 L_{eq,P}^2}\right) \tag{33}$$

Figure 19B:
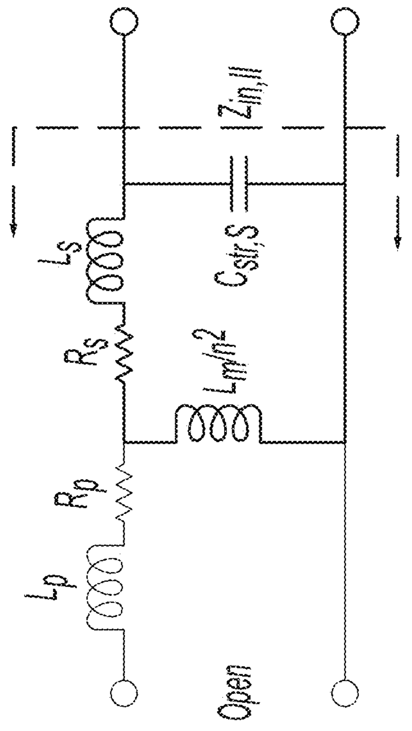

(b) Open circuit test with secondary probing. Similar procedure of measurement is implemented referred to the secondary side, by keeping the primary side winding open (as seen in FIG. 19(B)). With an excitation frequency of 500 kHz, the value of $R_S$ is obtained With the resistance mode measurement. The inductance mode measurement provides the value of lumped inductance referred to the secondary side as follows:

$$L_{eq,S} = L_S + \frac{L_m}{n^2} \tag{34}$$

Following the same procedure of impedance measurement, the magnitude of $Z_{in,II}$ is measured and recorded.

$$|Z_{in,II}| = mag\left(\frac{R_s + j\omega\{L_{eq,S} - \omega^2 C_{str,S} L_{eq,S}^2 - C_{str,S} R_s^2\}}{1 - \omega^2(2C_{str,S} L_{eq,S} - C_{str,S}^2 R_s^2) + \omega^4 C_{str,S}^2 L_{eq,S}^2}\right) \tag{35}$$

where, $$C_{str,S} = \frac{C_{str,P}}{n^2}$$

is the lumped stray capacitance referred to the secondary side.

(c) Short circuit test with primary probing: In this step, the secondary side winding terminals are shorted, resulting in the equivalent circuit shown in FIG. 19 (C). In this case, with the inductance mode measurement, the lumped inductance obtained is formulated as:

$$L_{eq,SC} = L_P + (L_m \| n^2 L_S)) \tag{36}$$

Further, the impedance measured at the primary winding terminal has a magnitude of $Z_{in,III}$ formulated in (37), shown in the bottom of the page, $C_{str,SC}$ represents the lumped stray capacitance excluding the value of $C_{s_{in}}(=C_{P_{in}}+(1-n^2)C_{PS_{in}})$.

$$Z_{in,III} = mag\left(\frac{R_pR_s' - \omega^2(L_pL_{eq,S} + L_mL_S') + j\omega\{L_mR_s' + L_{eq,S}R_p + L_pR_s'\}}{(R_s' + j\omega L_{eq,S})\big(R_s - \omega^2 C_{str,SC}(L_mR_s' + L_{eq,S}R_p + L_pR_s') + j\omega\{C_{str,SC}(R_pR_s' - \omega^2(L_pL_{eq,S} + L_mL_s')) + L_{eq,S}\}\big)}\right) \quad (37)$$

Once the measurements are recorded, (32), (34) and (36) are solved as simultaneous set of equations in MATLAB using vpasolve, to obtain the values of $L_p$, $L_S$ and $L_m$. Further, substituting the obtained value of inductances and winding resistances in (33), (35), and (37), the set of equations are solved in MATLAB to obtain the values of $C_{str,P}$, $C_{str,S}$ and $C_{str,SC}$. Finally, using the values of stray capacitances obtained, the experimental values of $C_{p_{in}}$, $C_{s_{in}}$ and $C_{ps_{in}}$ are obtained by solving for three equations with three variables using vpasolve. To further validate the accuracy of the obtained parameters, the excitation frequencies are varied, and the same set of steps are repeated, thus establishing the repeatability (with a mismatch threshold of 5%) of the experimental procedure to obtain the R-L-C parameters of HFPT. As observed in Table V, the PEA simulation and experimental results match the analytically calculated values with an average mismatch of 6.2% and 5.5% respectively, thus validating the model developed and analyses. Further, the experimentally measured values of winding resistance show a larger mismatch with the analytically calculated values due to the inconsistency introduced by the assumptions employed in Dowell's equation. As suggested in [12], there are several assumptions pertaining to the Dowell's equation that are ignored for reduced analytical complexity. These factors include the porosity factor (included when the conductor width is comparable to its thickness leading to proximity effect in horizontal direction), distance considerations between multiple conductors turns in a single layer, distance of conductor surface from the core, and sinusoidal excitation provided to the windings. Thus, to accurately characterize the winding resistance and to observe the losses due to skin and proximity effects, the 3D FEA simulation proves to be more reliable as presented in this work. However, it is important to highlight the accuracy of the analytical calculations to obtain the values of leakage inductances and stray capacitance, as seen in Table V. The accuracy obtained thereof essentially helps reduce the number of time and memory intensive iterations of PEA simulations for characterizing $L_p$, $L_s$, $C_{p_{in}}$, $C_{s_{in}}$ and $C_{ps_{in}}$ for different winding configurations.

Figure 20:
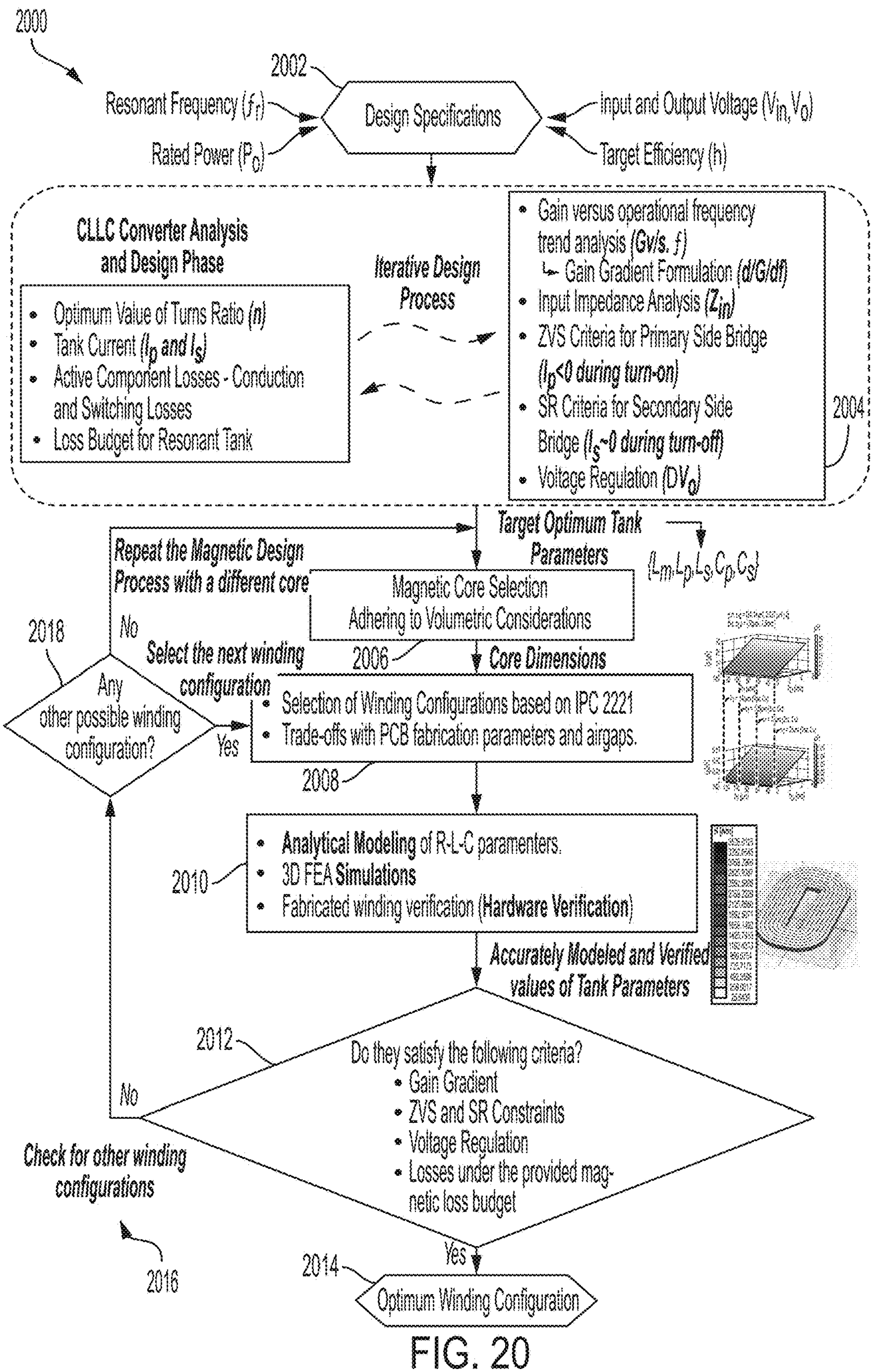
FIG. 20 shows a flowchart depicting the process to obtain the most optimum winding configuration according to examples of the present teachings.

Corelating the constraints for the optimum winding selection, FIG. 20 elucidates a detailed flowchart depicting the iterative process of finding the most optimum winding configuration. As observed, based on the design specifications, the converter analysis and design phase include an iterative process of finding the optimum values of tank parameters based on factors like resultant gain dependencies, loss budget for resonant tank by enabling ZVS and SR, input impedance function and corresponding tank currents, etc.

As shown in FIG. 20, the iterative process 2000 begins by defining the design specification, which include the desired resonant frequency ($f_r$), the desired rated power ($P_o$), the desired input and output voltage ($V_{in}$, $V_o$), and the desired target efficiency (η) at 2002. The design specifications are iteratively modified in a CLLC converter analysis and design phase, where various parameters, including optimum value of turns ratio (n), tank current ($I_p$ and $I_s$), active component losses (conduction and switching losses), and loss budget for resonant tank, are adjusted and various features, including gain versus operational frequency trend analysis (G vs f), gain gradient formulation (dG/df), input impedance analysis ($Z_{in}$), ZVS criteria for primary side bridge ($I_p$<0 during turn-on, SR criteria for secondary side bridge ($I_s$~0 during turn-off, and voltage regulation ($\Delta V_0$), are determined, at 2004. From the iteratively modified specification parameters, the target optimum tank parameters {$L_m$, $L_p$, $L_s$, $C_p$, $C_s$} and the magnetic core selection are determined while adhering to volumetric considerations at 2006. From the core dimensions, the selection of winding configuration based on IPC 2221 are determined with trade-offs with PCB fabrication parameters and airgaps at 2008. From the winding selection, the R-L-C parameters are analytically modeled, 3D FEA simulations are performed, and the fabricated windings are verified in a hardware verification process at 2010. From the modeling, simulations, and verification, determinations are made to determine if the tank parameters satisfy desired criteria, including grain gradient, ZVS and SR constraints, voltage regulation, and losses under the provided magnetics loss budget at 2012. If the desired criteria are satisfied, then the optimum winding configuration is determined at 2014. If not, other winding configuration are tested where the magnetic design process with a different core is repeated at 2016. If there are other possible winding configurations, then the magnetic design process progresses back to 2018.

Following the design phase, as per the target tank parameters, a compatible magnetic core is selected, adhering to the requirements pertaining to rated power and the required magnetizing inductance ($L_m$).

The core selection follows a volumetric minimization based comparative analysis, where the following considerations pertaining to the gain-frequency trend, soft-switching criteria and dimensional constraints of the core are imposed for the design specifications mentioned in Table VII:

(a) The turns ratio needs to be n=22:1, adhering to the near unity gain requirement at maximum operating voltages (for 600V-28V conversion). Corresponding to the current carrying capacity of a 2 oz. copper trace for a 4-layer PCB, the window width should be at least 20 mm with $N_{e,max}$=8 and $N_{i,max}$=5.

(b) Corresponding to the gain trend and ZVS requirements, the magnetizing inductance is calculated to be less than 76.26 μH. The airgap between the cores should be <2.5 mm to prevent excessive leakage of flux from the cores.

(c) The $B_{max}$ obtained corresponding to the turns ratio (n), area of the core ($A_e$), and excitation voltage should be less than the saturation flux density ($B_{sat}$ value) of the core.

With the above-mentioned considerations, Table VI compares five different planar cores [18] and analyzes the dimensions of the core, the airgap requirement to obtain the required $L_m$, with n=22:1, corresponding $B_{max}$ values and the core losses.

TABLE VI

COMPARISON OF PLANAR CORES FOR VOLUMETRIC MINIMIZATION

| Relevant Ferrite Magnetic Planar Cores | Window Width ($b_t$) | Area of the core ($A_e$) | Volume of the core ($V_e$) | Air gap ($h_g$) for $L_m$ = 76 μH and n = 22:1 | $B_{max}$ for excitation voltage = 400 V, and n = 22:1 | Analytically calculated core loss [19] |
|---|---|---|---|---|---|---|
| FR43808EC | 11.43 mm | 194 $mm^2$ | 10200 $mm^3$ | 1.5 mm | 46.8 mT | 5.287 W |
| FR44310EC | 13.2 mm | 229 $mm^2$ | 13900 $mm^3$ | 1.8 mm | 39.6 mT | 5.876 W |
| FR45810EC | 21.4 mm | 310 $mm^2$ | 24600 $mm^3$ | 1.9 mm | 29.5 mT | 5.221 W |
| FR46410EC | 21.8 mm | 516 $mm^2$ | 41400 $mm^3$ | 4.1 mm | 17.6 mT | 6.242 W |
| 0R49928EC | 36 mm | 540 $mm^2$ | 79800 $mm^3$ | 4.25 mm | 16.8 mT | 8.385 W |

As observed in Table VI, the selected core FR45810EC proves to be the most ideal selection, adhering to the requirements corresponding to the window width and airgap to achieve the required $L_m$ with n=22:1, Further, the selected core also provides an optimal tradeoff corresponding to the dimensions (the area and volume) of the core with respect to the $B_{max}$ obtained thereof, resulting in the least amount of analytically calculated core losses. Please note that, the comparison shown above is only targeted for the converter specifications for the presented work. However, as FIG. 15 provides a generic flowchart for optimum HFPT design, the magnetic core selection is also included in the iterative design process.

Further, as observed in (1)-(8), based on the core selection and the available window area, different winding configurations are formulated along with their trade-offs pertaining to the airgaps and PCB fabrication parameters. This process is followed by analytical modeling, FEA simulations and hardware verification to accurately characterize the obtained tank parameters. The optimal winding selection process is successful if the obtained tank parameters satisfy the constraints pertaining to gain gradients, soft-switching, and core losses. In addition to that, ideally for obtaining minimized winding losses, interleaved winding configurations proves to be the most feasible option. However, it is worthwhile to point out at the limitation of implementing an interleaved structure in a leakage integrated design of HFPT. As observed in the analytical calculations in Table II, with verified resultant parameters shown in Table V and corresponding gain graphs in FIG. 18A and FIG. 18B, although the interleaved winding structure provides reduced effective winding resistance, due to negligible value of leakage inductances obtained thereof, the required gain is not achieved as required by the application. Thus, an additional inductor is required to meet the requirements of voltage gain and ZVS soft switching, which degrades the power density of the developed converter. This necessitates the criteria of checking the winding losses and ensuring them to be under the defined magnetic loss budget as seen in FIG. 20.

If none of the possible winding structures satisfy the performance constraints, then the same process of R-L-C modeling is carried out for all possible winding configurations with different compatible magnetic cores. This iterative process facilitates the most optimum HFPT design for a given set of design specification pertaining to a selected converter topology.

V. Experimental Verification and Benchmarking

Following the trade-offs based optimal selection presented in the previous section, an experimental set up is built to test and verify the transformer characteristics and to analyze the performance of the CLLC converter with the selected transformer winding configuration. By following the design considerations pertaining to the gain requirement, ZVS criteria and frequency of operation, Table-V shows the design specifications for the developed CLLC converter.

Figure 21:
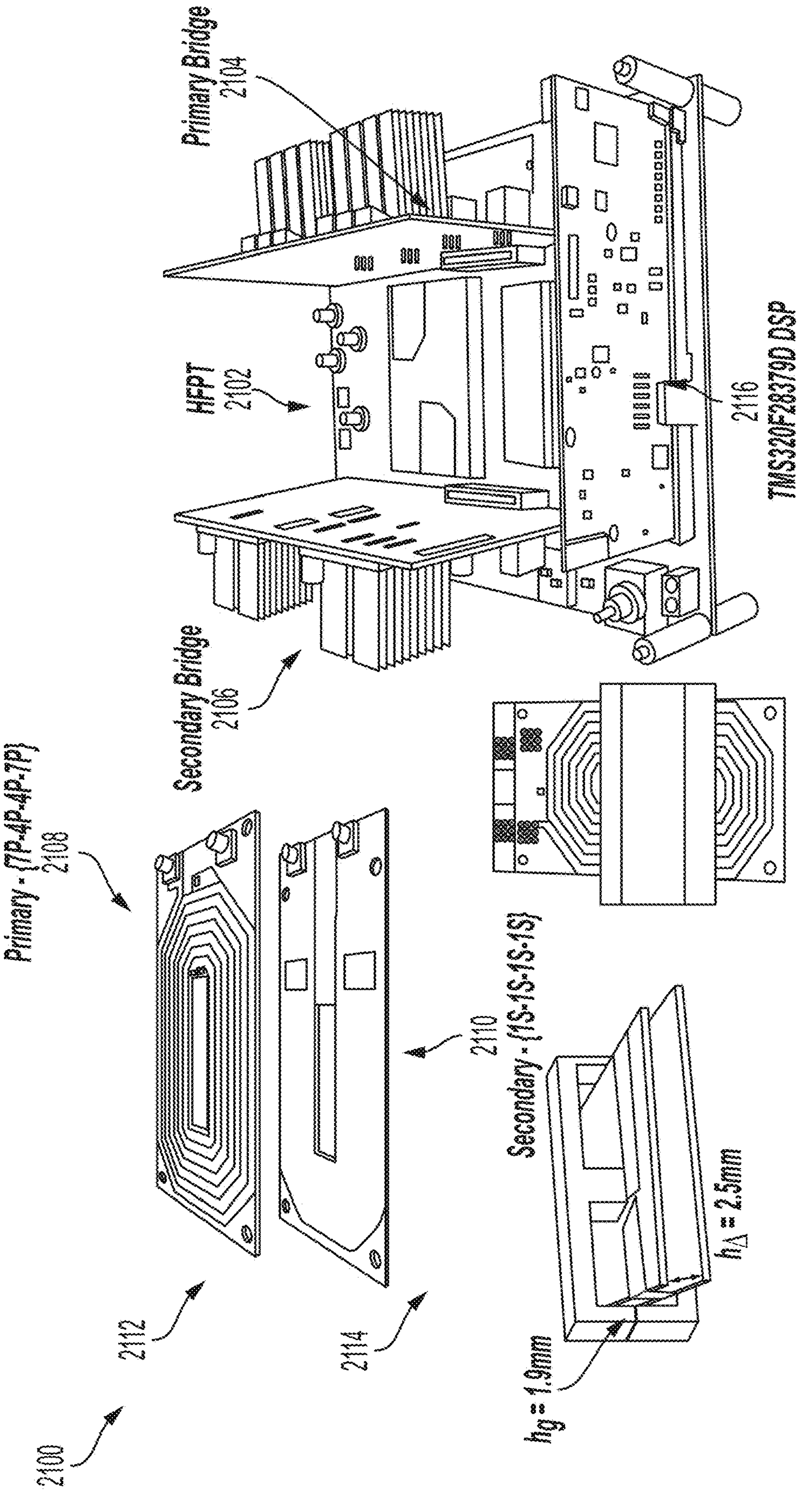
FIG. 21 shows a setup for a CLLC converter according to examples of the present teachings.
Figure 22A:
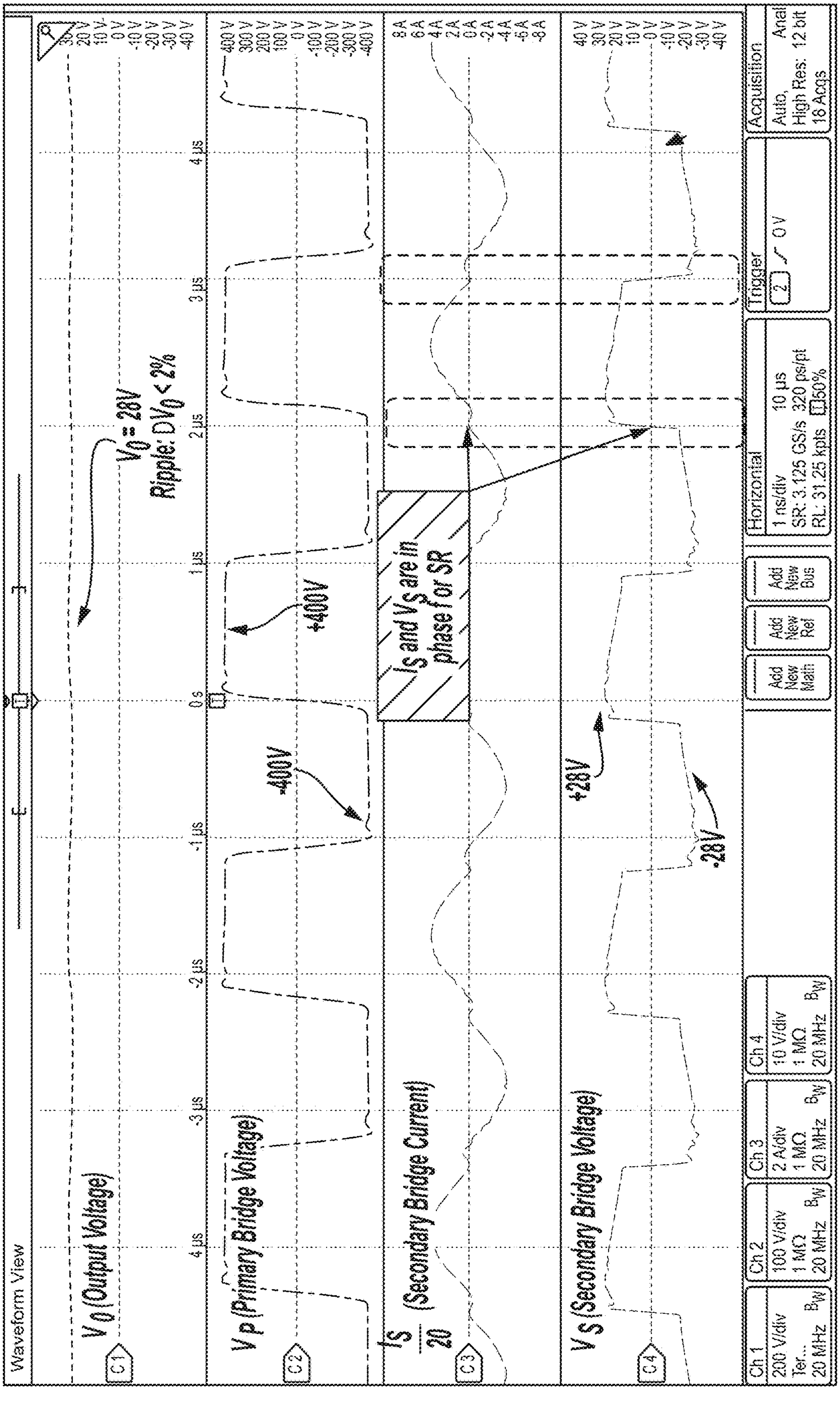
FIG. 22A and FIG. 22B show waveforms for $V_0$, $V_p$, $I_s$, and $V_s$|[Y-axis: $V_0$-10V/div $V_p$-100V/div, $$\frac{I_s}{20} - 2A/div,$$
Figure 22B:
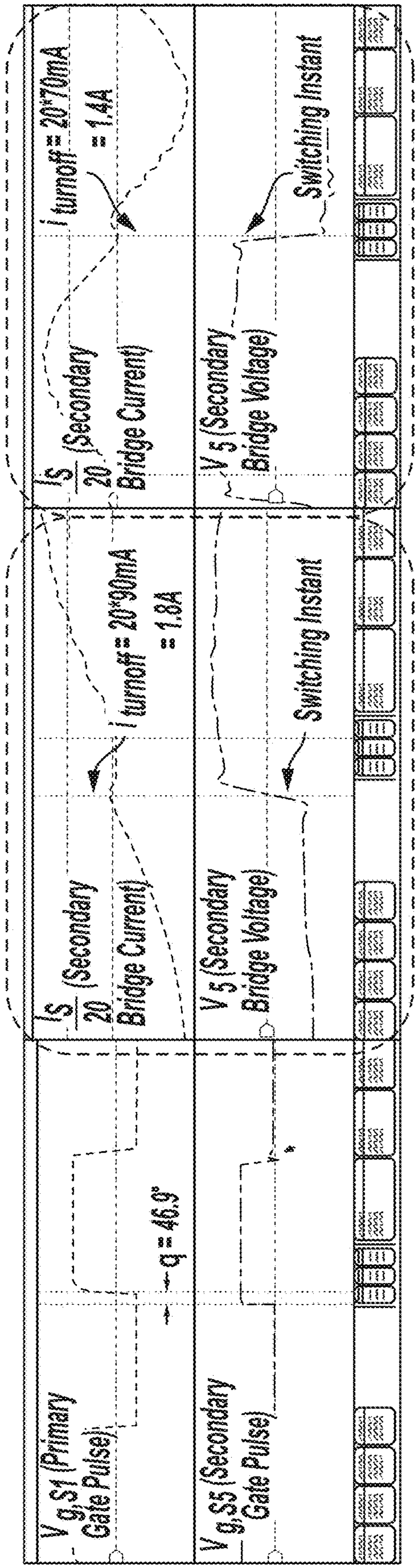

FIG. 21 shows a CLLC converter 2100 according to examples of the present teachings. To realize these specifications, a 22:1 HFPT 2102 connected to a primary bridge 2104 and a second bridge 2106, as shown in FIG. 20 with a primary winding arrangement [7P-4P-4P-7P] 2108 and a secondary winding arrangement [1S*-1S*-1S*-1S*] 2110 winding arrangement using two 4-layer 1.6 mm PCBs 2112 and 2014 with a copper conductor thickness of 70 μm is employed, and connected to a microcontroller 2116, such as a TMS320F2837D DSP from Texas Instruments. Other suitable microcontrollers can also be used. Further, FR45810EC core from Magnetics Inc. is selected for this application. Referring to the trends shown in the previous sections for the PCB fabrication details, to obtain the required leakage inductance with a {[7P-4P-4P-7P], [1S*-1S*-1S*-1S*]} arrangement, the following insulation thickness values are selected: $h_{pr}$=0.23 mm and $h_c$=1.19 mm. Correspondingly, the air gap between the primary and secondary winding is selected to be $h_\Delta$=2.5 mm while that between the cores is selected to be $h_g$=1.9 mm.

FIG. 15 shows experimental waveforms for $V_0$, $V_p$, $I_s$, and $V_s$ [Y-axis: $V_0$-10V/div $V_p$-100V/div, $$\frac{I_s}{20} - 2A/div,$$

$V_s$-10V/div; X-axis: time-1 μs/div] according to examples of the present teachings. FIG. 15 shows experimental waveforms for $V_0$, $V_p$, $I_p$, and $V_s$ [Y-axis: $V_0$-10V/div, $V_p$-100V/div, $I_p$-2A/div, $V_s$-10V/div; X-axis: time-2 μs/div] according to examples of the present teachings. FIG. 15 and FIG. 16 show the experimental results obtained at the rated input voltage at 462.9 kHz switching frequency to obtain the required voltage gain. As observed, the primary current lags the primary bridge voltage thus achieving ZVS operation, which matches the presented analysis and justifies the winding selection based on the gain conditions and physical constraints. The output voltage is settled at 28V with a peak-to-peak ripple of <2%). The secondary bridge is switched at a phase angle (φ=46.9°) with respect to the primary bridge gate pulse to achieve SR at the secondary bridge, which enables it to be soft switched, thus enhancing the overall efficiency.

FIG. 17 shows converter and magnetic stage component efficiency at different loading conditions according to examples of the present teachings. Further, the efficiency curve for the developed converter at different loading conditions is presented in FIG. 17, which indicates a peak converter efficiency of 98,49% and magnetic stage efficiency of 99.31%. Additionally, the actual converter and magnetic stage efficiency matches with its projected value with a mismatch of 0.68% and 0.32% respectively, thus affirming the accuracy of presented analysis.

Based on realistic considerations to fabricate a HFPT for a bidirectional CLLC DC/DC converter, this disclosure emphases comprehensive analytical modelling to formulate the leakage inductance, winding resistance and stray capacitance by elaborating on their structural dependencies on PCB specifications. The characterization of four different winding structures is carried out comprehensively and corresponding results are verified using various 3D FEA models and experimental analysis, portraying an average mismatch of 6.2% and 5.5% respectively. Further, optimal selection trade-offs are presented pertaining to ZVS constraints, gain requirements and frequency dependencies referring to experimentally developed 1.6 mm (2 oz. copper) 4-layer PCBs for non-interleaved configurations and 1.6 mm. (2 oz. copper) 8-layer for interleaved structure. To validate and benchmark the model with the most suitable winding structure selected for the application pertaining to APUs used in MEA, an experimental proof-of concept is developed and tested. The results show a peak converter efficiency of 98.49% with magnetics stage efficiency of 99.31% at 1 kW rated load, thus supporting, and validating the presented analysis. This design approach and analysis can be further extended to any winding configuration used for different HPFT applications.

FIG. 22A, FIG. 22B, FIG. 23A and FIG. 23B slow the experimental results obtained at the rated input voltage at 462.9 kHz switching frequency to obtain the required voltage gain. As observed, the primary current lags the primary bridge voltage thus achieving ZVS operation, which matches the presented analysis and justifies the winding selection based on the gain conditions and physical constraints. The output voltage is settled at 28 V with a peak-to-peak ripple of <2%. The secondary bridge is switched at a phase angle (φ=46.9°) with respect to the primary bridge gate pulse to achieve SR at the secondary bridge, which enables it to be soft switched, thus enhancing the overall efficiency.

In order to validate the selection of optimal winding configuration and its relevance for obtaining ZVS at the primary side (switch $S_2$), FIG. 24 shows the experimentally obtained waveforms of the drain to source voltage, gate to source voltage and the drain current at the switching instant. As observed, $V_{DS,S_2}$ falls down to 0V prior to the $V_{GS,S_2}$ reaching its threshold value of the switch. Further, the drain current $I_{D,S_2}$ observes a negative magnitude at the turn on instant with a lagging phase. Both these occurrences highlight the ZVS based soft switching of switch $S_2$. FIG. 25 shows converter and magnetic stage component efficiency at different loading conditions according to examples of the present disclosure.

Figure 19C:
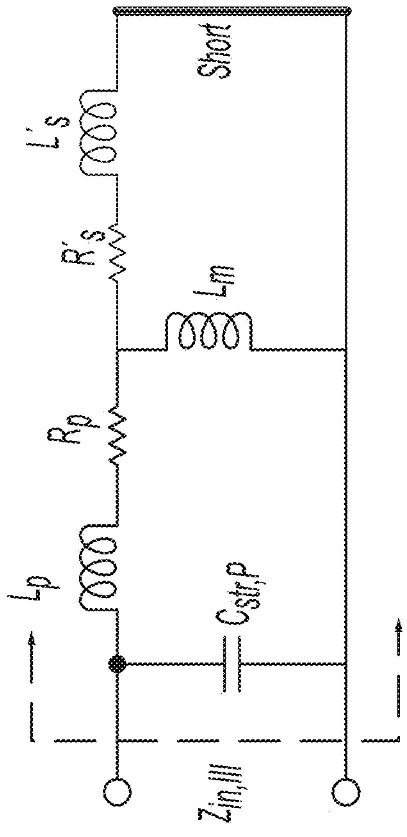

Further, the efficiency curve for the developed converter at different loading conditions is presented in FIG. 19A, FIG. 19B, and FIG. 19C, which indicates a peak converter efficiency of 98.49% and magnetic stage efficiency of 99,31%. Additionally, the actual converter and magnetic stage efficiency matches with its projected value with a mismatch of 0.68% and 0.32% respectively, thus affirming the accuracy of presented analysis.

Further, the efficiency curve for the developed converter at different loading conditions is presented in FIG. 19A, FIG. 19B, and FIG. 19C, which indicates a peak converter efficiency of 98.49% and magnetic stage efficiency of 99.31%. Additionally, the actual converter and magnetic stage efficiency matches with its projected value with a mismatch of 0.68% and 0.32% respectively, thus affirming the accuracy of presented analysis.

A detailed comparison of several published works (that employ HFPTs in their power conversion topologies) in terms of the overall efficiency, power levels, nominal voltage conversion levels, power densities and operational frequencies is presented in Table VIII. As observed, due to intricate modeling and parameterization of the parasitic components along with the most optimal HFPT selection, the developed CLLC results in an improved efficiency as compared to the state-of-the-art works [7],[9],[12], [20-28]. Please note that that although the proof-of-concept has been tested only up to 1 kW for concept verification, its power rating can be further scaled up to 3.3 kW with utilization of higher current-rated switching devices while retaining the same footprint areas, with the existing control and gate drive system, which would elevate the power density to 350 W/inch$^3$.

TABLE VIII

PERFORMANCE COMPARISON OF THE DEVELOPED HARDWARE WITH THE STATE-OF-THE-ART WORKS

| Comparison Metrics SOA Works | Topology | Power Level | Voltage Conversion Range | Power Density | Peak Converter Efficiency | Operational/ Resonant Frequency |
|---|---|---|---|---|---|---|
| [7] | Resonant LLC | 500 W | $V_{in}$ = 400 V; $V_0$ = 100 V | — | ~90% | 200 kHz |
| [9] | Resonant LLC | 1.2 kW | $V_{in}$ = 200 V; $V_0$ = 96 V | — | 96.3% | 200 kHz |
| [12] | Dual Active Bridge (DAB) | 1.2 kW | $V_{in}$ = 50 V; $V_0$ = 50-100 V | — | ~96.5% | 50 kHz |
| [20] | Resonant LLC | 20 W | $V_{in}$ = 80 V; $V_0$ = 10 V | 6.1 W/inch$^3$ | 90.9% | 1 MHz |
| [21] | Dual Bridge Series Resonant (DBSR) | 200 W | $V_{in}$ = 110 V; $V_0$ = 100 V | — | 95% | 100 kHz |
| [22] | Resonant LLC | 1 kW | $V_{in}$ = 360 V; $V_0$ = 40 V | — | 96.5% | 1 MHz |
| [23] | Resonant LLC | 800 W | $V_{in}$ = 380 V; $V_0$ = 12 V | 900 W/inch$^3$ | 97.6% | 1 MHz |
| [24] | Three Phase Interleaved Resonant LLC | 3 kW | $V_{in}$ = 400 V; $V_0$ = 48 V | 600 W/inch$^3$ | 97.7% | 1 MHz |
| [25] | Resonant CLLC | 400 W | $V_{in}$ = 400 V; $V_0$ = 20-25 V | 53 W/inch$^3$ | 94.3% | 1 MHz |
| [26] | Resonant LLC | 350 W | $V_{in}$ = 320-390 V; $V_0$ = 19.5 V | 137.16 W/inch$^3$ | 95.26% | 800 kHz |
| [27] | Half Bridge Resonant CLCL | 25 W | $V_{in}$ = 80 V; $V_0$ = 15 V | 5.43 W/inch$^3$ | 88.7% | 1 MHz |
| [23] | Resonant CLLC | 6.6 kW | $V_{in}$ = 400 V; $V_0$ = 250-400 V | 130 W/inch$^3$ | 97.8% | 500 kHz |
| This work | Resonant CLLC | 1 kW | $V_{in}$ = 400-600 V; $V_0$ = 24-28 V | 106 W/inch$^3$ (scalable up to 350 W/inch$^3$) | 98.49% | 500 kHz |

Based on realistic considerations to fabricate a HFPT for a bidirectional DC/DC converter, this paper emphases comprehensive analytical modelling to formulate the leakage inductance, winding resistance and stray capacitance by elaborating on their structural dependencies on PCB specifications. The characterization of four different winding structures is carried out comprehensively and corresponding results are verified using various 3D FEA models and experimental analysis, portraying an average mismatch of 6.2% and 5.5% respectively. Further, optimal selection trade-offs are presented pertaining to ZVS constraints, gain requirements and frequency dependencies referring to experimentally developed 1.6 mm (2 oz. copper) 4-layer PCBs for non-interleaved configurations and 1.6 mm (2 oz. copper) 8-layer for interleaved structure. To validate and benchmark the model with the most suitable winding structure selected for the application pertaining to APUs used in MEA, an experimental proof-of-concept is developed and tested. The results show a peak converter efficiency of 98.49% with magnetics stage efficiency of 99.31% at 1 kW rated load, thus supporting, and validating the presented analysis. This design approach and analysis can be further extended to any winding configuration used for different HFPT applications.

In some embodiments, any of the methods of the present disclosure may be executed by a computing system. FIG. 26 illustrates an example of such a computing system 2600, in accordance with some embodiments. The computing system 2600 may include a computer or computer system 2601A, which may be an individual computer system 2601A or an arrangement of distributed computer systems. The computer system 2601A includes one or more analysis module(s) 2602 configured to perform various tasks according to some embodiments, such as one or more methods disclosed herein. To perform these various tasks, the analysis module 2602 executes independently, or in coordination with, one or more processors 2604, which is (or are) connected to one or more storage media 2606. The processor(s) 2604 is (or are) also connected to a network interface 2607 to allow the computer system 2601A to communicate over a data network 2609 with one or more additional computer systems and/or computing systems, such as 2601B, 2601C, and/or 2601D (note that computer systems 2601B, 2601C and/or 2601D may or may not share the same architecture as computer system 2601A, and may be located in different physical locations, e.g., computer systems 2601A and 2601B may be located in a processing facility, while in communication with one or more computer systems such as 2601C and/or 2601D that are located in one or more data centers, and/or located in varying countries on different continents).

A processor can include a microprocessor, microcontroller, processor module or subsystem, programmable integrated circuit, programmable gate array, or another control or computing device.

The storage media 2606 can be implemented as one or more computer-readable or machine-readable storage media. The storage media 2606 can be connected to or coupled with a machine learning module(s) 2608. Note that while in the example embodiment of FIG. 26 storage media 2606 is depicted as within computer system 2601A, in some embodiments, storage media 2606 may be distributed within and/or across multiple internal and/or external enclosures of computing system 2601A and/or additional computing systems. Storage media 2606 may include one or more different forms of memory including semiconductor memory devices such as dynamic or static random access memories (DRAMs or SRAMs), erasable and programmable read-only memories (EPROMs), electrically erasable and programmable read-only memories (EEPROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above can be provided on one computer-readable or machine-readable storage-medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions or located at a remote site from which machine-readable instructions can be downloaded over a network for execution.

It should be appreciated that computing system 2600 is only one example of a computing system, and that computing system 2600 may have more or fewer components than shown, may combine additional components not depicted in the example embodiment of FIG. 26, and/or computing system 2600 may have a different configuration or arrangement of the components depicted in FIG. 26. The various components shown in FIG. 26 may be implemented in hardware, software, or a combination of both hardware and software, including one or more signal processing and/or application specific integrated circuits.

Further, the steps in the processing methods described herein may be implemented by running one or more functional modules in an information processing apparatus such as general-purpose processors or application specific chips, such as ASICs, FPGAs, PLDs, or other appropriate devices. These modules, combinations of these modules, and/or their combination with general hardware are all included within the scope of protection of the invention.

Models and/or other interpretation aids may be refined in an iterative fashion; this concept is applicable to embodiments of the present methods discussed herein. This can include the use of feedback loops executed on an algorithmic basis, such as at a computing device (e.g., computing system 2600, FIG. 26), and/or through manual control by a user who may make determinations regarding whether a given step, action, template, model, or set of curves has become sufficiently accurate for the evaluation of the signal(s) under consideration.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. Moreover, the order in which the elements of the methods are illustrated and described may be re-arranged, and/or two or more elements may occur simultaneously. The embodiments were chosen and described in order to best explain the principles of the invention and its practical applications, to thereby enable others skilled in the art to best utilize the invention and various embodiments with various modifications as are suited to the particular use contemplated.

BACKGROUND REFERENCES

[1] Roboam, X., et al., "Hybrid power generation system for aircraft emergency network", IET Electr. Syst. Transp. 2011, 1, 148-155.

[2] Wu. S. Li. Y, "Fuel cell applications on more electric aircraft", In Proceedings of the 17th International Conference on electrical Machines and Systems (ICEMS), Hangzhou, China, 24-25 Oct. 2014, pp. 198-201.
[3] F. Giuliani, et al., "GaN-based triple active bridge for avionic application," 2017 IEEE 26th International Symposium on Industrial Electronics (ISIE), 2017, pp. 1856-1860.
[4] C. Zhao, et al., "Design and Analysis of a High-frequency CLLC Resonant Converter with Medium Voltage insulation for Solid-State-Transformer," 2021 IEEE Applied Power Electronics Conference and Exposition (APEC), 2021, pp. 1638-1642.
[5] A. Sankar, et al., "Extended Harmonics Based Phase Tracking for Synchronous Rectification in CLLC Converters," in IEEE Transactions on Industrial Electronics, vol. 66, no. 8, pp. 6592-6603, August 2019.
[6] J. Min and M. Ordonez, "Bidirectional Resonant CLLC Charger for Wide Battery Voltage Range: Asymmetric Parameters Methodology," in IEEE Trans. on Power Electronics, vol. 36, no. 6, pp. 6662-6673, June 2021.
[7] S. Stegen and Lu, "Structure Comparison of High-Frequency Planar Power Integrated Magnetic Circuits," in IEEE Transactions on Magnetics, vol. 47, no. 10, pp. 4425-4428, October 2011.
[8] Wei Chen et al., "Model and design of PCB parallel winding for planar transformer," in IEEE Transactions on Magnetics, vol. 39, no. 5, pp, 3202-3204, September 2003,
[9] M. A. Saket, N. Shafiei and M. Ordonez, "LLC Converters With Planar Transformers: Issues and Mitigation," in IEEE Transactions on Power Electronics, vol. 32, no. 6, pp. 4524-4542, June 2017.
[10] S. Djuric, et al., "Design, Modeling, and Analysis of a Compact Planar Transformer," in IEEE Transactions on Magnetics, vol. 48, no. 11, pp. 4135-4138, November 2012.
[11] M. A. Saket, et al., "Improving Planar Transformers for LLC Resonant Converters: Paired Layers Interleaving," in IEEE Transactions on Power Electronics, vol. 34, no. 12, pp. 11813-11832, December 2019.
[12] Z. Ouyang, et al, "Optimal Design and Tradeoff Analysis of Planar Transformer in High-Power DC-DC Converters," in IEEE Transactions on Industrial Electronics, vol. 59, no. 7, pp. 2800-2810, July 2012.
[13] *Association connecting Electronics Industries . . . -IPC*. (n.d.). Retrieved Dec. 23, 2021, from https://www.ipc.org/TOC/IPC-2221.A.pdf.
[14] *Rigid PCB capacity_capabilities*. Gold Phoenix. (n.d.). Retrieved Nov. 30, 2021, from https://www.goldphoenixpcb.com/html/capabilities/rpc.html.
[15] P. He et al., "Design of a 1-MHz High-Efficiency High-Power-Density Bidirectional GaN-Based CLLC Converter for Electric Vehicles," in IEEE Trans. on Vehicular Technology, vol. 68, no. 1, pp. 213-223, 2019.
[16] R. P. Wojda et al., "Winding Resistance and Dower Loss of Inductors with Litz and Solid-Round Wires," in IEEE Transactions on Industry Applications, vol. 54, no. 4, pp. 3548-3557, July-August 2018.
[17] Luo, J.; Wang, J.; Fang, Z.; Shao, J.; Li, J. Optimal Design of a High Efficiency LLC Resonant Converter with a Narrow Frequency Range for Voltage Regulation. *Energies* 2018, 11, 1124.
[18] Magnetics-ferrite shapes. Magnetics-Ferrite Shapes Core Supplier. (n.d.). Retrieved Sep. 22, 2022, from https://www.mag-inc.com/Products/Ferrite-Cores/Ferrite-Shapes
[19] Magnetics-R material. Magnetics-Ferrite Core Manufacturer. (n.d.). Retrieved Sep. 22, 2022, from https://www.mag-inc.com/Products/Fenite-Cores/R-Material
[20] Y. Guan, Y. Wang, W. Wang and D. Xu, "A High-Frequency CLCL Converter Based on Leakage Inductance and Variable Width Winding Planar Magnetics," in IEEE Transactions on Industrial Electronics, vol. 65, no. 1, pp. 280-290, January 2018, doi: 10.1109/TIE.2017/2716878.
[21] X. Li and A. K. S. Bhat, "Analysis and Design of High-Frequency Isolated Dual-Bridge Series Resonant DC/DC Converter," in IEEE Transactions on Power Electronics, vol. 25, no. 4, pp. 850-862, April 2010, doi: 10.1109/TPEL.2009.2034662.
[22] X. Wu, H. Chen and Z. Qian, "1-MHz LLC Resonant DC Transformer (DCX) With Regulating Capability," in IEEE Transactions on Industrial Electronics, vol. 63, no. 5, pp. 2904-2912, May 2016, doi: 10.1109/TIE.2016.2521606.
[23] C. Fei, F. C. Lee and Q. Li, "High-Efficiency High-Power-Density LLC Converter With an Integrated Planar Matrix Transformer for High-Output Current Applications," in IEEE Transactions on Industrial Electronics, vol. 64, no. 11, pp. 9072-9082, November 2017, doi: 10.1109/TIE.2017.2674599.
[24] C. Fei, R. Gadelrab, Q. Li and F. C. Lee, "High-Frequency Three-Phase Interleaved LLC Resonant Converter With GaN Devices and Integrated Planar Magnetics," in IEEE Journal of Emerging and Selected Topics in Power Electronics, vol. 7, no. 2, pp. 653-663, June 2019, doi: 10.1109/JESTPE.2019.2891317.
[25] Y.-F. Wang, B. Chen, Y. Hou, Z. Meng and Y. Yang, "Analysis and Design of a 1-MHz Bidirectional Multi-CLLC Resonant DC-DC Converter With GaN Devices," in IEEE Transactions on Industrial Electronics, vol. 67, no. 2, pp. 1425-1434, February 2020, doi: 10.1109/TIE.2019.2899549.
[26] C.-W. Park and S.-K. Han, "Analysis and Design of an Integrated Magnetics Planar Transformer for High Power Density LLC Resonant Converter," in IEEE Access, vol. 9, pp. 157499-157511, 2021, doi: 10.1109/ACCESS.2021.3125262.
[27] Y. Guan, Y. Wang, D. Xu and W. Wang, "A 1 MHz Half-Bridge Resonant DC/DC Converter Based on GaN FETs and Planar Magnetics," in IEEE Transactions on Power Electronics, vol. 32, no. 4, pp. 2876-2891, April 2017, doi: 10.1109/TPEL.2016.2579660.
[28] B. Li, Q. Li and F. C. Lee, "High-Frequency PCB Winding Transformer With Integrated Inductors for a Bi-Directional Resonant Converter," in IEEE Transactions on Power Electronics, vol. 34, no. 7, pp. 6123-6135, July 2019, doi: 10.1109/TPEL-2018.2874806.

Notwithstanding that the numerical ranges and parameters setting forth the broad scope of the embodiments are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present embodiments. It is intended that the specification and examples be considered as examples only. The various embodiments are not necessarily mutually exclusive, as some embodiments can be combined with one or more other embodiments to form new embodiments.

While the embodiments have been illustrated respect to one or more implementations, alterations and/or modifications can be made to the illustrated examples without departing from the spirit and scope of the appended claims. In addition, while a particular feature of the embodiments may have been disclosed with respect to only one of several implementations, such feature may be combined with one or more other features of the other implementations as may be desired and advantageous for any given or particular function.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of A, B and C.

Other embodiments will be apparent to those skilled in the art from consideration of the specification and practice of the descriptions disclosed herein. It is intended that the specification and examples be considered as exemplary only, with a true scope and spirit of the embodiments being indicated by the following claims.

What is claimed is:

1. A bidirectional resonant asymmetric capacitor-inductor-inductor-capacitor (CLLC) converter for charging applications, comprising:

a primary full or half-bridge comprising a primary port;

a secondary full or half-bridge comprising a second port; and a high frequency planar transformer (HFPT) that electrically couples the primary full or half-bridge and the secondary full or half-bridge, wherein asymmetry in values of inductance-capacitance (L-C) tank parameters produce voltage conversions from 400V-600V at the primary port to 24V-28V at the secondary port while maintaining efficient bidirectional power flow operation ranging from 96% to 98.5%.

2. The bidirectional resonant asymmetric CLLC converter of claim 1, wherein the HFPT is formed on a multi-layer printed circuit board comprising a primary winding having a {7P-4P-4P-7P} configuration and a secondary winding having a {1S*-1S*-1S*-1S*} configuration.

3. The bidirectional resonant asymmetric CLLC converter of claim 2, wherein windings of the multi-layer printed circuit board of the HFPT comprises four layers with copper conductor thicknesses between 35 μm and 140 μm in different geometric orientations that are customizable to achieve a particular amount of leakage flux.

4. The bidirectional resonant asymmetric CLLC converter of claim 3, wherein the windings of the multi-layer printed circuit board-based windings comprise four layers with insulation layer thicknesses that are customizable to regulate stray capacitances to produce gain-frequency characteristics with error margin less than 6% and to minimize stray capacitances below 712 pF to enable greater than 500 kHz noise-immune power conversion.

5. The bidirectional resonant asymmetric CLLC converter of claim 1, further comprising a magnetic planar core which is selected based on a fabrication-based tradeoff optimization to minimize the total magnetic losses to less than 20 W for a 2 kW design and to achieve a form factor ranging from about 90 W/inch$^3$ to 110 W/inch$^3$, facilitating greater than 100 W/inch$^3$ power density integration of passive components.

6. The bidirectional resonant asymmetric CLLC converter of claim 1, wherein the HFPT provides controllable leakage inductances to eliminate a need of an external power transfer magnetic component and reduces AC resistance through interleaving of primary and secondary windings in successive layers.

7. The bidirectional resonant asymmetric CLLC converter of claim 1, wherein a tuns ratio between a primary winding configuration and a secondary winding configuration is selected to be 22:1 to facilitate and extend a range of soft-switching in both source and load-side full-bridges and also to limit frequency sweep between 200 kHz and 650 kHz to enable a wide-gain power conversion from about 400-600V to about 24-28V.

8. The bidirectional resonant asymmetric CLLC converter of claim 1, wherein system apparatus for verifying optimal winding structure is developed using a set of 650V/30A-rated Gallium Nitride MOSFETs on the prim my side and a set of four parallelly connected 60V/90A-rated Gallium Nitride devices for realizing each switching on the secondary side, and parasitic loop inductances are modeled as part of a resistance-inductance-capacitance (R-L-C) lumped equivalence of the HFPT.

* * * * *